United States Patent
Yan et al.

(10) Patent No.: US 10,034,382 B2
(45) Date of Patent: Jul. 24, 2018

(54) METHOD OF MANUFACTURING A FLEXIBLE AND/OR STRETCHABLE ELECTRONIC DEVICE

(71) Applicant: NANYANG TECHNOLOGICAL UNIVERSITY, Singapore (SG)

(72) Inventors: Chaoyi Yan, Singapore (SG); Pooi See Lee, Singapore (SG)

(73) Assignee: Nanyang Technology University, Singapore (SG)

( * ) Notice: Subject to any disclaimer, the term of this patent is extended or adjusted under 35 U.S.C. 154(b) by 413 days.

(21) Appl. No.: 14/896,861

(22) PCT Filed: Jun. 3, 2014

(86) PCT No.: PCT/SG2014/000255
§ 371 (c)(1),
(2) Date: Dec. 8, 2015

(87) PCT Pub. No.: WO2014/200428
PCT Pub. Date: Dec. 18, 2014

(65) Prior Publication Data
US 2016/0192501 A1   Jun. 30, 2016

Related U.S. Application Data

(60) Provisional application No. 61/856,846, filed on Jul. 22, 2013, provisional application No. 61/833,142, filed on Jun. 10, 2013.

(51) Int. Cl.
*H05K 3/00* (2006.01)
*H01L 29/06* (2006.01)
(Continued)

(52) U.S. Cl.
CPC ....... *H05K 3/0073* (2013.01); *H01L 29/0673* (2013.01); *H01L 29/1606* (2013.01);
(Continued)

(58) Field of Classification Search
CPC . B82Y 40/00; H01L 29/0665; H01L 29/0669; H01L 29/0673; H01L 29/1606;
(Continued)

(56) References Cited

U.S. PATENT DOCUMENTS

| | | | | |
|---|---|---|---|---|
| 8,445,889 | B2* | 5/2013 | Bhupendra | ............ B41M 3/006 |
| | | | | 257/9 |
| 9,347,141 | B2* | 5/2016 | Yang | ..................... C25B 11/035 |
| 9,478,835 | B2* | 10/2016 | Mak | ...................... B82Y 10/00 |

FOREIGN PATENT DOCUMENTS

WO   WO 2012/063024 A1   5/2012

OTHER PUBLICATIONS

Aga, R. S. et al., *Enhanced Photoresponse in ZnO Nanowires Dectorated with CdTe Quantum Dot*, Applied Physics Letters (Dec. 2007) 14 pages.
(Continued)

*Primary Examiner* — Peter DungBa Vo
*Assistant Examiner* — Joshua D Anderson
(74) *Attorney, Agent, or Firm* — Alston & Bird LLP

(57) ABSTRACT

A method of manufacturing a flexible electronic device is provided. The method includes a) filtering a mixture including an electrically conducting nanostructured material through a membrane such that the electrically conducting nanostructured material is deposited on the membrane; b) depositing an elastomeric polymerizable material on the electrically conducting nanostructured material and curing the elastomeric polymerizable material thereby embedding the electrically conducting nanostructured material in an elastomeric polymer thus formed; and c) separating the elastomeric polymer with the embedded electrically conducting nanostructured material from the membrane to obtain the flexible electronic device. Flexible electronic (Continued)

device manufactured by the method, and use of the flexible electronic device are also provided.

20 Claims, 55 Drawing Sheets

(51) Int. Cl.
| | |
|---|---|
| H02S 50/00 | (2014.01) |
| H01L 29/40 | (2006.01) |
| H01L 29/16 | (2006.01) |
| H01L 29/41 | (2006.01) |
| H05K 1/02 | (2006.01) |
| H05K 1/09 | (2006.01) |
| H05K 3/20 | (2006.01) |
| H02S 50/10 | (2014.01) |
| H05K 3/24 | (2006.01) |
| H01L 51/00 | (2006.01) |
| H01L 51/50 | (2006.01) |

(52) U.S. Cl.
CPC .......... *H01L 29/401* (2013.01); *H01L 29/413* (2013.01); *H02S 50/00* (2013.01); *H02S 50/10* (2014.12); *H05K 1/0283* (2013.01); *H05K 1/097* (2013.01); *H05K 3/207* (2013.01); *H01L 51/0048* (2013.01); *H01L 51/50* (2013.01); *H05K 3/246* (2013.01); *H05K 2201/0133* (2013.01); *H05K 2201/026* (2013.01); *H05K 2201/0248* (2013.01); *H05K 2201/0257* (2013.01); *H05K 2201/0323* (2013.01); *H05K 2201/0326* (2013.01); *H05K 2203/0191* (2013.01); *H05K 2203/1476* (2013.01); *H05K 2203/304* (2013.01)

(58) Field of Classification Search
CPC . H01L 29/413; H01L 29/401; H01L 51/0048; H01L 51/50; Y10T 29/49155; H02S 50/10; H05K 1/0283; H05K 1/097; H05K 3/0073; H05K 3/207; H05K 3/246; H05K 2201/0133; H05K 2201/0248; H05K 2201/0257; H05K 2201/026; H05K 2201/0323; H05K 2201/0326; H05K 2201/05; H05K 2203/0191; H05K 2203/1476; H05K 2203/304
USPC ............ 977/720–723, 733, 762–767; 29/846
See application file for complete search history.

(56) References Cited

OTHER PUBLICATIONS

Bae, S-H. et al., *Graphene-based Transparent Strain Sensor*, Carbon, 51 (2013) 236-242.
Barlian, A. A. et al., *Review: Semiconductor Piezoresistance for Microsystems*, Proceedings of the IEEE, vol. 97, No. 3 (Mar. 2009) 513-552.
Braam, K. T. et al., *Characterization and Optimization of a Printed, Primary Silver-Zinc Battery*, Journal of Power Sources 1999 (2012) 367-372.
Cai, L. et al., *Highly Transparent and Conductive Stretchable Conductors Based on Hierarchical Reticulate Single-Walled Carbon Nanotube Architecture*, Adv. Funct. Mater. 22 (2012) 5238-5244.
Charmran, F. et al., *Three-Dimensional Nickel-Zinc Microbatteries*, MEMS 2006 (Jan. 2006) 950-953.
Chen, X. et al., *Investigation of graphene Piezoresistors for use as Strain Gauge Sensors*, J. Vac. Sci. Technol. B 29(6) (Nov./Dec. 2011) 6 pages.
Chen, Z. et al., *Three-Dimensional Flexible and Conductive Interconnected Graphene Networks Grown by Chemical Vapour Deposition*, Nature Materials, vol. 10 (Jun. 2011) 424-428.
Cox, M. E. et al. *Oxygen Diffusion in Poly(dimethyl Siloxane) Using Fluorescense Quenching. I. Measurement Technical and Analysis*, Journal of Polymer Science: Part A: Polymer Chemistry, vol. 24 (1986) 621-636.
De Bo, I. D. et al., *Investigation of the Permeability and Selectivity of Gases and Volatile Organic Compounds for Polydimethylsiloxane Membranes*, Journal of Membrane Science 215 (2003) 303-319.
Dipietro, L. et al., *A Survey of Glove-Based Systems and Their Applications*, IEEE Transactions on Systems, Man, and Cybernetics—Part C: Applications and Reviews, vol. 38, No. 4 (Jul. 2008) 461-482.
Dokko, K. et al., *Sol-Gel Fabrication of Lithium-Ion Microarray Battery*, Electrochemistry Communications 9 (2007) 857-862.
Endo, M. et al., *'Buckpaper' From Coaxial Nanotubes*, Nature, vol. 433 (Feb. 2005) 476.
Eswaraiah, V. et al., *Functionalized Graphene Reinforced Thermoplastic Nanocomposites as Strain Sensors in Structural Health Monitoring*, Journal of Materials Chemistry 21 (2011) 12626-12628.
Eswaraiah, V. et al., *One-Pot Synthesis of Conducting Graphene-Polymer Composites and Their Strain Sensing Application*, Nanoscale 4 (2012) 1258-1262.
Fang, S. et al.., *High-Performance Blue/Ultraviolet-Light-Sensitive ZnSe-Nanobelt Photodetectors*, Adv. Mater. 21 (2009) 5016-5021.
Fang, X. et al., *Single-Crystalline ZnS Nanobelts as Ultraviolet-Light Sensors*, Adv. Mater. 21 (2009) 2034-2039.
Fang, X. et al., *ZnS Nanostructure Arrays: A Developing Material Star*, Adv. Mater. 23 (2011) 585-598.
Fu, X-W. et al., *Strain Dependent Resistance in Chemical Vapor Deposition Grown Graphene*, Applied Physics Letters 99 (2011) 4 pages.
Gaikwad, A. M. et al., *Highly Stretchable Alkaline Batteries Based on an Embedded Conductive Fabric*, Adv. Mater. 24 (2012) 5071-5076.
Geim, A. K. et al., *The Rise of Graphene*, Nature Materials, vol. 6 (2007) 183-191.
Hempel, M. et al., *A Novel Class of Strain Gauges Based on Layered Percolative Films of 2D Materials*, Nano Lett. 12 (2012) 5714-5718.
Herrmann, J. et al., *Nanoparticle Films as Sensitive Strain Gauges*, Applied Physics Letters 91 (2007) 4 pages.
Hu, L. et al., *Stretchable, Porous, and Conductive Energy Textiles*, Nano Lett. 10 (2010) 708-714.
Hua, F. et al., *Polymer Imprint Lithography With Molecular-Scale Resolution*, Nano Letters, vol. 4, No. 12 (2004) 2467-2471.
Huang, M. et al., *Electronic-Chemical Coupling in Graphene From in situ Nanoindentation Experements and Multiscale Atomistic Simulations*, Nano Lett. 11 (2011) 1241-1246.
Huang, M. H. et al., *Catalytic Growth of Zinc Oxide Nanowires by Vapor Transport*, Adv. Mater. 13, No. 2 (2001) 113-116.
Hwang, S-H. et al., *Pierzoresistive Behavior and Multi-Directional Strain Sensing Ability of Carbon Nanotube-Graphene Nanoplatelet Hybrid Sheets*, Smart Mater. Struct. 22 (2013) 1-9.
Jing, Z. et al., *Review of Graphene-Based Strain Sensors*, Chin. Physc. B, vol. 22 No. 5 (2013) 9 pages.
Kaltenbrunner, M. et al., *Arrays of Ultracompliant Electrochemical Dry Gel Cells for Stretchable Electronics*, Adv. Mater. 22 (2010) 2065-2067.
Kaltenbrunner, M. et al., *Ultrathin and Lightweight Organic Solar Cells With High Flexibility*, Nature Communications, (Apr. 2012) 1-7.
Kamiya, Y, et al., *Sorption and Partial Molar Volume of Gases in Poly (dimethyl siloxane)*, Journal of Polymer Science: Part B: Polymer Physics, vol. 28 (1990) 1297-1308.
Khang, D-Y. et al., *A Stretchable Form of Single-Crysstal Silicon for High-Performance Electronics on Rubber Substrates*, Science, vol. 311 (2006) 208-212.
Kim, D-Y. et al., *Epidermal Electronics*, Science, vol. 333 (Aug. 2011) 838-843 and supporting manuscript pp. 1-37.

(56) References Cited

OTHER PUBLICATIONS

Kim, D-Y., et al., *Epidermal Electronics*, Science, vol. 333 (Aug. 2011) (Corrected Sep. 23, 2011) pp. 838-843, and p. 1.
Kim, K.S. et al., *Large-Scale Pattern Growth of Graphene Films for Stretchable Transparent Electrodes*, Nature, vol. 457 (Feb. 2009) 706-710.
Kim, Y-J. et al., *Preparation of Piezoresistive Nano Smart Hybrid Material Based on Graphene*, Current Applied Physics 11 (2011) S350-S352.
Kim, D-H. et al., *Stretchable and Foldable Silicon Integrated Circuits*, Science, vol. 320, (Apr. 2008) 507-511.
Ko, H. C. et al., *A Hemispherical Electronic Eye Camera Based on Compressible Silicon Optoelectronics*, Nature, vol. 454 (Aug. 2008) 748-753.
Kovtyukhova, N. I. et al., *Layer-by-Layer Assembly of Ultrathin Composite Films from Micron-Sized Graphite Oxide Sheets and Polycations*, Chem. Mater. 11 (1999) 771-778.
Jiang, H. et al., *Ultrafine Manganese Dioxide Nanowire Network for High-Performance Supercapacitors*, Chem. Commun. 47 (2011) 1264-1266.
Layani, M. et al., *Transparent Conductive Coatings by Printing Coffee Ring Arrays Obtained at Room Temperature*, ACS Nano, vol. 3, No. 11 (2009) 3537-3542.
Lee, H. et al., *A Stretchable Polymer-Carbon Nanotube Composite Electrode for Flexible Lithium-Ion Batteries: Porosity Enegineering by Controlled Phase Separation*, Ad. Energy Mater. 2 (2012) 976-982.
Lee, C. et al., *High Strain Biocompatible Polydimethylsiloxane-Based Conductive Graphene and Multiwalled Carbon Nanotube Nanocomposite Strain Sensors*, Applied Physics Letters 102 (2013) 5 pages.
Lee, P. et al., *Highly Stretchable and Highly Conductive Metal Electrode by Very Long Metal Nanowire Percolation Network*, Adv. Mater. 24 (2012) 3326-3332.
Lee, C. et al., *Measurement of the Elastic Properties and Intrinsic Strength of Monolayer Graphene*, Science, vol. 321 (Jul. 2008) 385-388.
Lee, J. et al., *Stretchable GaAs Photovoltaics With Designs That Enable High Areal Coverage*, Adv. Mater. 23 (2011) 986-991.
Lee, Y. et al., *Wafer-Scale Synthesis and Transfer of Graphene Films*, Nano Lett. 10 (2010) 490-493.
Li, Q. H. et al., *Adsorption and Desorption of Oxygen Probed From ZnO Nanowire films by Photocurrent Measurements*, Applied Physics Letters 86 (2005) 3 pages.
Li, X. et al., *Dynamic and Galvanic Stability of Stretchable Supercapacitors*, Nano Lett. 12 (2012) 6366-6371.
Li, X. et al., *Stretchable and Highly Sensitive Graphene-on-Polymer Strain Sensors*, Scientific Reports (Nov. 2012) 1-6.
Li, L. et al., *Ultrahigh-Performance Solar-Blind Photodetectors Based on $In_2Ge_2O_7$ Nanobelts*, Adv. Mater. 22 (2010) 5145-5149.
Lipomi, D. J. et al., *Skin-Like Pressure and Strain Sensors Based on Transparent Elastic Films of Carbon Nanotubes*, Nature Nanotechnology, vol. 6 (2011) 788-792.
Lipomi, D. J. et al., *Stretchable Organic Solar Cells*, Adv. Mater. 23 (2011) 1771-1775.
Liu, J. et al., *Enhanced Photoconduction of Free-Standing ZnO Nanowire Films by L-lysine Treatment*, Queensland University of Technology, Brisbane Australia (2010) 24 pages.
Liu, K. et al., *Cross-Stacked Superaligned Carbon Nanotube Films for Transparent and Stretchable Conductors*, Adv. Funct. Mater. 21 (2011) 2721-2728.
Luo, J. et al., *Compression and Aggregation-Resistant Particles of Crumpled Soft Sheets*, ACS Nano, vol. 5, No. 11 (2011) 8943-8949.
Luo, S. et al., *SWCNT/Graphite Nanoplatelet Hybrid Thin Films for Self-Temperature-Compensated, Highly Sensitive, and Extensible Piezoresistive Sensors*, Adv. Mater. 25 (2013) 5650-5657.
Mata, A. et al., *Characterization of Polydimethylsiloxane (PDMS) Properties for Biomedical Micro/Nanosystems*, Biomedical Microdevices 7:4 (2005) 281-293.

Meitl, M. A. et al., *Transfer Printing by Kinetic Control of Adhesion to an Elastomeric Stamp*, Nature Materials, vol. 5 (Jan. 2006) 33-38.
Merkel, T. C. et al.., *Gas Sorption, Diffusion, and Permeation in Poly(dimethylsiloxane)*, Journal of Polymer Science: part B: Polymer Physics, vol. 38 (2000) 415-434.
Millett, J.C.F. et al., *On the Analysis of Transverse Stress Gauge Data From Shock Loading Experiments*, J. Phys. D: Appl. Phys. 29 (1996) 2466-2472.
Novoselov, K. S. et al., *Electric Field Effect in Atomically Thin Carbon Films*, Science, vol. 306 (Oct. 2004) 666-669.
Pan, J. et al., *Nano Silver Oxide (AgO) as a Super High Charge/Discharge Rate Cathode Material for Rechargeable Alkaline Batteries*, J. Mater. Chem. 17 (2007) 4820-4825.
Park, M. et al., *Highly Stretchable Electric Circuits From a Composite Material of Silver Nanoparticles and Elastomeric Fibres*, Nature Nanotechnology, vol. 7 (Dec. 2012) 803-809.
Politano, A et al., *Elastic Properties of a Macroscopic Graphene Sample From Phonon Dispersion Measurements*, Carbon 50 (2012) 4903-4910.
Reemts, J. et al., *Persistent Photoconductivity in Highly Porous ZnO Films*, Journal of Applied Physics 101 (2007) 5 pages.
Rogers, J. A. et al., *Materials and Mechanics for Stretchable Electronics*, vol. 327 (Mar. 2010) 1603-1607.
Sekitani, T. et al., *Stretchable Active-Matrix Organic Light-Emitting Diode Display Using Printable Elastic Conductors*, Nature Materials, vol. 8 (Jun. 2009) 494-499.
Soci, C. et al., *ZnO Nanowire UV Photodetectors With High Internal Gain*, Nano Letters, vol. 7, No. 4 (2007) 1003-1009.
Song, Y. M. et al., *Digital Cameras With Design Inspired by the Arthropod Eye*, vol. 497 (May 2013) 95-99.
Sumboja, A. et al., *Large Areal Mass, Flexible and Free-Standing Reduced Graphene Oxide/Maganese Dioxide Paper for Asymmetric Supercapacitor Device*, Adv. Mater. 25 (2013) 2809-2815.
Wang, C. et al., *Buckled, Stretchable Polypyrrole Electrodes for Battery Applications*, Adv. Mater. 23 (2011) 3580-3584.
Wang, Y. et al., *Super-elastic Graphene Ripples for Flexible Strain Sensors*, ACS Nano, vol. 5, No. 5 (2011) 3645-3650.
Wang, C. et al., *User-Interactive Electronic Skin for Instantaneous Pressure Visualization*, Nature Materials, vol. 12 (Oct. 2013) 899-904.
Xiao, X. et al., *High-Strain Sensors Based on ZnO Nanowire/Polystyrene Hybridized Flexible Films*, Adv. Mater. 23 (2011) 5440-5444.
Xie, X. et al., *Load-Tolerant, Highly Strain-Responsive Graphene Sheets*, J. Mater. Chem. 21 (2011) 2057-2059.
Xu, F. et al., *Highly Conductive and Stretchable Silver Nanowire Conductors*, Adv. Mater. 24 (2012) 5117-5122.
Xu, S. et al., *Stretchable Batteries With Self-Similar Serpentine Interconnects and Integrated Wireless Recharging Systems*, Nature Communications (2013) 1-8.
Yan, C. et al., *Binder-Free $Co(OH)_2$ Nanoflake-ITO Nanowire Heterostructured Electrodes for Electrochemical Energy Storage With Improved High-Rate Capabilities*, J. Mater. Chem. 21 (2011) 10482-10488.
Yan, C. et al., *Network-Enhanced Photoresponse Time of Ge Nanowire Photodetectors*, Applied Materials & Interfaces, vol. 2, No. 7 (2010) 1794-1797.
Yan, C. et al., *Stretchable and Wearable Electrochromic Devices*, ACS Nano, vol. 8, No. 1 (2014) 316-322.
Yan, C. et al., *Wide-Bandgap $Zn_2GeO_4$ Nanowire Networks as Efficient Ultraviolet Photodetectors With Fast Response and Recovery Time*, Applied Phyusics Letters 96 (2010) 4 pages.
Yamada, T. et al., *A Stretchable Carbon Nanotube Strain Sensor for Human-Motion Detection*, Nature Nanotechnology, vol. 6 (May 2011) 296-301.
Yu, T. et al., *Raman Mapping Investigation of Graphene on Transparent Flexible Substrate: The Strain Effect*, the Journal of Physical Chemistry C Letters 112 (2008) 12602-12605.
Yu, C. et al., *Stretchable :Supercapacitors Based on Buckled Single-Walled Carbon Nanotube Macrofilms*, Adv. Mater. 21 (2009) 4793-4797.

(56) References Cited

OTHER PUBLICATIONS

Yun, S. et al., *Compliant Silver Nanowire-Polymer Composite Electrodes for Bistable Large Strain Actuation*, Adv. Mater. 24 (2012) 1321-1327.

Yunker, P. J. et al., *Suppression of the Coffee-Ring Effect by Shape-Dependent Capillary Interactions*, Nature, vol. 476 (Aug. 2011) 308-311.

Zanzotto, A. et al., *Membrane-Aerated Microbioreactor for High-Throughput Bioprocessing*, Biotechnology and Bioengineering, vol. 87, No. 2 (Jul. 2004) 243-254.

Zhao, J. et al., *Ultra-Sensitive Strain Sensors Based on Piezoresistive Nanographene Films*, Applied Physics Letters 101 (2012) 5 pages.

Zhou, J. et al., *Gigantic Enhancement in Response and Reset Time of ZnO UV Nanosensor by Utilizing Schottky Contact and Surface Functionalization*, Applied Physics Letters 94 (2009) 3 pages.

Zhu, Y. et al., *Buckling of Aligned Carbon Nanotubes as Stretchable Conductors: A New Manufacturing Strategy*, Adv. Mater. 24 (2012) 1073-1077 and pp. 1-6.

International Search Report and Written Opinion for Application No. PCT/SG2014/000255 dated Jul. 28, 2014.

\* cited by examiner (F)

Reset Processes $$I = A_1 e^{-(t/\tau 1)} + A_2 e^{-(t/\tau 2)}$$

METHOD OF MANUFACTURING A FLEXIBLE AND/OR STRETCHABLE ELECTRONIC DEVICE

CROSS-REFERENCE TO RELATED APPLICATION

The present application is a national phase entry of PCT/SG2014/000255, filed on 3 Jun. 2014, which claims the benefit of priority of U.S. provisional patent application No. 61/833,142 filed on 10 Jun. 2013, and U.S. provisional application No. 61/856,846 filed on 22 Jul. 2013, the entire contents of which are incorporated herein by reference for all purposes.

TECHNICAL FIELD

The invention relates to a method of manufacturing flexible and/or stretchable electronic devices, and flexible and/or stretchable electronic devices manufactured using the method.

BACKGROUND

Stretchable electronics refers generally to a form of electronics that may be bended, twisted, folded and stretched. Due to their flexibility, they are able to conform to complex non-planar surfaces and provide unique functionalities such as accurate mapping of human organ activities which are not achievable using rigid electronics.

With advancement in technology, electronic devices are progressively becoming smaller, lighter, faster, and more powerful. Existing consumer electronics, such as cell phones, tablets, and laptops are manufactured based on silicon technologies. Due to rigidity of the materials, use of the electronic devices has been limited thus far.

There has been increasing interest in recent years to make electronic devices stretchable, foldable, and wearable by shifting focus away from silicon, and varying the type of materials used. This greatly extends their applications beyond existing product ranges.

In view of the above, there remains a need for improved methods to manufacture electronic components which are deformable or stretchable for use in various applications that overcome or at least alleviate one or more of the above-mentioned problems.

SUMMARY

In a first aspect, a method of manufacturing a flexible electronic device is provided. The method comprises
- a) filtering a mixture comprising an electrically conducting nanostructured material through a membrane such that the electrically conducting nanostructured material is deposited on the membrane;
- depositing an elastomeric polymerisable material on the electrically conducting nanostructured material and curing the elastomeric polymerisable material thereby embedding the electrically conducting nanostructured material in an elastomeric polymer thus formed; and
- c) separating the elastomeric polymer with the embedded electrically conducting nanostructured material from the membrane to obtain the flexible electronic device.

In a second aspect, a flexible electronic device manufactured by a method according to the first aspect is provided.

In a third aspect, use of a flexible electronic device manufactured by a method according to the first aspect in stretchable electronics, biomedical devices, implantable electronics, photodetectors, capacitors, electrochromic devices, strain gauges, sensors, wearable electronics, clean energy devices, smart clothes, and sensory skin for robotic systems is provided.

BRIEF DESCRIPTION OF THE DRAWINGS

The invention will be better understood with reference to the detailed description when considered in conjunction with the non-limiting examples and the accompanying drawings, in which:

In FIG. 1(A), a piece of solid state polydimethylsiloxane (PDMS) is patterned and serves as a hard mask. The PDMS mask is put on top of a polycarbonate (PC) filter membrane. Silver (Ag) nanowire dispersion in an alcohol-based solvent, for example, ethanol is filtrated through the membrane, leaving behind patterns of the Ag nanowire as defined by the PDMS hard mask. The mask was peeled off after Ag nanowire filtration. In FIG. 1(B), a second mask with patterns for zinc oxide (ZnO) nanowire channels is put on top of the filter membrane with Ag nanowire patterns. This second mask was pressed well to ensure close contact with the membrane, and no spacing was left between the mask and membrane. ZnO nanowire dispersion in an alcohol-based solvent, for example ethanol, was filtrated to yield desired patterns connecting the two Ag nanowire electrodes. Referring to FIG. 1(C), mixed PDMS prepolymer is then poured onto the filter membrane. Subsequently, the solidified PDMS substrate (1 mm thick) is carefully peeled off from the filter membrane, and the nanowire patterns are transferred to the PDMS substrate, as shown in FIG. 1(D).

FIG. 27(B) to (E) are example images of free-standing flexible nanopaper (B and C), and stretchable nanopaper (D and E). FIG. 27(F) is a photographic image of water adsorption comparison of crumpled graphene paper, planar graphene paper and commercial graphite paper. The scale bars in (B) to (F) represent 10 mm.

FIG. 34(A) depicts photographs of the data glove with five implanted sensors. The bending and stretching states of the glove finger during testing are also shown. Scale bars in the figure represent 2 cm. FIG. 34(B) shows relative resistance changes for the five independent strain sensors.

DETAILED DESCRIPTION

Figure 1:
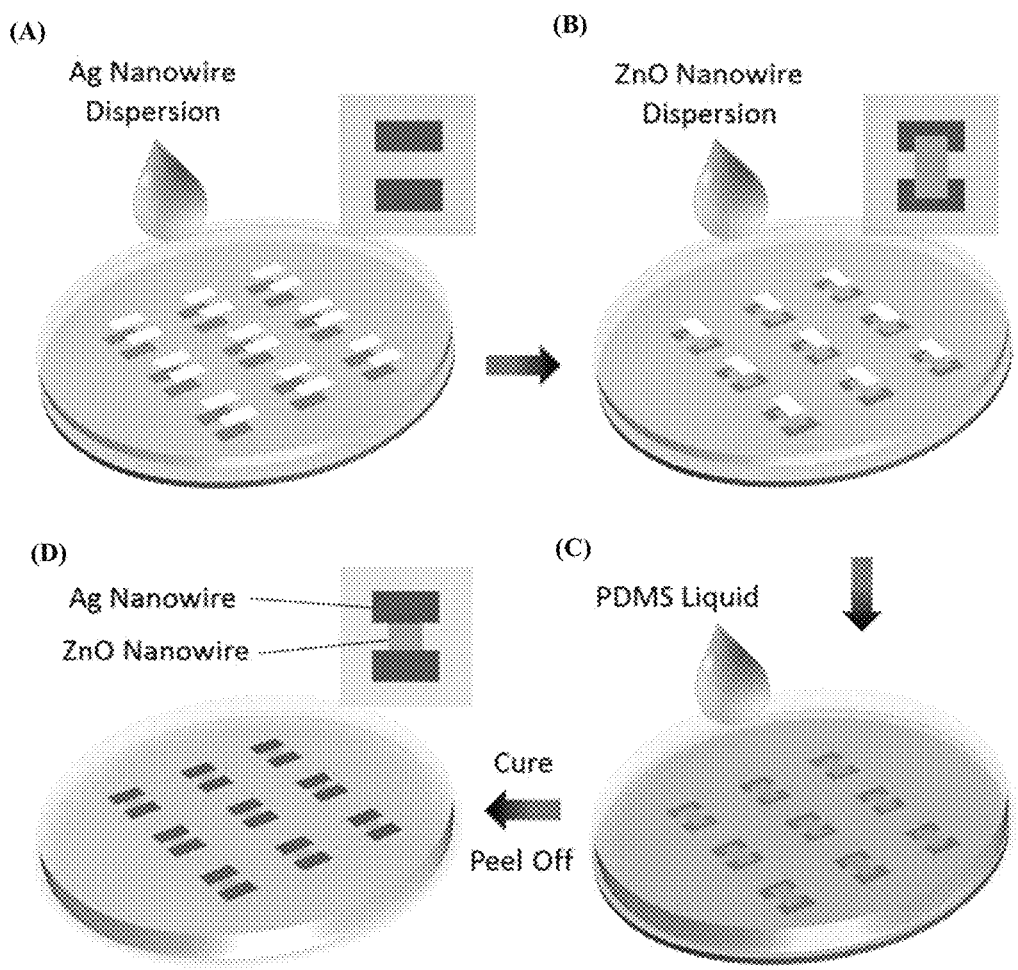
FIG. 1 is a schematic diagram showing fabrication process of stretchable nanowire photodetectors according to an embodiment.

In a first aspect, the present invention refers to a method of manufacturing a flexible electronic device. The term "flexible" as used herein refers to materials that are compliant and respond in the presence of external forces by deforming readily. For example, the flexible electronic device may flex or bend readily upon application of a force on the material.

Advantageously, flexible electronic devices may be stretched, twisted, crumpled, bended and folded, and are mechanically more robust than rigid electronic devices. Such unique properties confer the flexible electronic devices with ability to be deformed or expanded for use in wearable and implantable applications, for example, while being able to maintain their functionalities.

In various embodiments, the flexible electronic device is a stretchable electronic device. The phrase "stretchable electronic devices" refers to a type of flexible electronic devices having ability to deform elastically in response to a force such that they extend in length, width and/or other directions, and are able to return at least substantially to their original non-extended configuration after removal of the force. For example, the force may be a tension force acting on two portions of a stretchable electronic device, such that the stretchable electronic device elongates between the two portions.

In various embodiments, the stretchable electronic device may be stretched up to 300% of its original length, such as about 200%, about 150%, about 100%, about 50%, or about 30%. In some embodiments, the stretchable electronic device is capable of being stretched up to 100% of its original length.

The method comprises filtering a mixture comprising an electrically conducting nanostructured material through a membrane such that the electrically conducting nanostructured material is deposited on the membrane.

As used herein, the term "nanostructured material" refers to a material having a size in the nanometer range. The term "electrically conducting nanostructured material" as used herein refers to a nanostructured material that allows flow of electric charges in one or more directions within or through the material.

The electrically conducting nanostructured material may comprise or consist of a metal, a metal oxide, a semiconductor, graphene, carbon nanotubes (CNTs), or combinations thereof.

In various embodiments, the metal or metal oxide comprises or consists of a metal selected from the group consisting of Ag, Au, Pt, Cu, Ni, Ti, Cr, Co, Fe, Al, Zn, W, V, and combinations thereof.

Suitable semiconductor include, but are not limited to, elemental nanowires such as Si, Ge, Se, Te, and the like; binary phase nanowires such as ZnS, ZnSe, ZnTe, CdS, CdSe, CdTe, InP, GaN, $Sb_2Se_3$, $ZrS_2$, $Ag_2S$, InSe, $In_2Se_3$, $Bi_2S_3$, $Zn_3P_2$, ZnO, $SnO_2$, $In_2O_3$, CdO, $V_2O_5$, $Ga_2O_3$, $Fe_2O_3$, $Cu_2O$, CuO, $CeO_2$, $TiO_2$, $Sb_2O_3$, and the like; ternary phase nanowires such as ZnCdSe, ZnSeTe, CdZnS, $Zn_2GeO_4$, $In_2Ge_2O_7$, $ZnSnO_4$, $ZnGa_2O_4$, and the like; hybrid nanowires such as $Au/SiO_2$, $Au/Ga_2O_3$, ZnO/Si, ZnS/InP, Ge/CdS, ZnO/GaN, $RuO_2/TiO_2$, Ga/ZnS, ZnSe/$SiO_2$, Au/CdSe/Au, Si/porphyrin, CdS/PPy, ZnS/CNT, and the like; or combinations thereof.

For example, the electrically conducting nanostructured material may comprise or consist of (i) graphene; (ii) nanocellulose; (iii) Ag nanowires; (iv) Zn nanowires, or combinations thereof.

The electrically conducting nanostructured material may be in any shape. The electrically conducting nanostructured material may be selected from the group consisting of nanotubes, nanoflowers, nanowires, nanofibers, nanoflakes, nanoparticles, nanodiscs, nanofilms, and combinations thereof. In specific embodiments, the electrically conducting nanostructured material comprises or consists of nanowires.

As the electrically conducting nanostructured material may not be regular in shape, size of an electrically conducting nanostructured material is defined by a maximal length of a line segment passing through the centre and connecting two points on the periphery of the nanostructured material.

In various embodiments, the electrically conducting nanostructured material may each have a size in a range of about 10 nm to about 100 nm. For example, at least one dimension of each electrically conductive nanostructured material may have a length in the range of about 1 nm to about 100 nm, about 1 nm to about 80 nm, about 1 nm to about 60 nm, about 1 nm to about 40 nm, about 10 nm to about 100 nm, about 10 nm to about 80 nm, about 10 nm to about 60 nm, about 10 nm to about 40 nm, about 20 nm to about 80 nm, or about 30 nm to about 60 nm.

The mixture comprising the electrically conducting nanostructured material may be a dispersion of the electrically conducting nanostructured material in a suitable liquid. The liquid may be a liquid that does not interact chemically with, or does not dissolve the electrically conducting nanostructured material. In various embodiments, the liquid comprises or consists of an alcohol-based solvent. Examples of an alcohol-based solvent include, but are not limited to, methanol, ethanol, and isopropyl alcohol. In specific embodiments, the alcohol-based solvent comprises or consists of ethanol.

The electrically conducting nanostructured material may be well dispersed. In various embodiments, methods such as agitation, stirring or sonication may be used to disperse the electrically conducting nanostructured material in the mixture.

Concentration of the electrically conducting nanostructured material in the mixture may be in the range of about 0.01 mg/mL to about 5 mg/mL, such as about 0.05 mg/mL to about 5 mg/mL, about 0.1 mg/mL to about 5 mg/mL, about 0.5 mg/mL to about 5 mg/mL, about 1 mg/mL to about 5 mg/mL, about 0.01 mg/mL to about 3 mg/mL, about 0.01 mg/mL to about 2 mg/mL, or about 0.01 mg/mL to about 1 mg/mL. In specific embodiments, concentration of the electrically conducting nanostructured material in the mixture is in the range of about 0.05 mg/mL to about 2 mg/mL.

The mixture comprising an electrically conducting nanostructured material is filtered through a membrane such that the electrically conducting nanostructured material is deposited on the membrane.

The term "membrane" as used herein refers to a semi-permeable material that selectively allows certain species to pass through it while retaining others within or on the material. A membrane therefore functions like a filter medium to permit a component separation by selectively controlling passage of the components from one side of the membrane to the other side. Accordingly, by filtering the mixture comprising an electrically conducting nanostructured material through the membrane, at least some or a substantial portion of the electrically conducting nanostructured material is deposited on the membrane.

Generally, the membrane may be formed using any suitable polymer. Examples of polymers include, but are not limited to, polyarylether sulfones such as polysulfone (PSF) and polyether sulfone (PES), polyimides such as polyetherimide (PEI), polyacrylonitrile (PAN), polyvinylidene fluoride (PVDF), combination thereof, or derivatives thereof.

In various embodiments, the membrane is selected from the group consisting of polycarbonate membrane, glass fiber membrane, mixed cellulose ester (MCE) membrane, Nylon membrane, polyethersulfone (PES) membrane, polypropylene (PP) membrane, polytetrafluoroethylene (PTFE) membrane, and a polyvinylidene fluoride (PVDF) membrane. In specific embodiments, the membrane comprises or consists of polycarbonate.

Filtering of the mixture comprising an electrically conducting nanostructured material through a membrane may be carried out using gravity only. In various embodiments, to allow for a greater rate of filtration, filtering of the mixture comprising an electrically conducting nanostructured material through a membrane is carried out by vacuum filtration.

The method disclosed herein comprises depositing an elastomeric polymerisable material on the electrically conducting nanostructured material and curing the elastomeric polymerisable material thereby embedding the electrically conducting nanostructured material in an elastomeric polymer thus formed.

The term "elastomeric" as used herein refers to a material which is able to undergo deformation or expansion upon application of a force, recovering its previous size and shape after the deformation or expansion. The term "elastomeric polymerisable material" accordingly refers to a pre-polymeric material that may be cured or polymerized to become a elastomeric polymer.

In various embodiments, the elastomeric polymerisable material is a material that allows formation of a soft polymer that is able to deform to allow intimate contact with the membrane. For example, the elastomeric polymerisable material may comprise or consist of monomers or prepolymers selected from the group consisting of (poly)siloxanes, (poly)epoxides, (poly)urethanes, and the like, and combinations thereof. In various embodiments, the elastomeric polymerisable material may comprise or consist of monomers or prepolymers of polydimethylsiloxane, epoxy resins, polysulfide rubber, silicone rubber, urethane rubber, urethane plastic, and combinations thereof. In specific embodiments, the elastomeric polymerisable material comprises or consists of polydimethylsiloxane prepolymer. The elastomeric polymer may comprise or consist of polysiloxanes, polyepoxides, polysulfide rubber, polyurethanes, and combinations thereof.

The elastomeric polymerisable material may be deposited on the electrically conducting nanostructured material in any suitable thickness, as thickness of the resultant elastomeric polymer formed does not affect its functionality. Notwithstanding the above, thickness of the resultant elastomeric polymer should not be too thin as the elastomeric polymer may become fragile as a result. Generally, the elastomeric polymerisable material is deposited on the electrically conducting nanostructured material, such that thickness of the elastomeric polymer that is formed is in order of mm, such as about 1 mm, about 5 mm, or about 10 mm, so as to facilitate handling of the elastomeric polymer.

In various embodiments, depositing an elastomeric polymerisable material on the electrically conducting nanostructured material and curing the elastomeric polymerisable material comprises degassing the elastomeric polymerisable material prior to curing.

For example, the elastomeric polymerisable material may be a liquid, and the degassing may be carried out to remove bubbles in the elastomeric polymerisable material. The degassing may also be carried out to allow efficient penetration of the elastomeric polymerisable material into the electrically conducting nanostructured material.

In various embodiments, degassing the elastomeric polymerisable material may be carried out for a time period suitable to remove bubbles in the elastomeric polymerisable material. The time period for degassing may depend on the elastomeric polymerisable material used. Generally, the time period for degassing is in the order of minutes, such as about 10 minutes, 20 minutes, 30 minutes, or 60 minutes. In specific embodiments, the elastomeric polymerisable material is degassed for about 10 minutes.

Upon deposition, the elastomeric polymerisable material is cured thereby embedding the electrically conducting nanostructured material in an elastomeric polymer thus formed.

As used herein, the term "cure" refers to polymerization or cross-linking of a pre-polymer using a method that induces polymerization or cross-linking of the pre-polymer. The cross-linking can involve one or more reactions such as free radical polymerization, condensation polymerization, anionic or cationic polymerization, or step growth polymerization.

The method comprises separating the elastomeric polymer with the embedded electrically conducting nanostructured material from the membrane to obtain the flexible electronic device.

As mentioned above, the electrically conducting nanostructured material is embedded in an elastomeric polymer thus formed. By peeling off the elastomeric polymer from the membrane, for example, the elastomeric polymer may be separated from the membrane. In so doing, the electrically conducting nanostructured material is transferred to the elastomeric polymer to obtain the flexible electronic device.

In various embodiments, the electrically conducting nanostructured material is embedded in the elastomeric polymer to form a flexible electronic device in the form of nanopaper. Depending on application, the nanopaper may be cut or patterned according to intended application. For example, the nanopaper may be patterned to form a strain sensor. In such embodiments, the electrically conducting nanostructured material may comprise or consist of graphene and nanocellulose. The strain sensor may assume the form of a U-shaped sensor on the membrane.

Apart from the above-mentioned, patterning of the flexible electronic device may be carried out during the initial filtering process. For example, filtering a mixture comprising an electrically conducting nanostructured material through a membrane may comprise filtering the mixture comprising the electrically conducting nanostructured material through a patterned mask arranged on the membrane. In so doing, the electrically conducting nanostructured material may be deposited on the membrane in a pattern that is defined by the patterned mask. The patterned mask may be removed from the membrane prior to depositing the elastomeric polymerisable material on the electrically conducting nanostructured material.

The patterned mask may be arranged on the membrane such that the patterned mask and the membrane are in continuous contact with each other. For example, the patterned mask and the membrane may be pressed towards each other, such that there is close contact with the membrane and there are no spacing between the patterned mask and the membrane which may result in formation of poorly defined patterns.

The patterned mask may comprise or consist of a polymer selected from the group consisting of polydimethylsiloxane, epoxy resins, polysulfide rubber, silicone rubber, urethane rubber, urethane plastic, combinations thereof, and copolymers thereof. In various embodiments, the patterned mask comprises or consists of polysiloxanes, polyepoxides, polysulfide rubber, polyurethanes, and combinations thereof. In specific embodiments, the patterned mask comprises or consists of polydimethylsiloxane.

By filtering the mixture comprising the electrically conducting nanostructured material through a patterned mask arranged on the membrane, the electrically conducting nanostructured material may be deposited on the membrane in a pattern that is defined by the patterned mask. Advantageously, this allows a variety of electronic devices to be fabricated easily using a method disclosed herein.

For example, the patterned mask may be patterned such that the electrically conducting nanostructured material is deposited on the membrane to form an electrical circuit on the membrane. This may be carried out using a single pass process, whereby filtering of the mixture comprising the electrically conducting nanostructured material is carried out one time through a patterned mask arranged on the membrane.

Besides the above-mentioned, whereby the electrically conducting nanostructured material is filtered through a patterned mask arranged on the membrane in a single pass process, the filtering may be carried out using two or more passes to allow a stacked or layered structure to be formed. Advantageously, this allows formation of devices, such as a photodetector, a capacitor, an electrochromic device, and/or a sensor using a method disclosed herein.

In various embodiments, filtering a mixture comprising the electrically conducting nanostructured material through a patterned mask arranged on the membrane and removing the patterned mask prior to depositing the elastomeric polymerisable material on the electrically conducting nanostructured material is repeated one or more times to form multiple patterns on the membrane.

The method disclosed herein may be used to form a photodetector. For example, the patterned mask may be patterned such that the electrically conducting nanostructured material is deposited on the membrane to form a pair of electrodes on the membrane. By filtering a mixture comprising the electrically conducting nanostructured material through a patterned mask arranged on the membrane and removing the patterned mask prior to depositing the elastomeric polymerisable material on the electrically conducting nanostructured material, and repeating the processes, a second electrically conducting nanostructured material may be deposited on the membrane.

The second electrically conducting nanostructured material may be in electrical communication with each electrode of the pair of electrodes to form a detection channel on the membrane. The pair of electrodes and the detection channel may be fully embedded in the elastomeric polymer, and may be operable to function as a photodetector. The electrically conducting nanostructured material may comprise or consist of Ag nanowires, while the second electrically conducting nanostructured material may comprise or consist of ZnO nanowires. Advantageously, stretchable nanowire photodetectors with improved stretchability of 100% have been demonstrated herein.

The method disclosed herein may also be used to form a capacitor or an electrochromic device. For example, the patterned mask may be patterned such that the electrically conducting nanostructured material is deposited on the membrane to form an electrode on the membrane. By coating an electrically conductive layer on a surface portion of the electrode, a capacitor or an electrochromic device may be formed. The electrically conductive layer may be coated using any suitable means. In some embodiments, the electrically conductive layer is coated on the electrode by electrochemical deposition. The electrically conductive layer may comprise or consist of $V_2O_5$, $WO_3$, or combinations thereof.

The patterned mask may, in embodiments, be patterned such that the electrically conducting nanostructured material is deposited on the membrane to form a U-shaped sensor on the membrane. In these embodiments, the electrically conducting nanostructured material may comprise or consist of graphene and nanocellulose.

The invention refers in a further aspect to a flexible electronic device manufactured by a method according to the first aspect. A yet further aspect of the invention refers to use of a flexible electronic device manufactured by a method according to the first aspect in stretchable electronics, biomedical devices, implantable electronics, photodetectors, capacitors, electrochromic devices, strain gauges, sensors, wearable electronics, clean energy devices, smart clothes, and sensory skin for robotic systems.

As mentioned above, a method disclosed herein may be used to manufacture photodetectors, involving an intrinsically stretchable device structure with both electrodes and detection channels fully embedded in elastomeric polymer matrix. Photodetectors, which is a type of electronic device to detect incident light, have found broad applications, such as digital cameras, charge-coupled devices (CCD), and solar cells. For example, CCD helps to convert optical images into electrical signals, which are then stored in memory during digital imaging. Solar cell employs a photodiode structure to convert incident sun light into voltage and current, which acts like a battery drive external circuits.

By rendering the photodetectors stretchable, they may be used in wearable electronics, such as next-generation digital cameras, that may be integrated on clothing. The flexible electronic device may alternative be a computing device that may be folded and put into compartments of clothing or bags, for example, to be unfolded in use. Other possible application areas include stretchable electronic circuit to conform to curvilinear surface of human organs in order to provide a more accurate reading and monitoring of bio-activities. Such compliant electronics may find important applications in future health monitoring.

Apart from the above, other areas in which the flexible electronic device may find use include applications which require that the electronic devices are flexible. For example, the flexible electronic device disclosed herein may be use to form cyber skin that mimic functionalities of human-skin for robotic system, such as robots. Flexibility of the flexible electronic devices disclosed herein may be capable of adapting to movements of the robots. A series of sensory devices such as photodetector, temperature sensor, pressure sensor, strain sensor, gas sensor, and the like that may be manufactured using a method disclosed herein, may be integrated into such devices to enable such functions, so that the robots are able to feel and sense like a human-being.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

As used herein, the term "and/or" includes any and all combinations of one or more of the associated listed items. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

EXPERIMENTAL SECTION

In various embodiments, a method for fabricating stretchable photodetectors based on embedded nanowire (nanowire) structure is provided. The nanowire photodetectors may maintain excellent functionality even when stretched to 100% strain. The technology disclosed herein may find unprecedented applications in future stretchable devices.

Unlike existing photodetectors (such as CCD cameras) which are all on rigid substrates, soft forms of photodetectors, which may be stretched without damaging their functionality, are presented.

A complete stretchable system would require the integration of different stretchable components, and photodetector is among the most important components for such as stretchable sensory system.

Stretchable devices represent the next-generation technology towards wearable electronics. They hold great promise to open up brand new applications, such as biomedical device, implantable electronics, wearable electronic, clean energy, smart clothes, sensory skin for robotic system, and the like.

In this disclosure, method of fabricating stretchable photodetectors, batteries, supercapacitors, and electrochromic devices based on embedded elastic conductors, such as nanowires embedded in a polymeric matrix is disclosed. The strategies and results are presented in the following order:
(1) Fabrication processes
(2) Characterization of stretchable photodetectors
(3) Preliminary testing results
(4) Summary Example 1: Materials The ZnO nanowires were grown via a chemical vapor deposition (CVD) method. Briefly, a mixed ZnO and carbon powder (about 0.5 g, molar ratio of 1:1) was used as source material and placed in the center of a horizontal tube furnace. Typically, the furnace temperature was increased to 1000° C. at a rate of 15° C. min$^{-1}$ and kept for 60 min. Argon (Ar) gas mixed with 10% oxygen ($O_2$) (total pressure 2.2 mbar) was used as carrier gas for ZnO nanowire growth. Collection substrate for ZnO nanowire growth was placed at the temperature zone of about 520° C.

The as-obtained ZnO nanowires on Si substrates were put in ethanol and sonicated for 30 s to prepare the nanowire dispersion (typically with a concentration of 0.05 mg/mL). Commercially available Ag nanowires dispersed in ethanol (2 mg/mL) were used as received. The lengths of the Ag nanowires were 20 μm to 100 μm and diameters are within 40 nm to 100 nm.

The PDMS (Sylgard 184, Dow Corning) mask is prepared by curing degased mixture of base and curer (weight ratio 10:1) at 60° C. for 2 h. Then the solidified membrane (thickness about 1 mm) is cut with graver to obtain the desired patterns. Two sets of masks were prepared for Ag nanowire electrodes and ZnO nanowire channels, respectively. The PDMS hard masks were put on top of PC filter membranes (Millipore GTTP, pore size 220 nm) to filter the nanowire patterns. Ag nanowire patterns were filtered first followed by ZnO nanowire patterns. The filter membrane with nanowire patterns was then put in a glass petri dish. Mixed PDMS base and curer (weight ratio 10:1) was poured into the petri dish, degassed for 30 min in a vacuum desiccator and then cured at 60° C. for 2 h. After curing, the solid PDMS membrane was peeled off from the membrane and the nanowire patterns were transferred to the PDMS substrate. The devices were used for testing without any further treatments.

Morphologies of the nanowires and devices were characterized using field-emission SEM (FE-SEM, JSM 7600F). Photoresponse behaviors of the devices were characterized using Keithley analyzer with a portable UV lamp as light source (365 nm). The device is fixed on a home-made stretching stage to apply strain. All measurements were performed at room temperature in ambient conditions.

Example 2: Fabrication Process

A key challenge of stretchable electronics relates to maintaining of functionality of the stretchable electronics when the devices are stretched. For example, a challenge for photodetectors fabrication lies in making stretchable electrodes and light detection channels.

Nanowires, a class of 1D nanomaterials, was used in the experiments for both stretchable electrodes and detection channels. For example, highly conductive metallic nanowires may be used as electrodes, and semiconducting nanowires may be used as detection channels.

Suitable metal nanowires include but are not limited to Ag nanowire, Au nanowire, Pt nanowire, Cu nanowire, Ni nanowire, Ti nanowire, Cr nanowire, Co nanowire, Fe nanowire, Al nanowire, Zn nanowire and combinations thereof.

Suitable semiconducting nanowires include but are not limited to elemental nanowires (Si, Ge, Se, Te, etc), binary phase nanowires (ZnS, ZnSe, ZnTe, CdS, CdSe, CdTe, InP, GaN, $Sb_2Se_3$, $ZrS_2$, $Ag_2S$, InSe, $In_2Se_3$, $Bi_2S_3$, $Zn_3P_2$, ZnO, $SnO_2$, $In_2O_3$, CdO, $V_2O_5$, $Ga_2O_3$, $Fe_2O_3$, $Cu_2O$, CuO, $CeO_2$, $TiO_2$, $Sb_2O_3$, etc), ternary phase nanowires (ZnCdSe, ZnSeTe, CdZnS, $Zn_2GeO_4$, $In_2Ge_2O_7$, $ZnSnO_4$, $ZnGa_2O_4$, etc), hybrid nanowires (Au/$SiO_2$, Au/$Ga_2O_3$, ZnO/Si; ZnS/InP, Ge/CdS, ZnO/GaN, $RuO_2$/$TiO_2$, Ga/ZnS, ZnSe/$SiO_2$, Au/CdSe/Au, Si/porphyrin, CdS/PPy, ZnS/CNT), and combinations thereof.

Other forms of 1D nanostructures, such as inorganic and organic nanotubes, may also be used as they share similar functionalities with nanowires. Apart from 1D nanowires and nanotubes, the method disclosed herein may also be expanded to other types of nanostructures such as powders, nanoparticles, and quantum dots. The nanostructures, either in the form of 1D nanowires or nanotubes, or 0D nanoparticles, may be used for stretchable photodetectors with the methods described herein.

FIG. 1 shows an exemplary example of the fabrication process of stretchable photodetector array.

Different functional components were integrated into devices using a filtration method. Two sets of filtration masks (for Ag nanowire electrodes and ZnO nanowire channel) were prepared from the cured polydimethylsiloxane (PDMS) membrane (thickness 1 mm). Referring to FIG. 1(A), the mask for electrodes is first put on top of the polycarbonate (PC) filter membrane. The mask is naturally in close contact with the membrane due to the vacuum suction force and sticky surface of PDMS, to prevent the spreading of nanowire dispersion and make well-defined patterns. Ag nanowire dispersion in an alcohol solvent, for example, ethanol (commercially available, 1 mg/mL) was filtrated through the membrane, leaving desired patterns as defined by the PDMS hard mask in a uniform percolating nanowire film. The filtration process is fast due to the large pore size (220 nm) and high flow rate (3.36 mL·min$^{-1}$·cm$^{-2}$ for water) of the PC membrane. The as-obtained nanowire film is quite uniform due to the simultaneous extraction of solvent from the uniformly distributed track-etched pores. The thickness and hence resistivity of the Ag nanowire film can be controlled by the volume of nanowire dispersion added. Subsequently, the first mask is removed and the Ag nanowire film is thoroughly rinsed with ethanol.

The second mask for ZnO channel is aligned on top of the Ag electrode patterns, and ZnO nanowire patterns were filtered analogously as shown in FIG. 1(B). As shown, a second mask with patterns for ZnO nanowire channels was similarly put on top of the filter membrane with Ag nanowire patterns. This second mask was pressed well to ensure close contact with the membrane, and no spacing was left between the mask and membrane. Otherwise, the spaces may cause nanowire dispersion spreading and result in poorly defined patterns. ZnO nanowire dispersion in an alcohol solvent, for example ethanol, was filtrated to yield desired patterns connecting the two Ag nanowire electrodes.

Further deposition of multiple functional layers may be readily achieved with the filtration method disclosed herein. The filter membrane with Ag and ZnO nanowire patterns was then placed in a glass petri dish.

There are no specific requirements regarding the filter membranes. Different types of filter membranes may be used, such as glass fiber membrane, mixed cellulose ester (MCE) membrane, Nylon membrane, polyethersulfone (PES) membrane, polypropylene (PP) membrane, polytetrafluoroethylene (PTFE) membrane, polyvinylidene fluoride (PVDF) membrane, etc.

Although PDMS was used in the experiments as filtration masks, other soft polymer materials that may deform to ensure intimate contact with the membranes may also be used. Examples of polymer materials that may be used include, but are not limited to epoxy resins, polysulfide rubber, silicone rubber, urethane rubber, urethane plastic, combinations thereof, and copolymers thereof.

When the Ag and ZnO nanowire patterns were ready, mixed PDMS liquid prepolymer (Dow Corning Sylgard 184, with a mass ratio of base to curer of 10:1) was poured onto the filter membrane. The prepolymer was then degassed for typically 30 min in a vacuum desiccator before being cured at 60° C. for 2 h in air. The degassing process was carried out to remove bubbles in the liquid PDMS prepolymer, and to allow efficient penetration of the liquid into the porous nanowire film before solidification.

Figure 2:
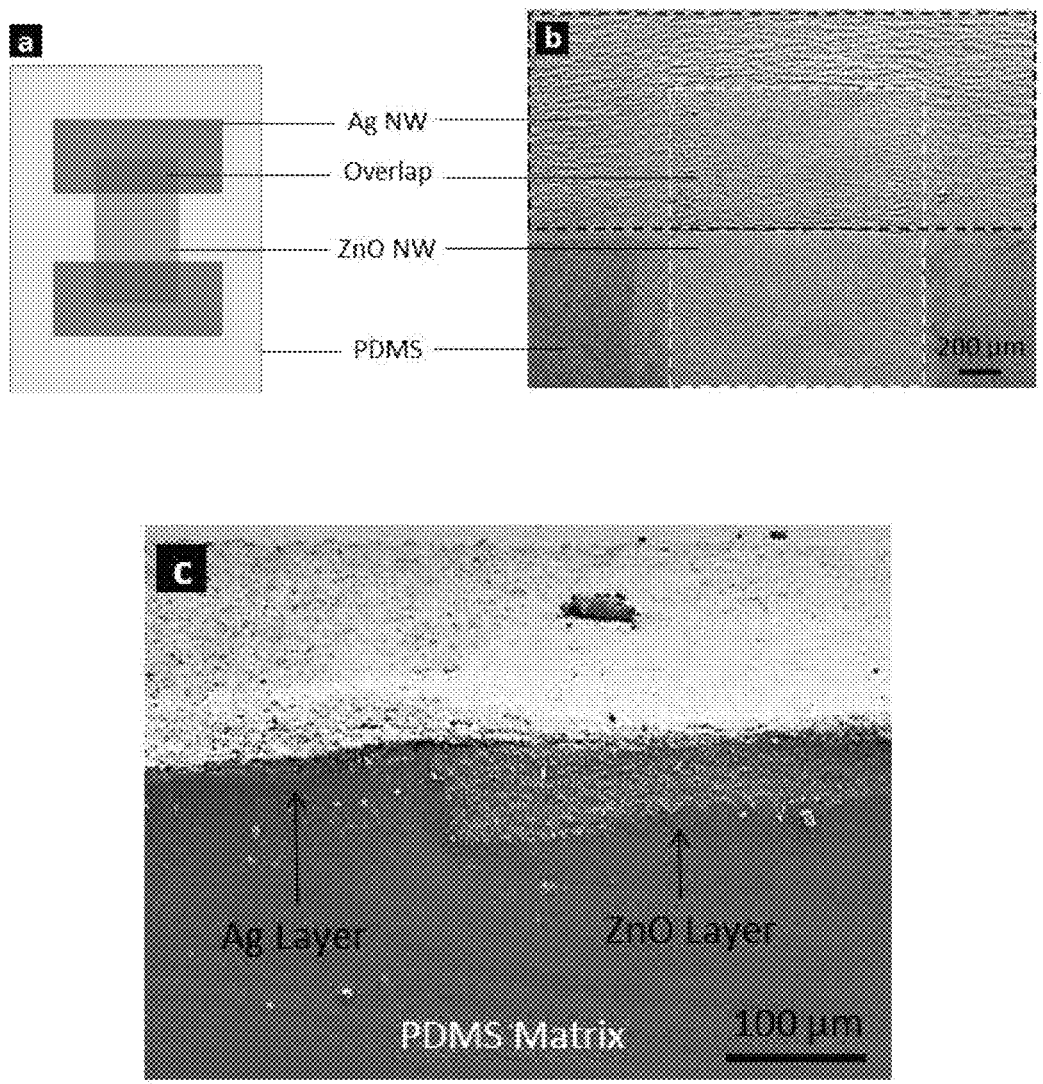
FIGS. 2(A) and (B) shows comparison of the schematic diagram and scanning electron microscopy (SEM) image of a photodetector.
FIG. 2(C) is a cross-sectional view of the Ag/ZnO nanowire overlapping area.
FIG. 2(D) is an enlarged view of the overlapped bilayer structure.
FIG. 2(E) is a top view of the Ag nanowire electrodes.
FIG. 2(F) is a cross-sectional view of the ZnO nanowire layer embedded in PDMS matrix.
Figure 2:
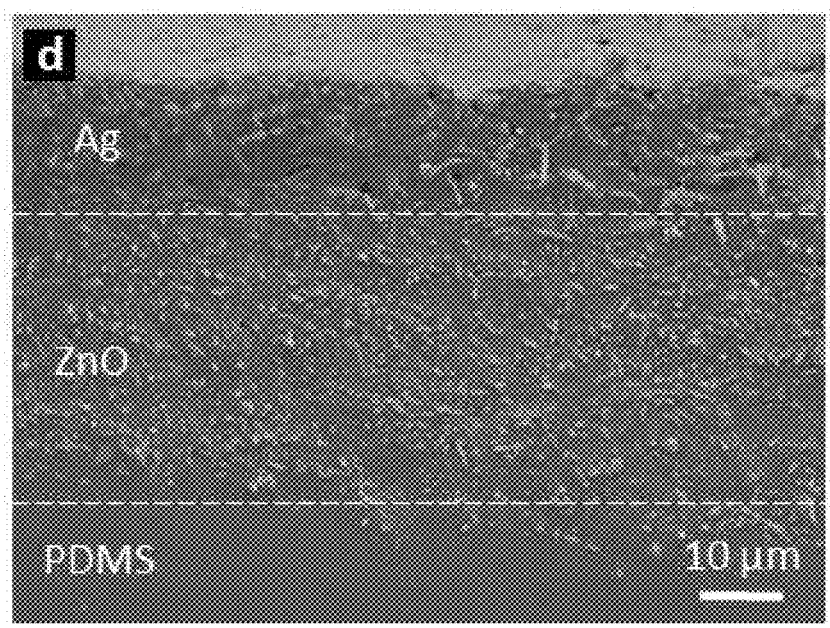
Figure 2:
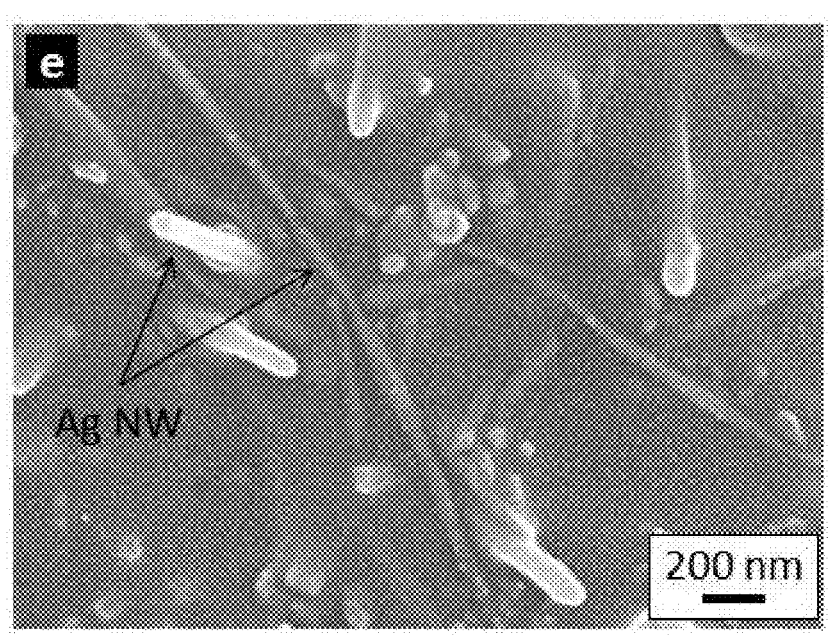
Figure 2:
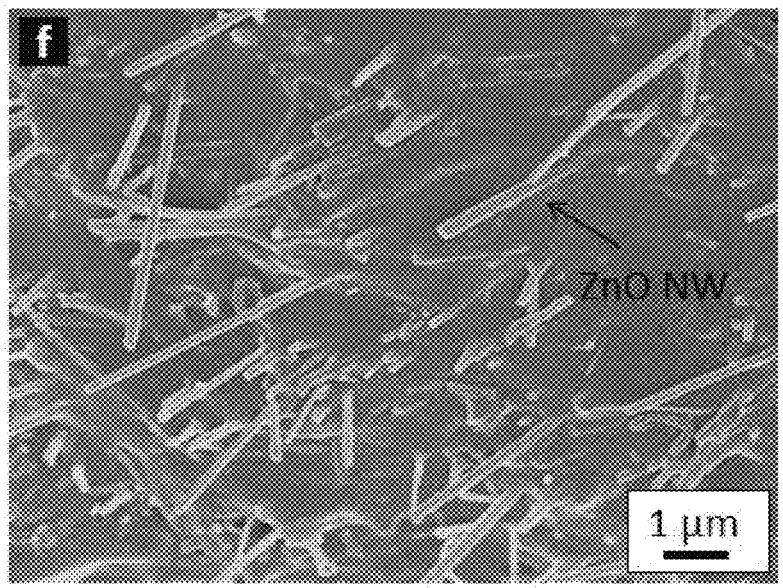

PDMS is able to efficiently penetrate into the porous nanowire films and produce fully embedded structures (FIG. 2). The solidified PDMS substrate is peeled off from the filter membrane after solidification with both nanowire electrodes and channels transferred to the PDMS matrix.

Figure 3:
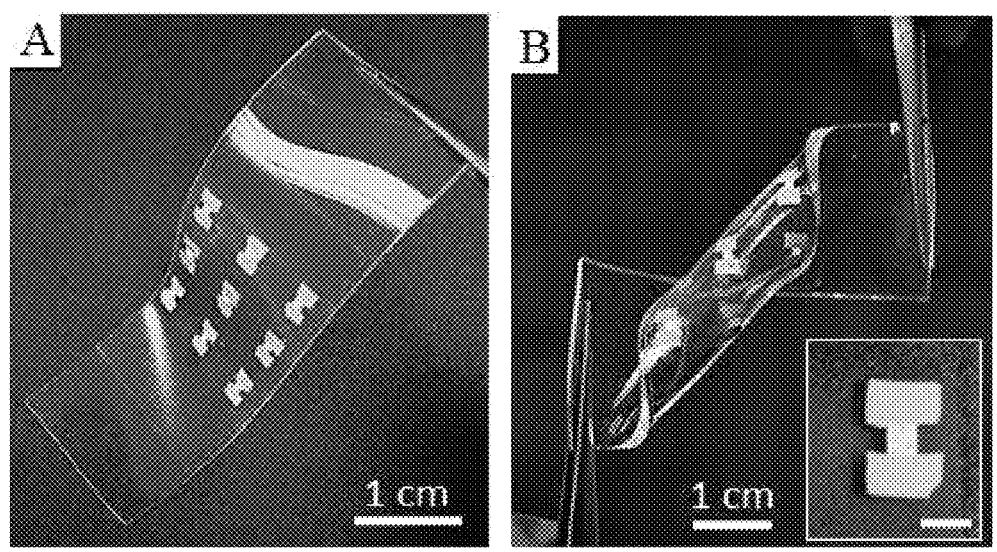
FIGS. 3(A) and (B) are digital images of a 3×3 photodetector array on PDMS substrate. Inset in (B) is an enlarged view of an individual device with Ag nanowire electrodes and ZnO nanowire channel. Scale bar represents a length of 2 mm.

FIGS. 3(A) and (B) show an example of the stretchable nanowire photodetector array. Inset in FIG. 3(B) is an enlarged view of an individual photodetector made of two symmetric Ag nanowire electrodes and one ZnO nanowire detection channel.

Previously, the embedded nanowire electrodes were fabricated via a simple "casting" method. In this "casting" method, the nanowire dispersion was drop casted on a flat substrate (glass or polished Si wafer). A layer of percolating nanowire film was formed when the solvent was evaporated, followed by elastomer curing and peel off to obtain the embedded nanowire substrate. However, this "casting" method have several drawbacks which limit their applications.

Firstly, the method is time-consuming as it takes time for the solvent to evaporate. This is especially the case when aqueous solution is used or the casting process has to be repeated for several times to obtain the nanowire film with desired thickness.

Secondly, rinsing and washing is needed after nanowire film deposition to remove the surfactants and improve the film conductivity. However, the nanowire film casted on glass/Si wafer would be easily washed away and get damaged. Moreover, the rinsing steps would further elongate the overall processing time.

Thirdly, simply drop the nanowire dispersion onto glass or Si wafer surface and let them dry usually lead to non-uniform nanowire film deposition due to the "coffee-ring" effect. Nanowires would preferentially aggregate along the periphery of the liquid droplet and result in thicker deposition along the boundary and limited deposition in the center, as observed in the experiments. Further complex treatments of the substrate or solution are needed to avoid this problem.

Fourthly, the "casting" method has been used to fabricate single layer nanowire films for such as stretchable conductors, but there are significant difficulties to fabricate multilayer structures using this method, mainly because the difficulties in making patterns with well-defined shapes and desired layouts through a layer-by-layer (LBL) process. However, sequential multilayer deposition is a must for the construction of most current as well as future complex device architectures. The filtration method disclosed herein is a fast process to produce uniform nanowire films and it also allows facile multilayer integration.

It is important to ensure that the nanowire networks are fully embedded in the PDMS matrix, otherwise the nanowire film may crack when stretched. The solidified PDMS substrate (1 mm thick) was carefully peeled off from the filter membrane, and the nanowire patterns were transferred to the PDMS substrate.

There are no restrictions on the thickness of the PDMS substrates, as thicknesses do not affect their functionalities. The thickness is usually made into 1 mm for easy handling purpose. The substrates become fragile when they are too thin. It is difficult to stretch the substrates if they are too thick. The as-fabricated photodetector is made of two Ag nanowire electrodes and ZGO nanowire detection channel. Both Ag nanowire and ZnO nanowire components are embedded in PDMS matrix and the entire device is stretchable up to 100% strain with good maintenance of its functionality.

Example 3: Structural Characterizations

Figure 4:
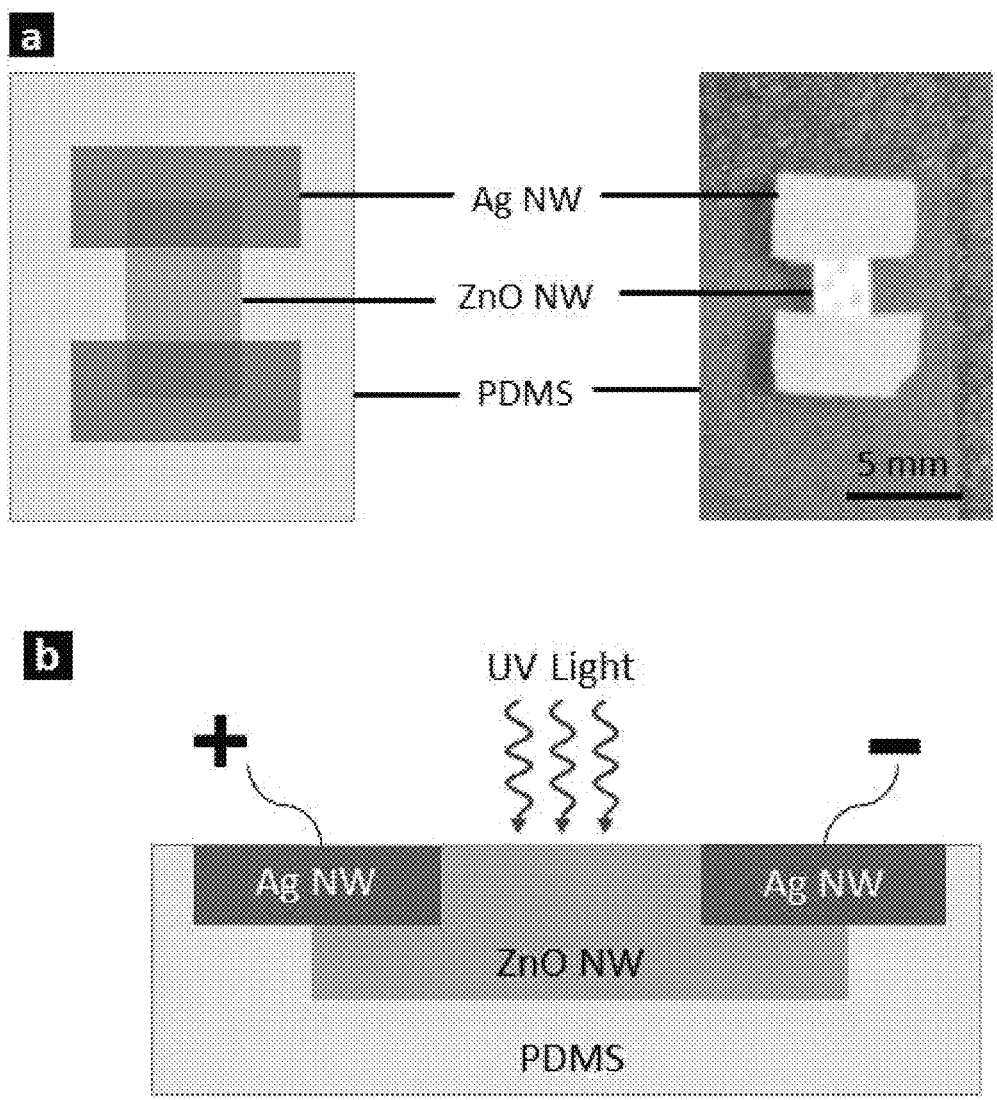
FIG. 4 shows (A) top view and (B) cross-sectional view of the stretchable photodetectors.

Schematic diagrams of the stretchable nanowire photodetector are shown in FIG. 4(A) (top view) and FIG. 4(B) (cross-sectional view), respectively. Based on the fabrication processes discussed above, the Ag nanowire electrodes are on top layer and ZnO nanowire channel lies below the electrodes (FIG. 4). The ZnO channel overlapped with two Ag nanowire electrodes for contact purpose. Both the electrodes and detection channel are fully embedded in the PDMS matrix (FIG. 4B). Voltage is applied at the two Ag nanowire electrodes during testing, and the resistance of ZnO nanowire detection channel changes with incident light.

Microstructures of the nanowire photodetectors are characterized using scanning electron microscopy (SEM) as shown in FIG. 2.

FIGS. 2(A) and (B) is the comparison of schematic diagram and top view of SEM image, showing the layouts of Ag nanowire electrodes and ZnO nanowire channel. The overlapping area is clearly visible in SEM image. The locations of Ag nanowire electrodes and ZnO nanowire channel is indicated by blue and yellow dash boxes respectively in FIG. 2(B). FIG. 2(B) shows that the Ag nanowire electrode is slightly wrinkled, which can be attributed to the residual strain arising from the irreversible sliding of nanowires in the PDMS matrix. Wavelength and amplitude of the wrinkles depend on the nanowire film thickness, Young's modulus, Poisson's ratio as well as applied strain. The ZnO channel is relatively flat (FIG. 2(B)) due to the larger film thickness (FIG. 2(D)) which make the nanowire film more stiff. FIG. 2(C) is a cross-sectional view of the photodetector electrode-channel overlapping area, with an enlarged view of the overlapped bilayer structure shown in FIG. 2(D). It can be clearly viewed that the Ag nanowire electrode is on top of the ZnO nanowire channel, as expected from the fabrication processes. Both layers are fully embedded in the PDMS matrix. FIG. 2(D) is an enlarged view of the bilayer structure. The measured thicknesses of Ag and ZnO nanowire layers are 15 µm and 35 µm, respectively. The ZnO nanowire layer has a good contact with the Ag nanowire electrodes. FIG. 2(E) is a typical top view of the Ag nanowire electrodes, and FIG. 2(F) is a cross-sectional view of the freshly cut ZnO nanowire channel. The solid parts surrounding the Ag and ZnO nanowires in SEM images are PDMS matrix. It is evident that all the nanowire layers are fully embedded in the PDMS matrix, yielding a structure with all the components (electrodes and detection channels) being intrinsically stretchable.

Example 4: Preliminary Testing Results

Preliminary results of stretchable nanowire photodetectors are presented below as evidence for feasibility of the prototype device disclosed herein.

FIG. 5A is a schematic diagram of the stretching processes of stretchable devices. The substrate is fixed at two ends and a force is applied to stretch the device. Assuming the original length of the substrate is L, the strains are 50% and 100% when the length is stretched to 1.5 L and 2 L, respectively. FIG. 5B presents typically digital images of the nanowire photodetector at different strains. The substrate with photodetector array (3×3 devices) is fixed on a stretching stage.

Figure 5:
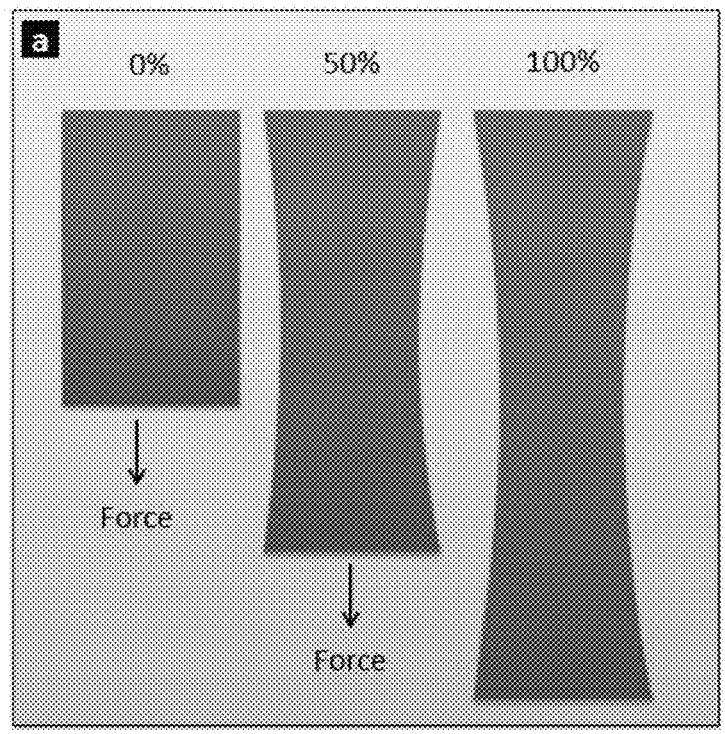
FIG. 5(A) is a schematic diagram of stretching the devices to different strains.
FIG. 5(B) is a digital image of the PDMS substrate with photodetector arrays at different strains of 0%, 50% and 100%.
FIG. 5(C) is a graph showing I-V curves of the device at 0% strain.
FIG. 5(D) is a graph showing response behavior of the photodetectors at different strains from 0% to 100%.
FIG. 5(E) to (G) are graphs showing relationships of ON/OFF ratio, response time and reset time verses strain, respectively.
Figure 5:
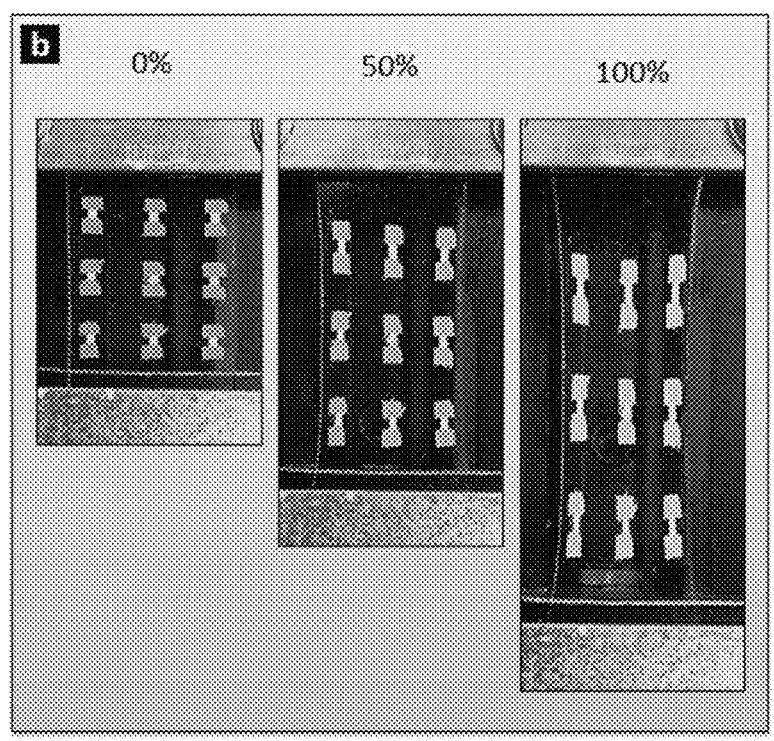
Figure 5:
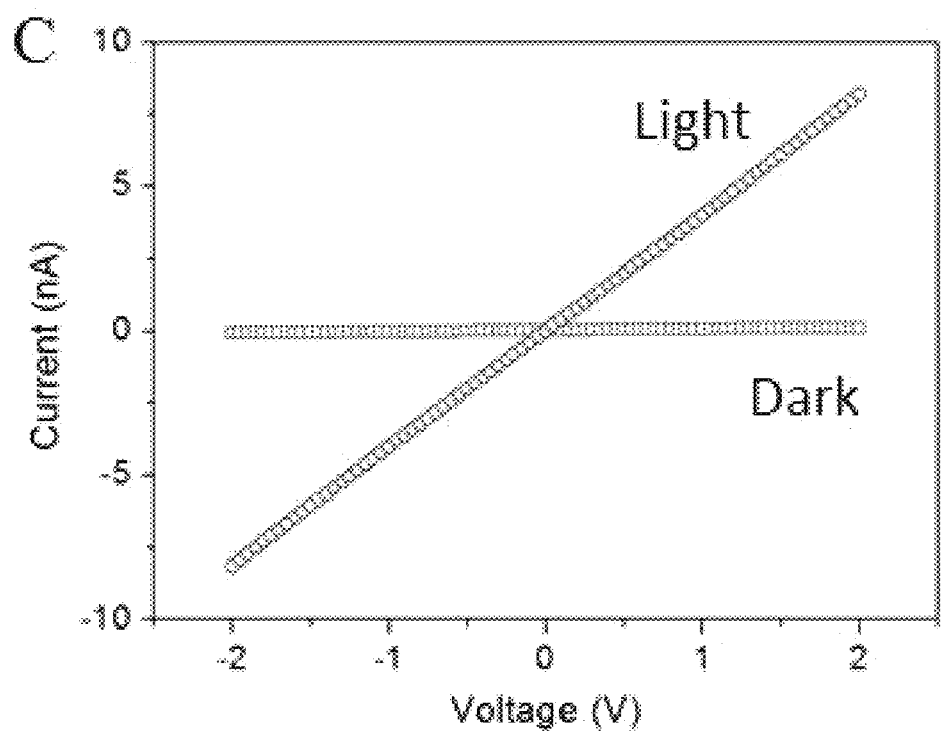
Figure 5:
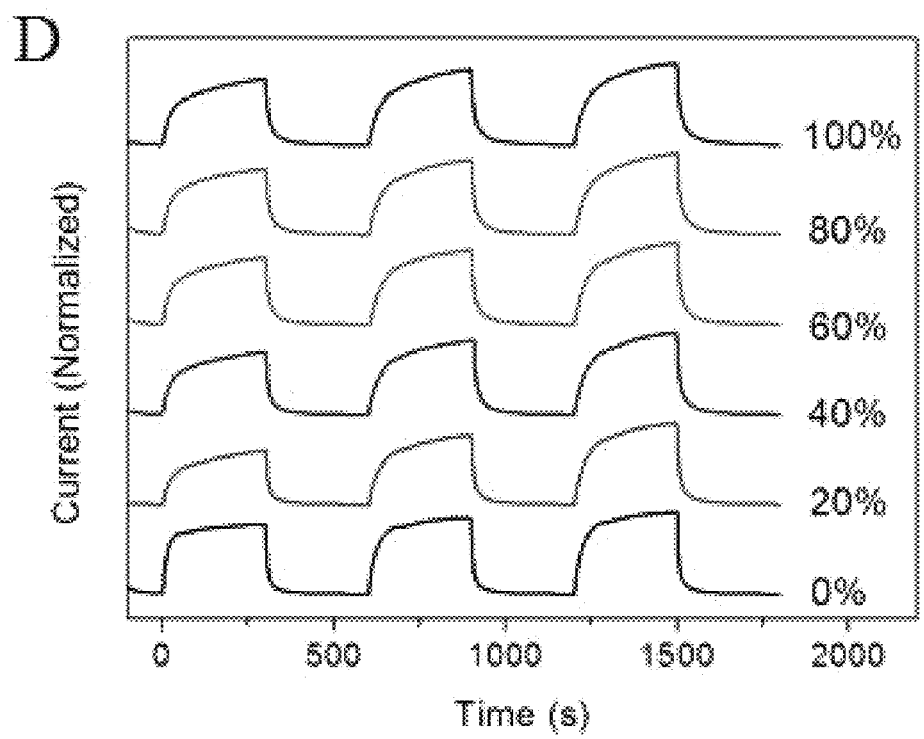
Figure 5:
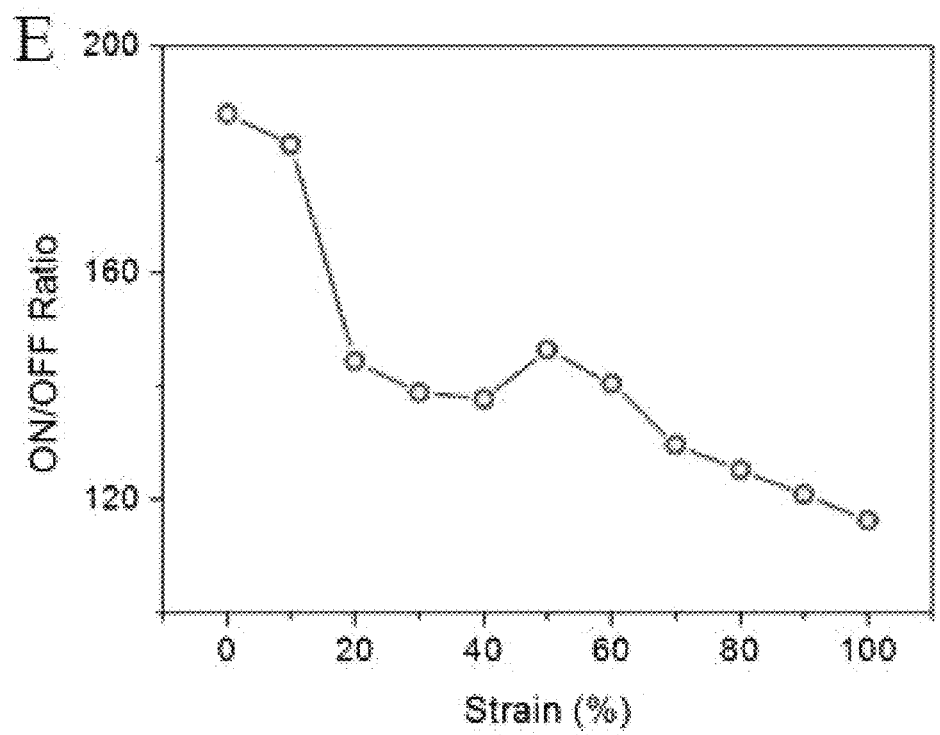
Figure 5:
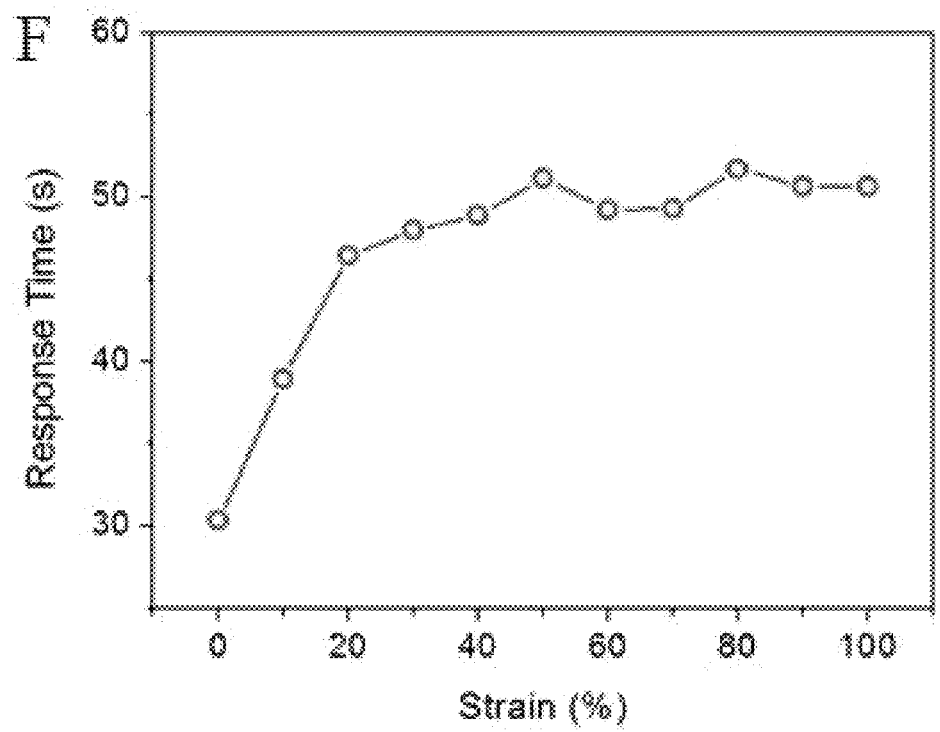
Figure 5:
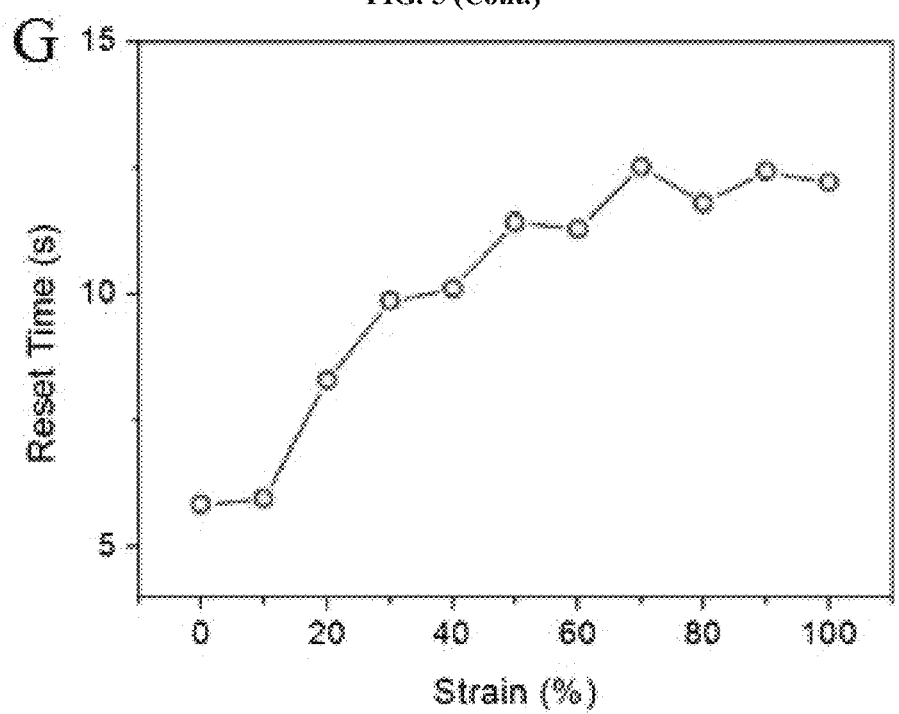

Performances of the photodetectors are shown in FIG. 5. The photodetector was fixed on a home-built stretching stage to apply desired strain, which is defined as:

Strain=$(L-L_0)/L_0$, where $L_0$ and L are the lengths before and after stretching, respectively.

FIG. 5C is the I-V curves of the photodetector at 0% strain in dark and under illumination (365 nm UV light, 0.06 mW/cm$^2$). Good Ohmic conducting behaviors were observed in both conditions, as expected based on the band alignments of Ag electrodes and ZnO channels. At the fixed voltage of 2 V, the current increases from about 0.04 nA (dark current) to 8.18 nA when the UV light is turned on, which is an increase of 188 folds. Photoresponse behaviors of the device under different strains (from 0% up to 100%) are shown in FIG. 5D. The photodetectors were functioning well even at a strain as high as 100%, indicating excellent stretchability of the devices. FIG. 5E is the plot of ON/OFF ratio verses strain. The ON/OFF ratio decreased from 188 at 0% strain to 116 at 100% strain. A quasi-linear relationship between ON/OFF ratio and strain was observed, except the variations at 20% to 40% strain (FIG. 5E). The relationship between ON/OFF ratio and strain will be discussed later. Response speed is one of the most important characteristics of photodetectors, indicating the switching speed between the ON and OFF states. FIG. 5F to 5G present the curves of response time and reset time verses strain, respectively. Reset time is defined as the time required to decrease to 1/e (37%) of the maximum photocurrent, and consequently, response time is the time required to increase 63% from the dark current.

In FIG. 5F, the response time first increases rapidly from 30.3 s (at 0% strain) to 46.5 s (at 20% strain), and then increased slightly from 46.5 s to 51.7 s within 20% to 100% strain. The reset time kept an increasing trend from 0% to 100% strain.

Figure 6:
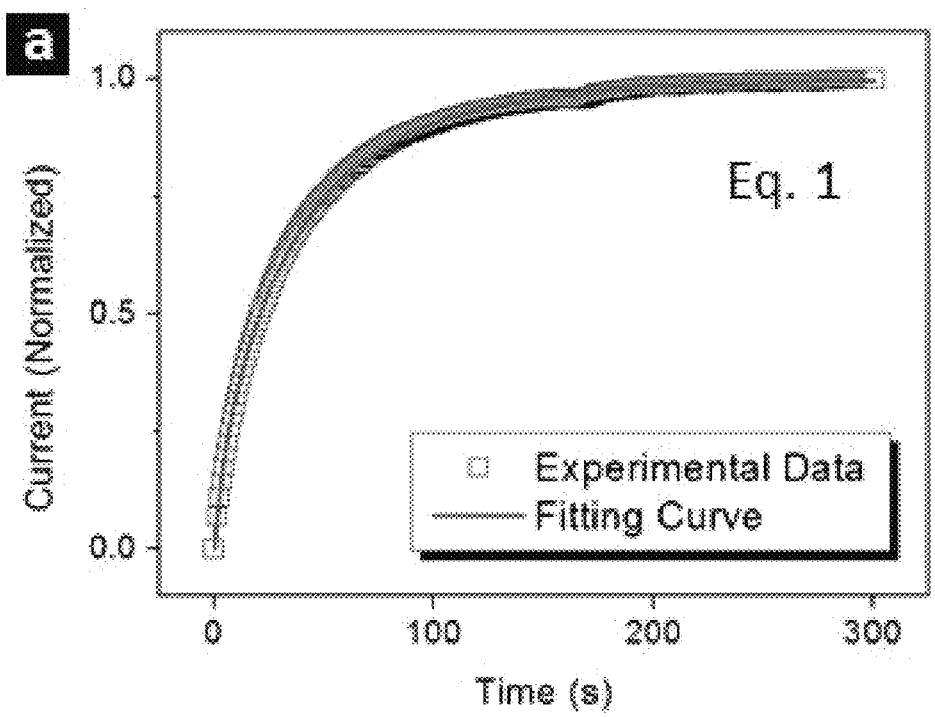
FIG. 6(A) is a graph showing fitting of the response curve (0% strain).
FIG. 6(B) is a graph showing fitted τ for the response processes at different strains.
FIG. 6(C) is a graph showing fitting of the reset curve (0% strain).
FIG. 6(D) is a graph showing fitted values of $A_2$ and $\tau_2$ for the reset processes at different stains.
FIG. 6(E) is a schematic of the nanowire-polymer chain interactions at relaxed state and stretched state. [For (A) and (C), Black Square: experimental data; Red Line: fitting curve]
Figure 6:
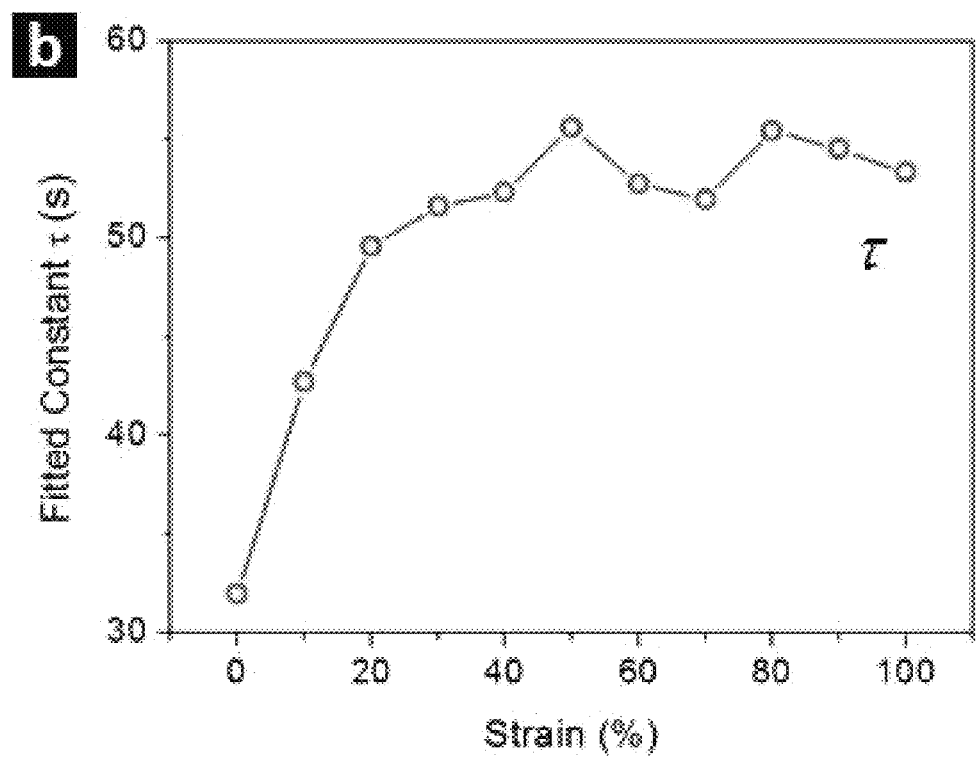
Figure 6:
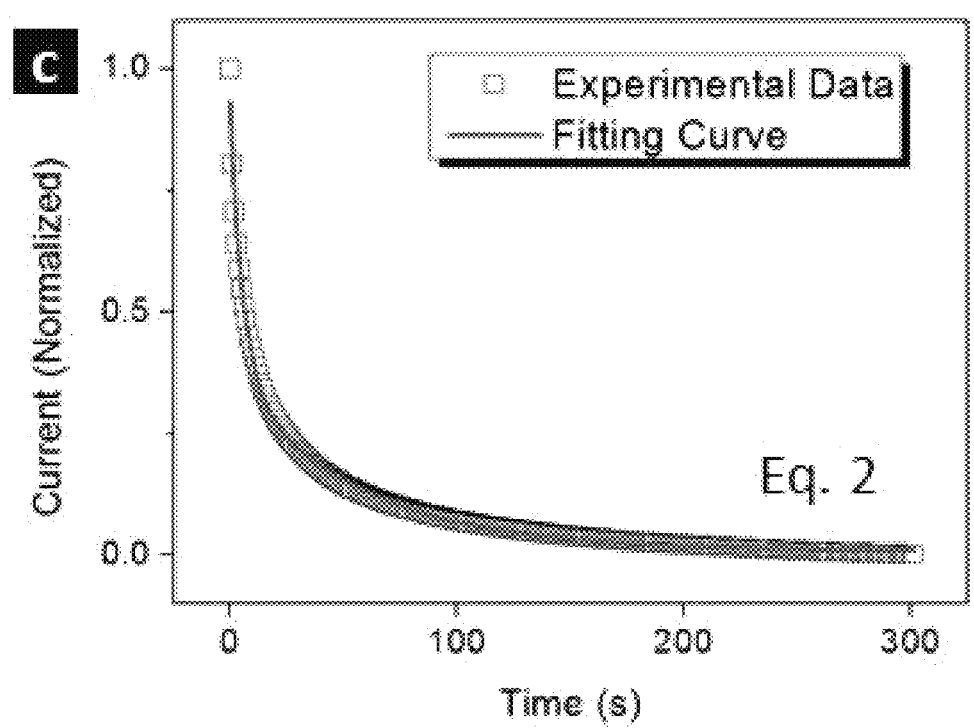
Figure 6:
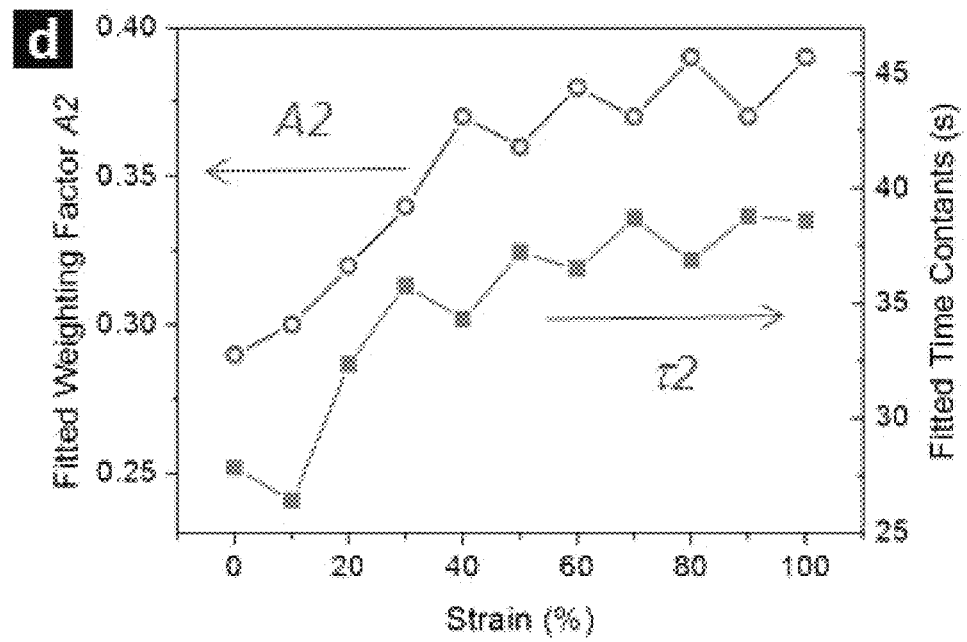
Figure 6:
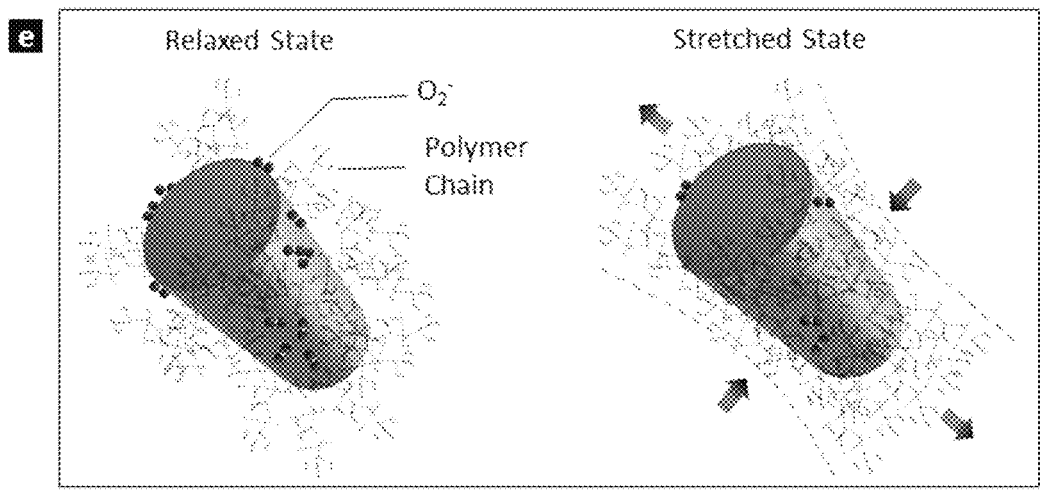
Figure 7:
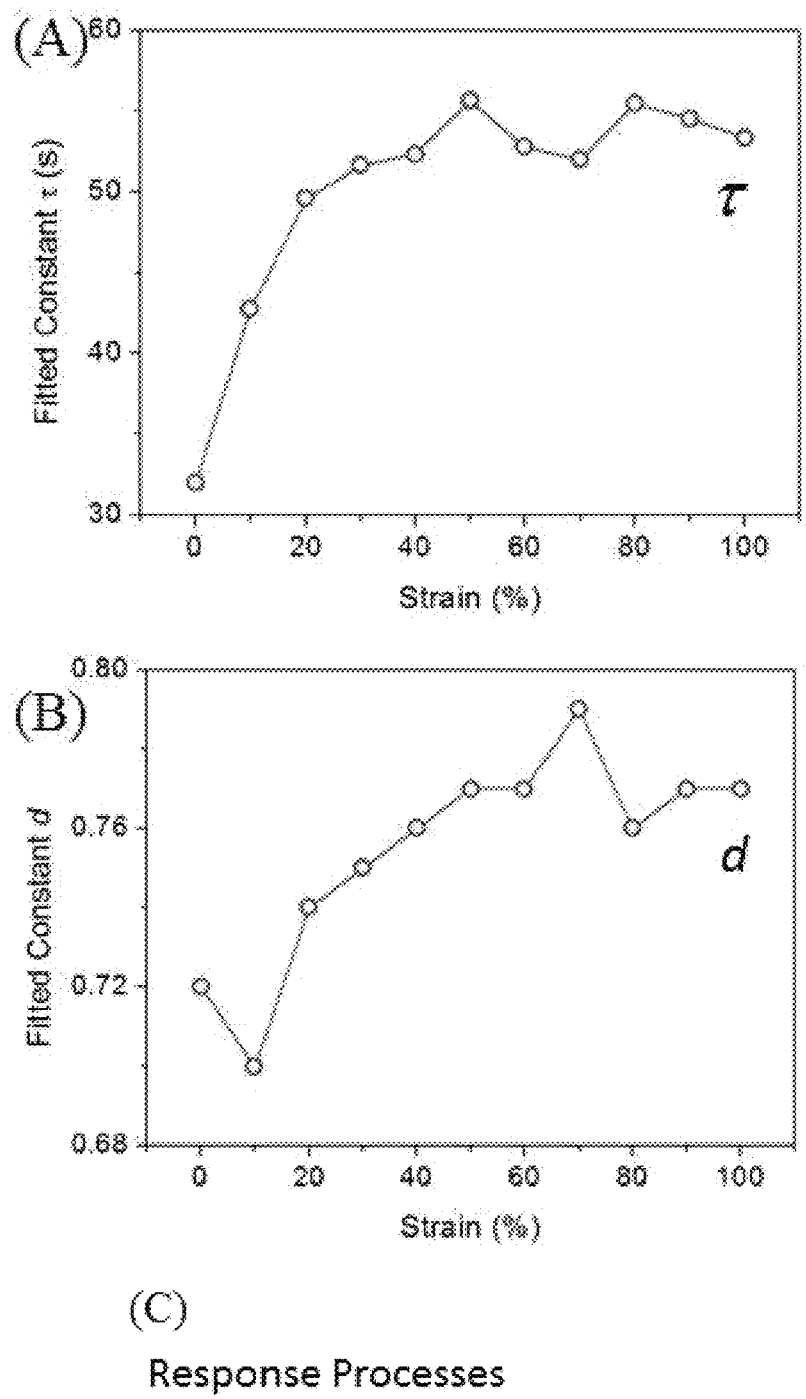
FIG. 7 shows fitted parameters for the response and reset processes within 0% to 100% strain. (A) Fitted time constant τ; (B) exponent d for the response processes; (C) response processes equation. (D) Fitted time constants $\tau_1$ and $\tau_2$; (E) corresponding weighing factors $A_1$ and $A_2$ for the reset processes; and (F) equation for the reset processes.
Figure 7:
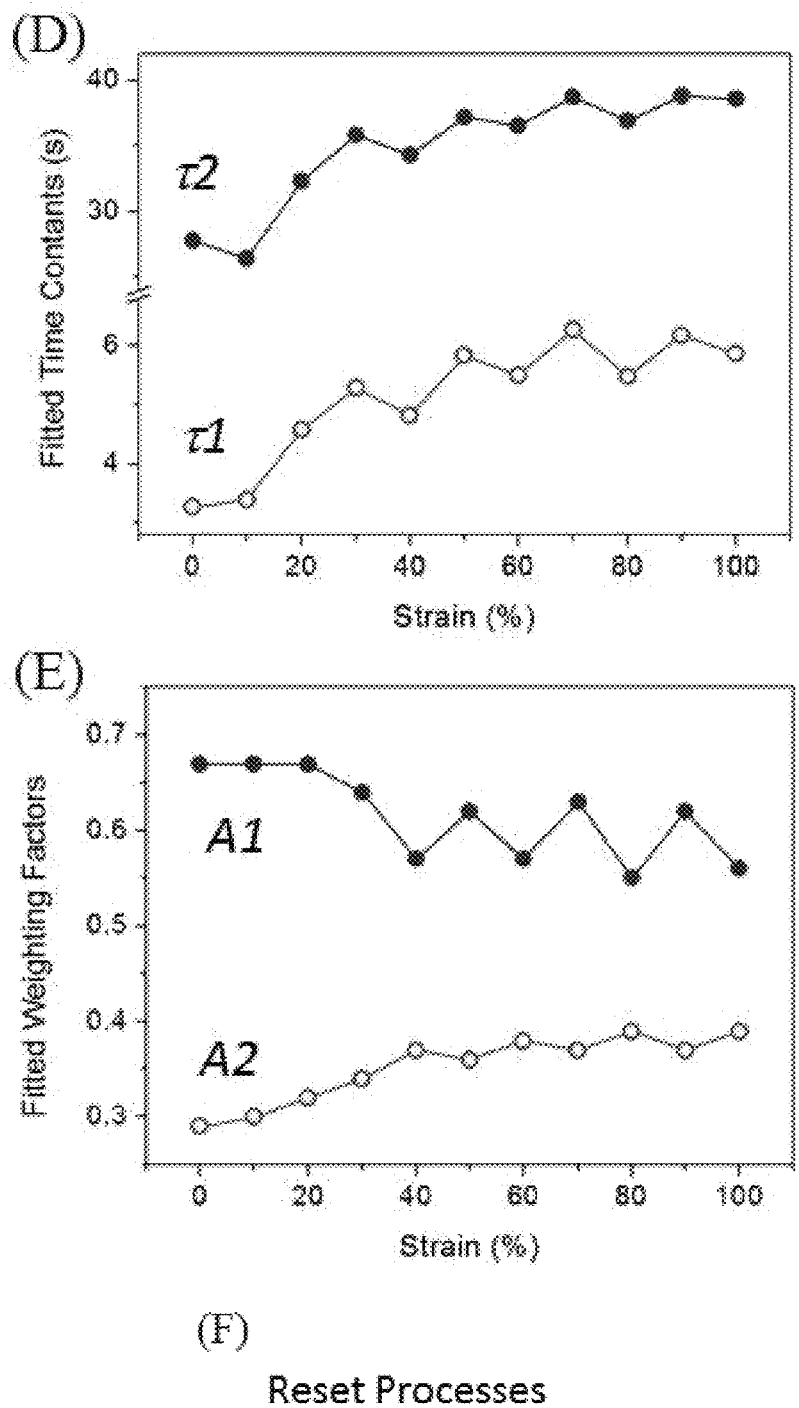

To provide further insights into the photoresponse mechanism, the response and reset processes are fitted with corresponding empirical equations (FIG. 6). The response process can be described by a stretched exponential function (Eq. 1)

$$I = I_s [1 - e^{-(t/\tau)^d}] \quad (1)$$

where $I_s$ is the saturation current, $\tau$ is the time constant, d is an exponent between 0 and 1 reflecting the response mechanism. FIG. 6A is a representative fitting curve (red line) for experimental data (black squares) at 0% strain. The experimental data fitted well with Eq. 1, with fitted time constant $\tau$ of 32 s and exponent d of 0.72. The fitted time constant $\tau$ for all response processes (0% to 100% strain, FIG. 6B) followed a similar trend of response time (FIG. 5F), which increases rapidly with strain first (0% to 20% strain) and then increased slightly within 20% to 100% strain. The plot of fitted exponent d can be found in FIG. 7. The reset processes can be fitted with a second-order exponential decay function (Eq. 2):

$$I = A_1 e^{-(t/\tau 1)} + A_2 e^{-(t/\tau 2)} \quad (2)$$

where $A_1$ and $A_2$ are weighing factors, and $\tau_1$ and $\tau_2$ are time constants. Usually it is assigned $\tau_1 < \tau_2$, so that $\tau_1$ represents the fast component (bulk process) and $\tau_2$ represents the slow component (surface process). FIG. 6C shows the fitting of experimental data (0% strain) with Eq. 2, with fitted $A_1$, $A_2$, $\tau_1$ and $\tau_2$ of 0.69, 0.28, 3.2 s and 27.9 s, respectively. Fitting results from all reset data showed that for the slow component, both the weighing factor ($A_2$) and time constant ($\tau_2$) increased with strain (FIG. 6D), with $A_2$ increased from 0.29 (at 0% strain) to 0.39 (at 100% strain) and $\tau_2$ increased from 27.8 s (at 0% strain) to 38.6 s (at 100% strain). The fitted time constants for the fast components ($\tau_1$) also increase and the corresponding weighing factor ($A_1$) decreases upon stretching (FIG. 7). The fitting results show that both the both the response and reset processes are getting slower when stretched.

The photoresponse behavior can be understood based on the photo-excitation process associated with oxygen adsorption and desorption. Oxygen in the ambient conditions would adsorb on the nanowire surface, capture free electrons from the nanowire volume via $O_2(g) + e^- \rightarrow O_2^-$ (ad) and create a surface depletion layer with low conductivity. New electron-hole pairs are generated upon illumination via $h\nu \rightarrow h^+ + e^-$. Holes will be attracted to the negatively charged surface to desorb oxygen via $O_2^-(ad) + h^+ \rightarrow O_2(g)$ and reduce the depletion layer. The increased electron density together with the reduced depletion layer contributes to the photocurrent increase upon illumination. When light is turned off, electrons and holes will quickly recombine and lead to significant carrier density decrease. Meanwhile, oxygen will re-adsorb onto the nanowire surface and restore the surface depletion layer.

The photoresponse mechanism for the embedded structures disclosed herein and their variation trend verses strain can be understood based on the elastomer-nanowire surface interactions. Unlike previous photodetectors with nanowires directly exposed in air, the ZnO nanowires in stretchable devices disclosed herein are fully embedded in PDMS matrix (FIG. 2F) and surrounded by cross-linked PDMS polymer chains (FIG. 6E).

Although PDMS is a gas permeable elastomer, the air solubility is only 15.4 vol % (25° C., 1 atm), which means that available oxygen in the nanowire surrounding environments is more than 6 times lower than that in air. Moreover, the diffusion coefficient of oxygen was reported as $5.2 \times 10^{-6}$ to $3.4 \times 10^{-5}$ cm$^2 \cdot$s$^{-1}$ in cross-linked PDMS, which is at least about 5,000 times slower than that in air ($1.76 \times 10^{-1}$ cm$^2 \cdot$s$^{-1}$).

The relationship between photoresponse speed and oxygen levels was systematically studied previously, which showed that both the response and reset processes became slower at reduced oxygen pressures. Meanwhile, unlike Schottky contact which usually dominates the device resistance and responses fast to incident light, photodetectors with Ohmic contact (such as stretchable photodetectors disclosed herein, FIG. 5C) usually have slower photoresponse speed. Thus, a relative slow switching speed is expected for stretchable photodetectors disclosed herein considering the more than 6 times lower oxygen content and greater than 5,000 times slower diffusion rate, and the response/reset times were found to be typically in the range of 5 to 60 s (FIG. 5).

Another crucial point is to understand the variations of photoresponse speed upon stretching. Oxygen molecules are adsorbed on part of the nanowire surfaces (due to the limited air solubility about 15 vol %) with the rest of the surfaces covered by cross-linked polymer chains (FIG. 6E). Upon stretching, the surrounding polymer chains are in more intimate contact with the nanowires to exert the force for deformation (FIG. 5B and FIG. 6E). No deformation forces will be applied if the polymer chains hold their original positions or move further away from the nanowires. A closer contact with polymer chains means a smaller contact area with air and hence a lower oxygen content, which in turn leads to slower switching speed at stretched states. Meanwhile, the compressed polymer chains upon stretching may further hinder the oxygen movements and thus reduce the oxygen diffusion coefficient. The reduced oxygen content surrounding the nanowires and lower diffusion coefficient may result in a retarded photoresponse speed at stretched states. This is consistent with the inventors' findings: The increased response time (FIG. 5F) and fitted time constant (FIG. 6B) corresponds to slower response processes, due to the longer time it takes to reach adsorption-desorption balance with lower oxygen level and slower diffusion rates at stretched states. The larger reset time at higher strain (FIG. 5G) is because of the slower oxygen diffusion and re-adsorption processes to restore the surface depletion layer. Especially, the fitting results for the slow components (surface-related) do show that the time constant $\tau_2$ became larger upon stretching, and the slow components also increasingly become more dominate ($A_2$) at higher strains. Fitting results for other parameters and related explanations can be found in FIG. 7.

Referring to FIG. 7, the switching speeds of the photodetectors depend on oxygen concentrations. The higher the oxygen content, the faster the response and reset processes. At stretched states, the polymer chains are in more intimate contact with the nanowires and lead to smaller contact areas with oxygen. The compressed polymer chains will also hinder the oxygen movements and reduce the diffusion coefficients. Both the lower oxygen contents and reduced diffusion rates contribute to the slower response and reset processes, as have been observed in studies carried out.

In FIG. 7A, the increased time constant $\tau$ corresponds to slower response processes, due to the longer time it takes to reach adsorption-desorption balance with lower oxygen level and slower diffusion rates at stretched states. In FIG. 7B, the variations of exponent d are resulting from the fitting process. The current is normalized to [0,1] with a fixed response period of 300 s. Based on Eq. 1 mentioned above, if the point at 300 s was considered, a larger time constant $\tau$ means a larger exponent d to reach the maximum current 1 (normalized value).

In FIG. 7D, the time constants for both fast ($\tau_1$) and slow ($\tau_2$) components increase upon stretching. The slow component ($\tau_2$) is surface-related process, which became slower because of the retarded oxygen diffusion and re-adsorption processes to restore the surface depletion layer. Similarly, the retarded adsorption-desorption balance at the nanowire surface also elongated the time that holes are attracted to and held at the surficial region, serving like hole traps. The electron-hole recombination processes thus is slowed down due to the hole traps. The increased weighing factors for the slow component ($A_2$) and hence reduced fraction for the fast component ($A_1$) indicate that the slow components take more dominate roles at stretched states.

The stretchable photodetectors with fully embedded structures possess excellent cycling and mechanical stabilities against such as repeated stretching, adhesion or rubbing forces on the surface. The cyclic stretching and scorch tape testing results are shown in FIG. 8.

Figure 8:
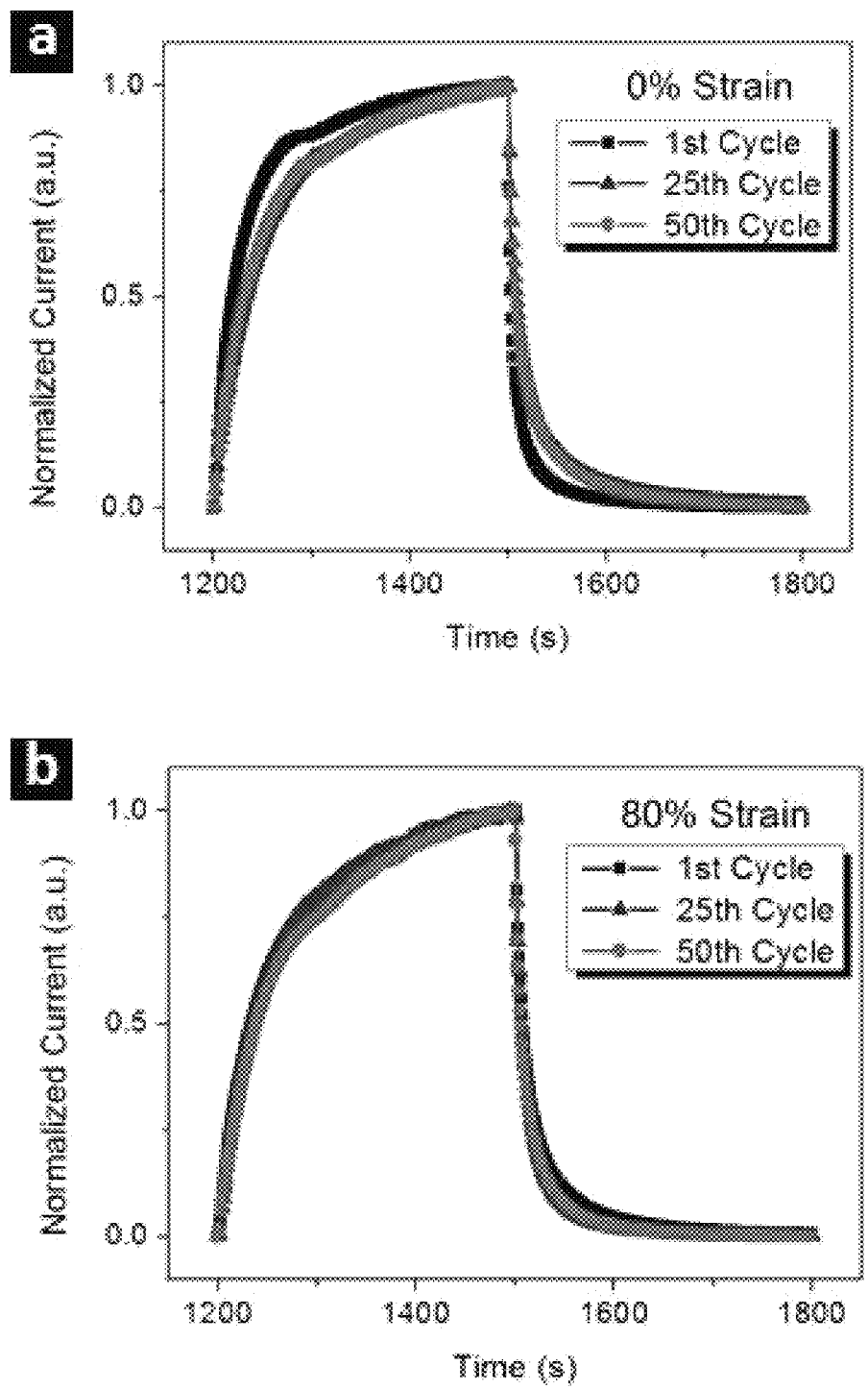
FIG. 8 shows cycling stability of the photodetectors at (A) 0% strain and (B) 80% strain up to 50 cycles. (C) Scotch tape testing of the photodetector array and (D) corresponding response curves before and after testing (0% strain).
Figure 8:
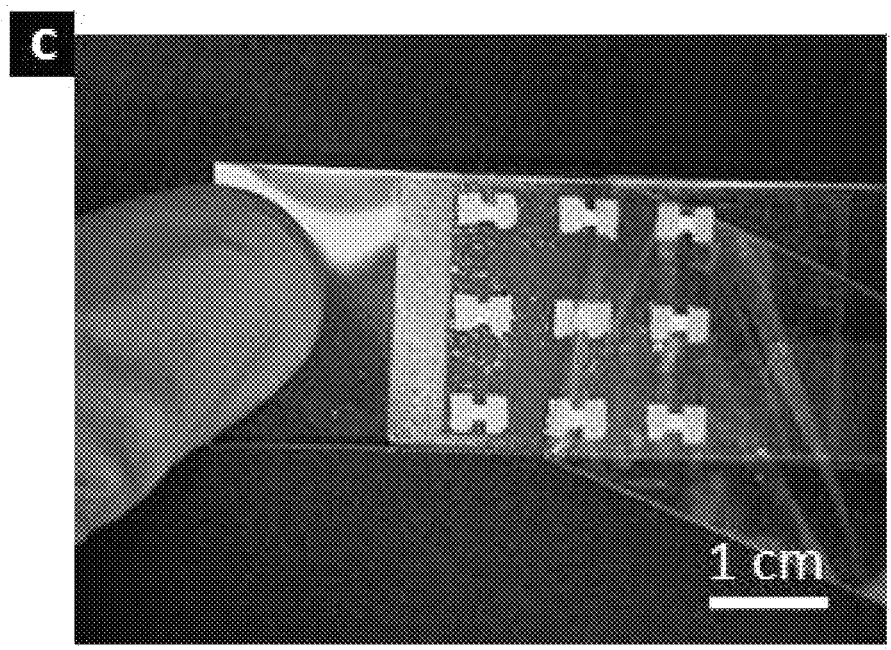
Figure 8:
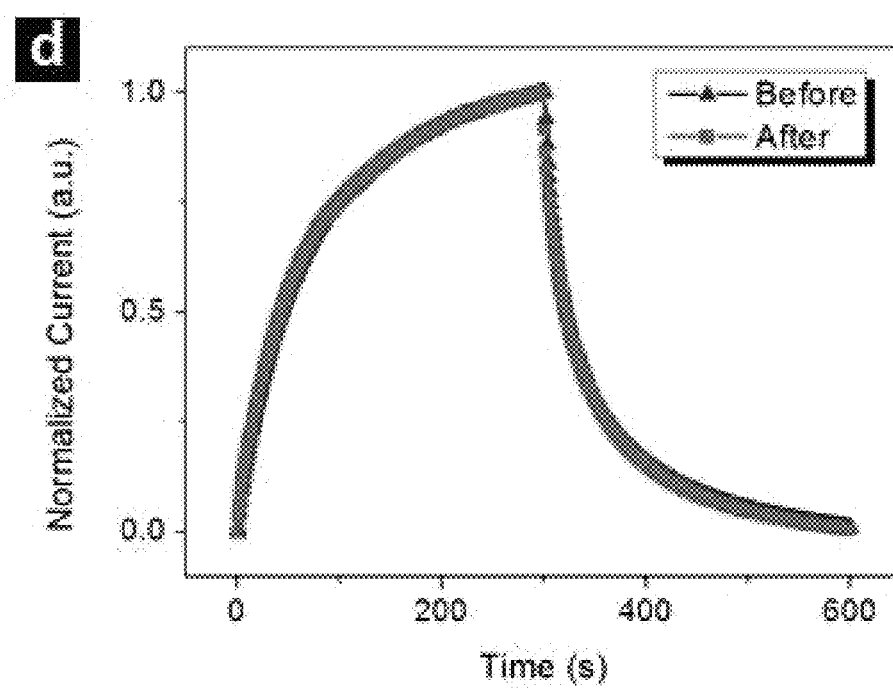

The devices were repeatedly stretched to 80% strain for 1, 25 and 50 cycles, and their corresponding response behaviors were recorded (FIG. 8). The maximum cycling strain was set as 80% to ensure that the device can survive the repeated stretching cycles. The first cycle for 0% strain means that the device is freshly made without any stretching (FIG. 8A, black curve), so the response curve deviates a little from those after stretching due to the irreversible nanowire sliding and arrangements after stretching. However, the rest of response curves remain nearly unchanged for both 0% and 80% strain after 50 cycles, indicating excellent stability against repeated stretching. When the nanowires are put on the surface of the solid PDMS substrate, they delaminate and peel off after 2 to 3 stretching cycles due to poor adhesion with the substrate.

Another advantage of the fully embedded device structure disclosed herein is that it is mechanically stable against external influences, such as mechanical scratching or adhesive forces. A piece of scotch tape (Nikko Stationery Tape) is firmly pressed onto the device surface (FIG. 8C) and then peeled off. No obvious changes of the device performances were observed before and after the scotch tape testing (FIG. 8D). Unlike those stretchable devices with all components (usually buckled nanostructures) on top of the substrate which are prone to mechanical damage, the fully embedded device structure with all components protected inside the rubber matrix disclosed herein showed significantly improved mechanical stability.

Figure 9:
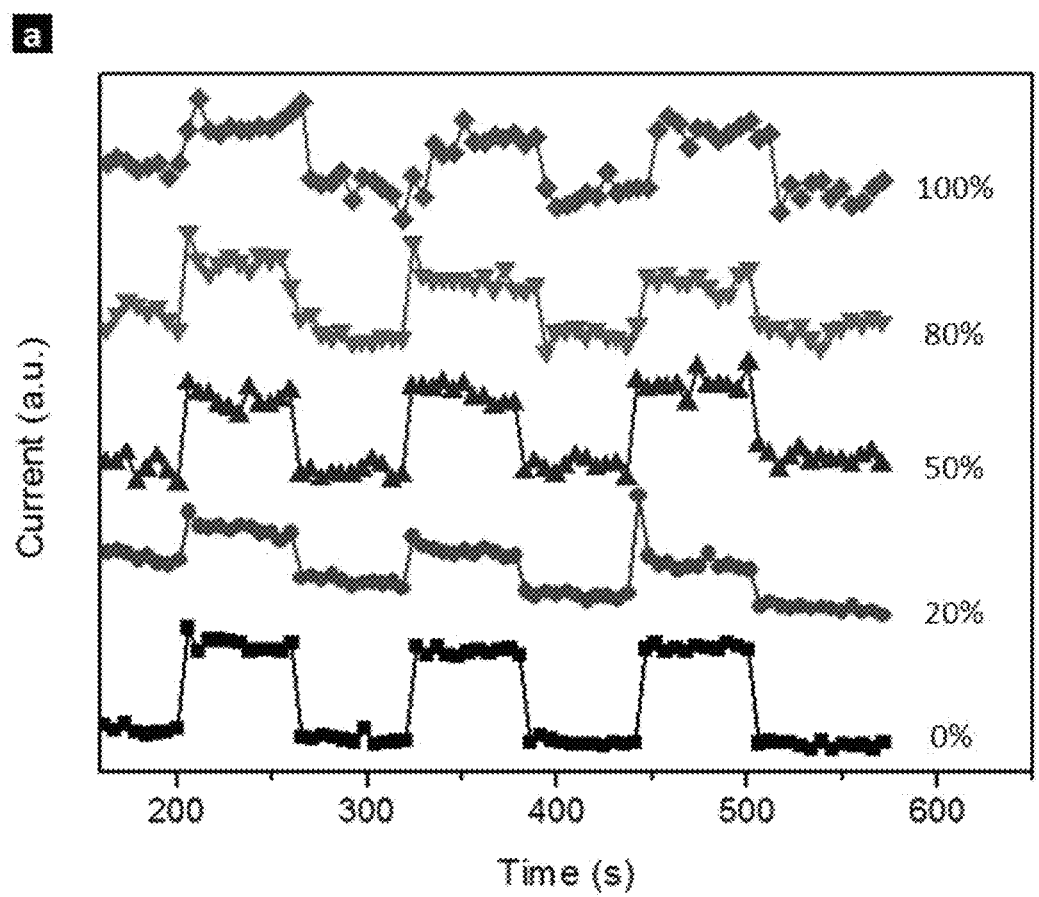
FIG. 9 depicts graphs showing stretchable photodetectors based on (A) zinc germanate (ZGO) and (B) indium (III) oxide ($In_2O_3$) nanowires.
Figure 9:
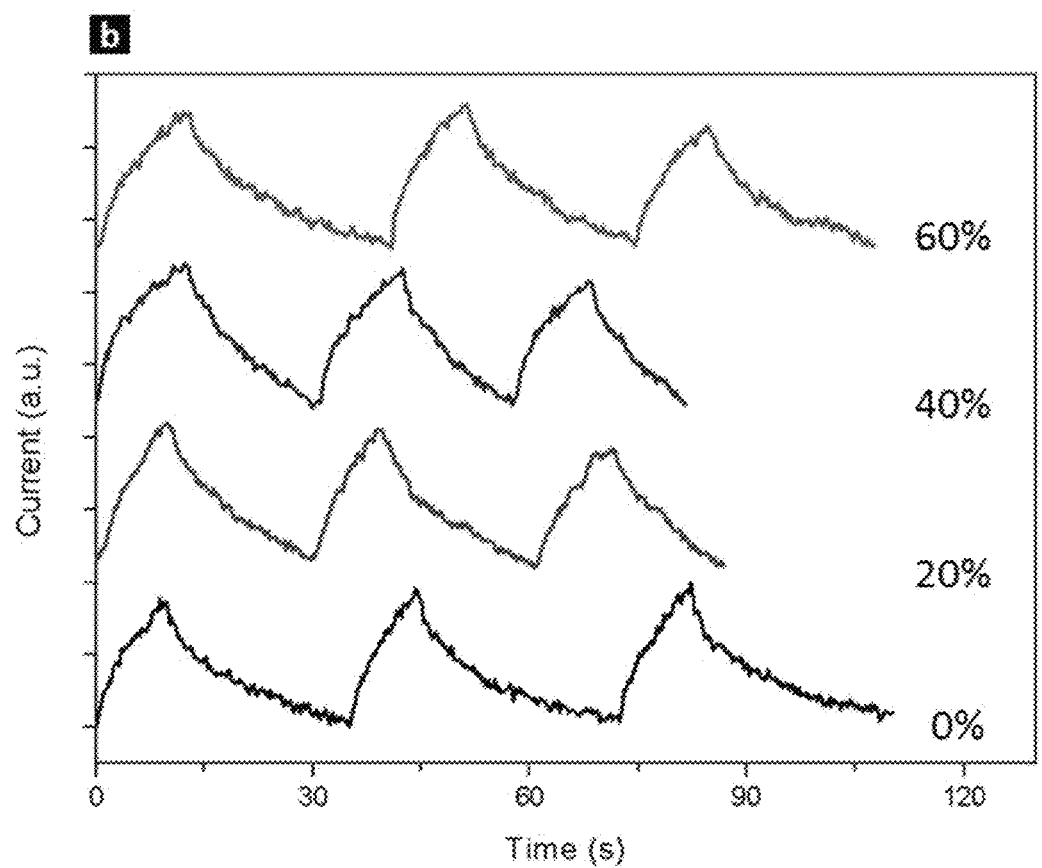

The fabrication method disclosed herein is quite versatile and may be readily applied to other nanowire materials. All nanowires that may be used for photodetection may be incorporated into a stretchable photodetector structure disclosed herein. Typical examples of the stretchable nanowire photodetectors based on ZGO and $In_2O_3$ nanowires are shown in FIG. 9. The devices maintained their functionality when stretched to a high strain, such as 100% for ZGO nanowires and 60% for $In_2O_3$ nanowires. The device performances vary with nanowire materials. For example, fast response behaviors were observed for ZGO devices and slow response speed were observed for $In_2O_3$ nanowires, probably due to the metal-semiconductor contacting barriers. As disclosed herein, feasibility of a flexible photodetector has been demonstrated in the form of prototypes. Further work is in progress to further improve photodetector performances, such as sensitivity, ON/OFF ratio, and response speed.

Briefly, processes to fabricate stretchable photodetectors based on fully embedded nanowire networks for both stretchable electrodes and detection channel have been demonstrated. Both the electrodes and detection channels are intrinsically stretchable. A fully embedded structure was employed to achieve excellent stretchability and mechanical stability. The devices were able to maintain their functionality even when stretched up to 100% strain. Detailed analyses showed that when stretched, the ON/OFF ratio decreased and both the response and reset processes became slower, which can be understood based on the nanowire-polymer chain interactions. The stretchable photodetectors also showed excellent cycling and mechanical stabilities, with no obvious performance degradation after 50 repeated stretching cycles and scotch tape tests. The fabrication method and device structure disclosed herein are versatile and may be readily extended to a wide range of nanowires which may be used for photodetectors. The photodetectors may find important applications in future stretchable, wearable and implantable electronics.

Example 5: Potential Commercial Applications

The stretchable form of existing rigid electronics is promising for next-generation wearable devices. Their potential applications may include but are not restricted to: biomedical device, implantable electronics, wearable electronics, clean energy, smart clothes, and sensory skin for robotic system.

The applications targeted are primarily in healthcare, using novel stretchable electronics that conform to skin, arteries, and organs. For example, the technology may lead to products, such as skin patches that monitor whether the wearer is sufficiently hydrated, or inflatable balloon catheters equipped with sensors that measure electrical misfiring caused by cardiac arrhythmias. Stretchable electronics may also be used to map heart action and provide therapy, to drive defibrillator and pacemaker implants, to monitor shoe insoles of those with diabetes, to monitor vital signs with smart textiles, to monitor renal function, brain seizures and breathing frequency of babies, to name only a few. In particular, stretchable epidermal electronics can act as non-invasive sensors to analyze sweat and other skin functions with telemetry.

Apart from healthcare, stretchable electronics also have broad applications in other areas, such as wearable electronics, sport and leisure, and automotive electronics. For example, smart clothes utilizing stretchable electrics may harvest human movements and convert the energy to electricity to power consumer electronics. This requires the energy harvester to be flexible and stretchable, which can be deformed during movement for energy conversion. Light emitting textiles are useful as indicator lights for cyclists or decoration lights for dresses in fashion show. Electronic eyeball camera may possibly revolutionize existing image taking methods using digital cameras. The implanted eyeball camera using stretchable photodetectors may potentially be of critical importance for military applications. Additionally, haptic actuators in the form of implanted electronics or epidermal electronics may be used to control the consumer electronics, such as the IPhone or the IPod. Stretchable electronics are expected to bring broad impact for a wide range of existing electronic industries, including sensors, battery, electrochromic devices, OLED/LED light and display, logic/memory, conductors, photovoltaics, etc. They are also promising to open up brand new applications which are unreachable with existing rigid technologies.

As one of the main expected applications of stretchable electronics, the global home healthcare market is estimated to be worth USD 195.6 billion in 2012 and is expected to reach the value of USD 305.9 billion by 2018, growing at a CAGR of 7.7% from 2012 to 2018. The market of printed electronics, which is the most probable method for scalable production of stretchable electronics, is over USD 10 million in 2012. More importantly, note that the unprecedented soft electronics may lead to rapid expansion of current markets, or create new applications beyond existing markets.

However, it would be of interest to make those photodetectors stretchable for new applications. For example, stretchable photodetectors could be implanted on human eyes so that one can take digital images by simply blinking his eyes. Those implantable photodetectors can also help blind men to regain their visual senses. Compared with existing photodetectors integrated on a planar circuit board, the soft and stretchable devices can deform to comply to such as the hemispherical lens of human eye and enable new functionalities such as wider field of view and lower aberrations.

Example 6: Fabrication of Silver-Zinc Battery

Batteries are the dominant power sources for portable electronics. Ag—Zn batteries have important potential applications due to its high energy density, high specific power and intrinsic safety as compared with Li-ion batteries. They are regaining interests for implantable electronics where the safety concern overweighing that of production costs. Stretchable Ag—Zn battery electrodes are developed herein based on embedded Ag nanowire electrodes in elastomer matrix.

Silver-zinc battery is one of the most mature battery systems, and holds promise as high-performance, safe and green solutions to power stretchable devices. It has been widely used in small scale applications, such as coin cells for watches and in large scale applications for military and aerospace applications. Silver-zinc batteries have comparable specific energy to current market leader Li-ion batteries but can deliver much higher specific power. More importantly, silver-zinc batteries are inherently safe due to usage of water-based electrolyte and are free from flammability problems that have plagued Li-ion batteries. They are also environmentally benign with usage of non-toxic elements. Restricted application of silver-zinc battery in common consumer electronics, such as laptops and cellphones, is mainly due to the relatively high cost of silver. However, they are regaining interest with the increasing concern of safety and environmental impact. For example, safety issue would become an overweighing consideration than costs when the batteries are used for wearable and implantable electronics. Moreover, they are promising candidates for applications in printed batteries for easy, low cost integration into future two-dimensional (2D) and three-dimensional (3D) printing processes for stretchable electronics, due to their air stability, a key advantage over Li-ion battery for printable device applications.

Example 6.1: Fabrication

Strategies, fabrication methods and testing results disclosed herein were extended to stretchable Ag—Zn batteries.

Fabrication of silver-zinc battery based on stretchable Ag nanowire (NW) electrodes with embedded structures is presented herein. The AgNW electrodes were fabricated via a lithographic filtration method and possess ideal bi-functionality by simultaneously providing electroactive components and electron conducting paths. The high performance electrodes maintained their functions even when stretched up to 80% and are stable over 1000 cycles.

Figure 12:
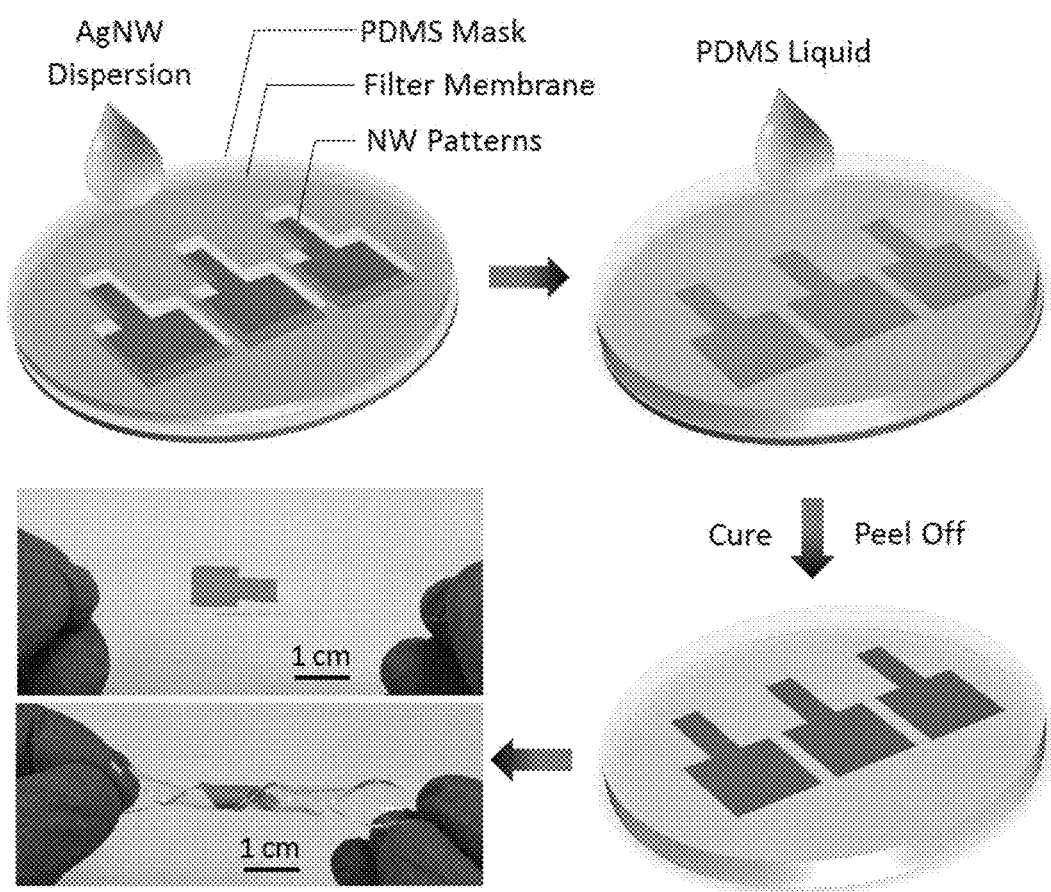
FIG. 12 is a schematic diagram illustrating the lithographic filtration method to fabricate stretchable silver nanowires (AgNW) electrodes with embedded structures, and examples of the soft, stretchable electrodes.

Schematic illustrations of the lithographic filtration method for stretchable AgNW electrode fabrication are shown in FIG. 12, which depicts typical examples of the filtration masks used for filtration and fabrication of patterned stretchable AgNW electrodes.

The PDMS mask is prepared from cured PDMS membrane (thickness about 1 mm). The PDMS base and curer were mixed (weight ratio 10:1), degased in a vacuum desiccator for 30 min to remove bubbles, cured at 60° C. for 2 h and then cut with graver to obtain the desired patterns. The soft mask was put on top of a PC filter membrane (Millipore GTTP, pore size 220 nm) for filtration. Commercially available AgNWs dispersed in ethanol (1 mg mL$^{-1}$) were used as received. The lengths of the AgNWs are 20 μm to 100 μm and diameters are within 40 nm to 200 nm. The AgNW dispersions were filtered and uniform NW patterns were obtained. The NW patterns were thoroughly rinsed with deionized (DI) water and clean ethanol to remove surfactants associated with NW synthesis processes. Liquid PDMS was poured on top of the filter membrane with NW patterns and then cured using the same procedure for mask fabrication. The solid PDMS membrane was peeled off from the PC membrane after curing and the NW patterns were successfully transferred to the PDMS elastomer matrix. The electrodes were used for testing without further treatments.

Morphologies of the electrodes were characterized using field-emission scanning electron microscopy (FE-SEM, JSM 7600F). The electrode was fixed on a customized optical stage to measure the resistance change upon stretching using Keithley source meter (Model: 2400). The electrode was then transferred to a home-built Teflon stage to apply desired strains for battery performance testing. Electrochemical properties of the electrodes were measured using 2-electrode system, with a Zn plate (purity greater than 99.9%) as counter and reference electrode and 10 M aqueous NaOH as electrolyte. Commercial red LED light (3.2 V, 20 mA, 64 mW) was used for application demonstration.

Figure 10:
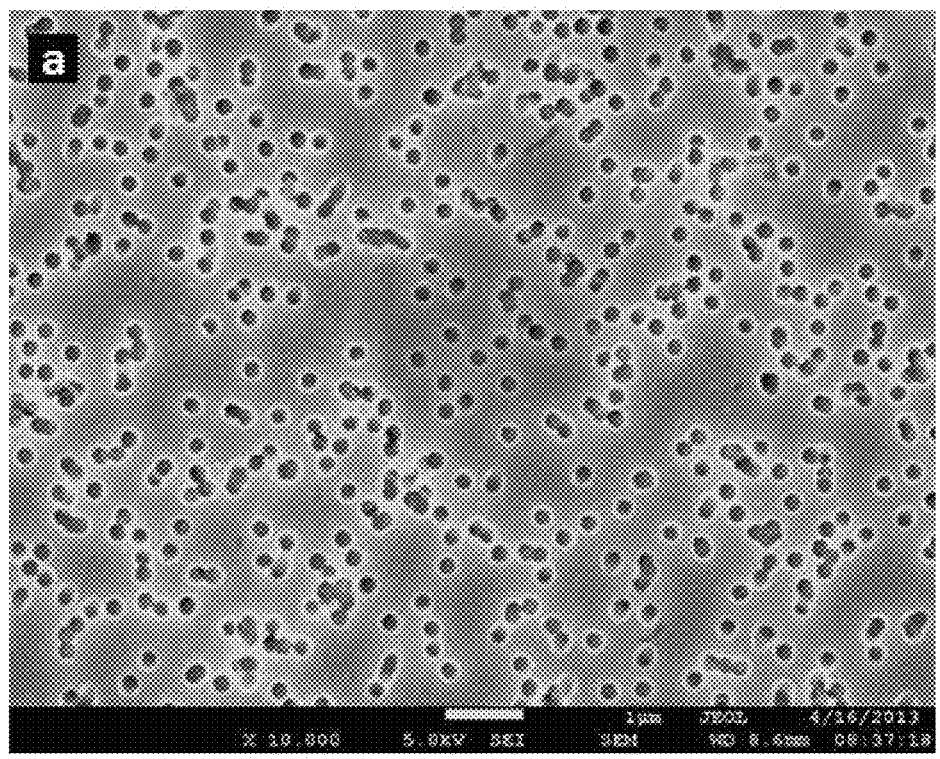
FIG. 10 are SEM images of polycarbonate (PC) filter membrane (Milipore, Model GTTP, pore size 220 nm). Scale bar in (A) represents 1 μm. Scale bar in (B) represents 100 nm.
Figure 10:
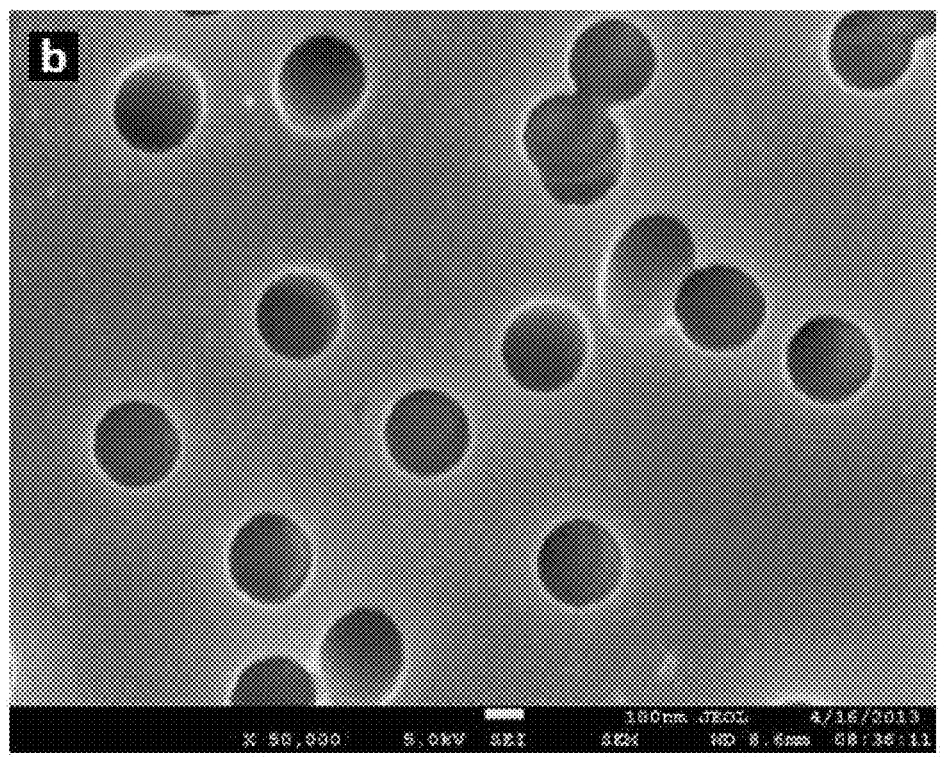
Figure 11:
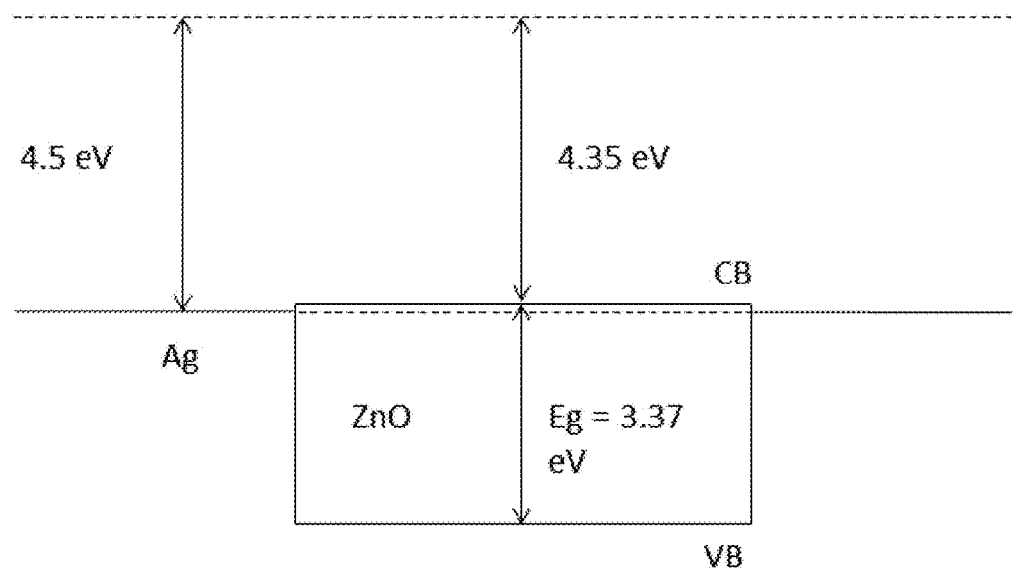
FIG. 11 is a schematic diagram showing energy band alignments of Ag electrodes and ZnO channel. The conduction barrier is only 0.15 eV, which results in good Ohmic conductance of the photodetectors.

Patterned filtration mask was prepared from cured polydimethylsiloxane (PDMS) substrate (thickness about 1 mm), and they are used to selectively expose certain areas and obtain nanowire films with desired patterns, analogous to the role of ultraviolet (UV) masks used in photolithography. AgNW dispersion (1 mg mL$^{-1}$ in ethanol) was filtered and the NW films were very uniform due to the simultaneous extraction of solvents from the evenly distributed holes in the track-etched polycarbonate (PC) membrane (FIG. 10). Thicknesses and hence resistances of the electrodes can be controlled by the volume of NW dispersion added.

Figure 13:
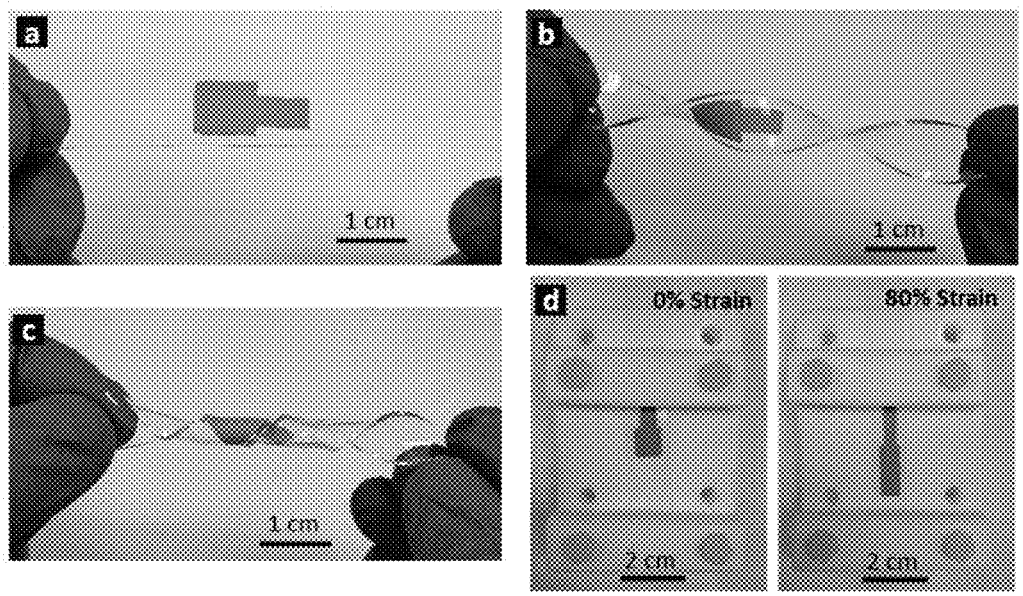
FIG. 13(A) to (C) are example images of the soft, stretchable Ag nanowire (AgNW) electrodes embedded in polydimethylsiloxane (PDMS) elastomer matrix.
FIG. 13(D) depicts fixing of the electrode on a home-built Teflon stage (with Nylon screws) to apply the desired strain.

Note that the soft PDMS mask was in intimate contact with the PC membrane due to the vacuum suction force and the sticky surface of PDMS, which is important to prevent liquid spreading and make well-defined patterns. Liquid PDMS was poured on top of the PC filter membrane with NW patterns and cured before peeled off. AgNW patterns were successfully transferred into the PDMS matrix and stretchable electrodes with embedded structures were obtained. Examples of the soft, stretchable AgNW electrodes are shown in FIG. 12 (see also FIG. 13).

Example 6.2: Structural Characterization

Figure 14:
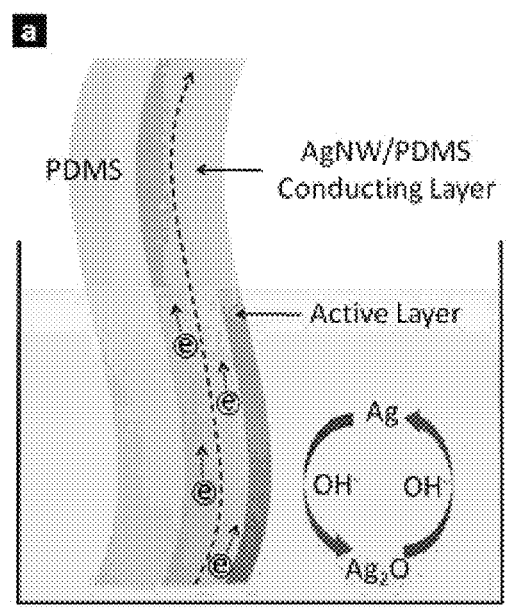
FIG. 14(A) is a schematic diagram of the bi-functional stretchable AgNW electrode with embedded structure. (B) Top view, and (C) cross-sectional view of the AgNWs embedded in PDMS matrix. Scale bar in (B) and (C) respectively represents 1 μm and 50 μm. Inset in (C) is an enlarged cross-sectional view showing the exposed NW tips. Scale bar: 2 μm. (D) Stretching the electrode to 80% strain. Scale bar in (D) represents 1 cm. (E) Resistance change upon stretching to 100%.
Figure 14:
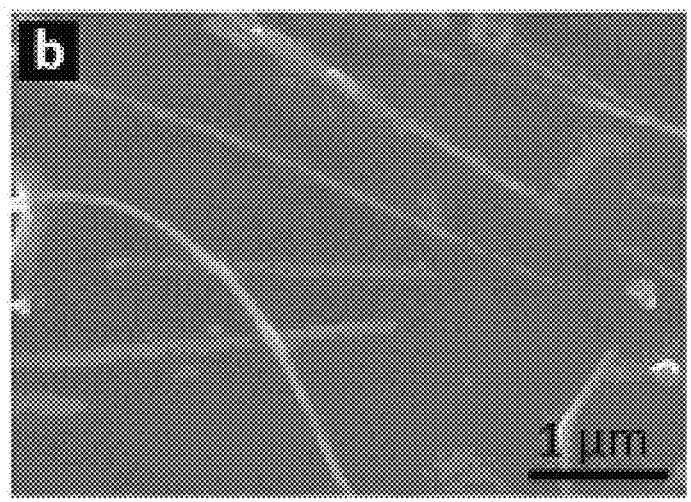
Figure 14:
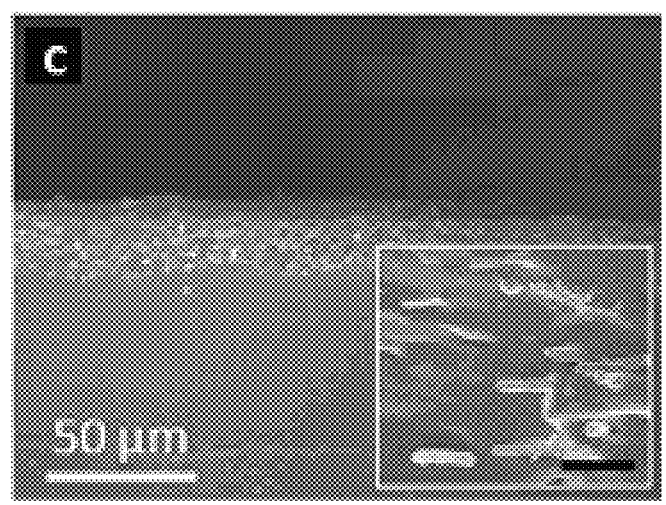
Figure 14:
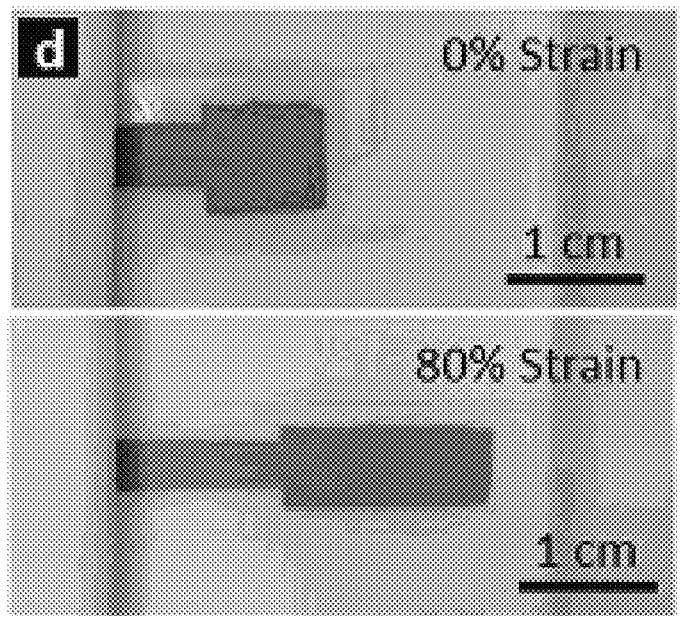
Figure 14:
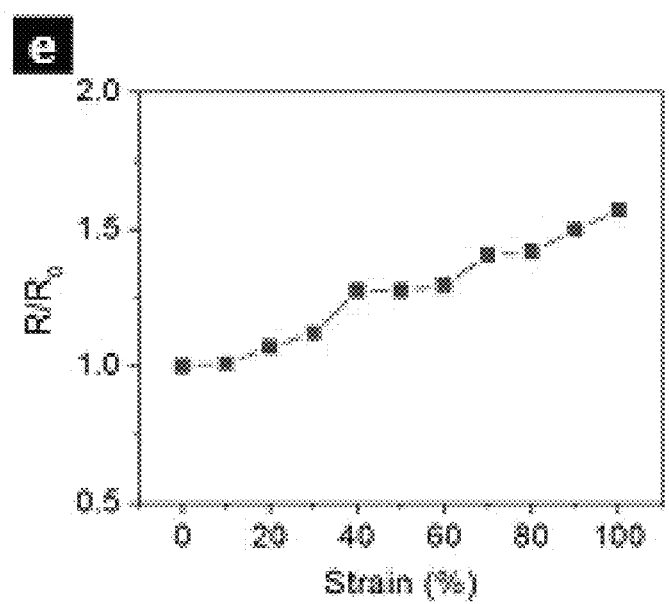
Figure 15:
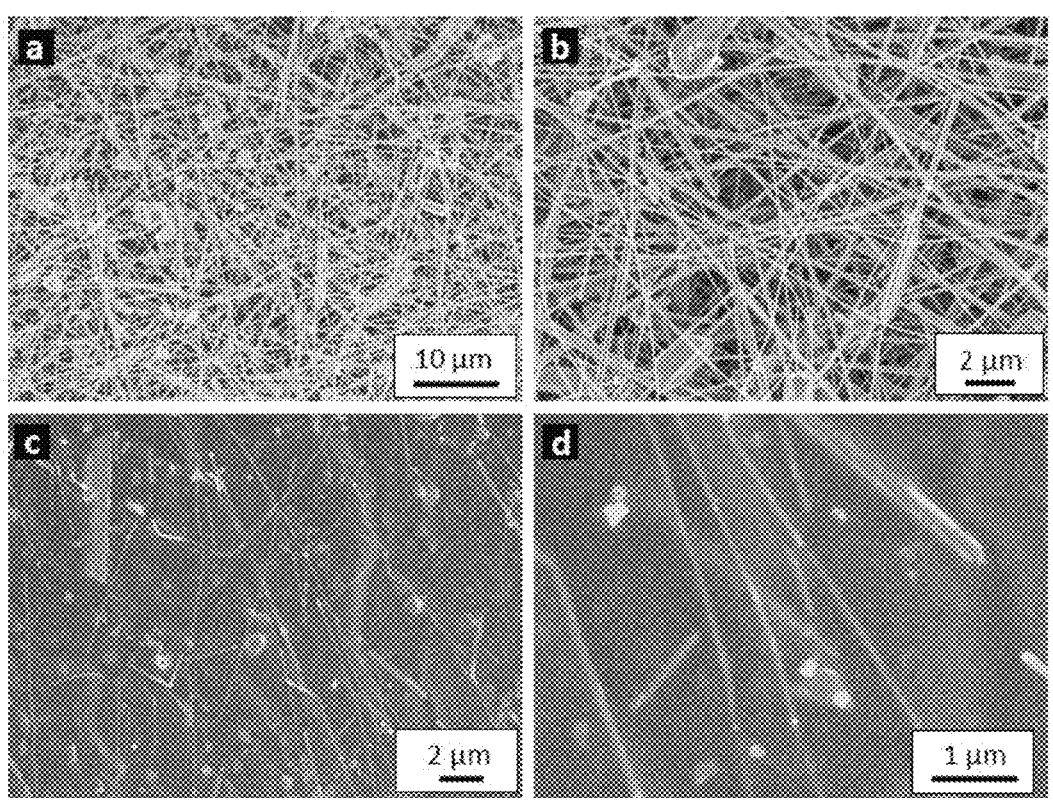
FIGS. 15(A) and (B) are SEM images of the AgNW film on PC filter membrane after filtration. Scale bars in (A) and (B) respectively represents 10 μm and 2 μm.
FIGS. 15(C) and (D) are top-view SEM image of the AgNWs embedded in PDMS elastomer matrix. Scale bar in (C) and (D) respectively represents 2 μm and 1 μm.

Schematic illustration and structural characterizations of the stretchable electrode are shown in FIG. 14. The AgNWs embedded in PDMS elastomer matrix exhibit ideal bi-functionalities for battery applications by simultaneously providing electroactive layer and electron conducting layer. Since PDMS is not permeable to aqueous electrolyte, only the surficial AgNW layer in contact with electrolyte (active layer) contributes to energy storage. Those AgNWs beneath the active layer and those not immersed in the electrolyte serve as conducting layer to extract the electrons to external circuits. Scanning electron microscopy (SEM) characterizations of the AgNWs used can be found in FIG. 15.

FIG. 14(B) is a top view of the AgNW/PDMS layer showing that the AgNWs are embedded in the elastomer matrix with part of the NW surfaces exposed for electrochemical reactions. Cross-sectional view of the stretchable electrode is shown in FIG. 14(C). Inset in FIG. 14(C) is an enlarged view of the cross-section showing the exposed NW tips from the PDMS matrix. The electrodes showed excellent stretchability up to 100% without cracking or delaminating. Typical images of the electrode at 0% and 80% strain are shown in FIG. 14(D). To ensure that the electrode can sustain the strain, the maximum strain is set as 80% during later studies although the stretching limit is about 100%. The plot of resistance variations upon stretching is shown in FIG. 14(E). The electrode resistance gradually increased from 9.8Ω (at 0% strain) to 15.4Ω (at 100% strain) with an increase of 57%. It is evident that the electrodes remain highly conductive even at 100% strain, ensuring their robust function at stretched states. The slight resistance increase is due to the irreversible NW sliding and rearrangements within the elastomer matrix upon stretching.

Example 6.3: Battery Testing

Figure 16:
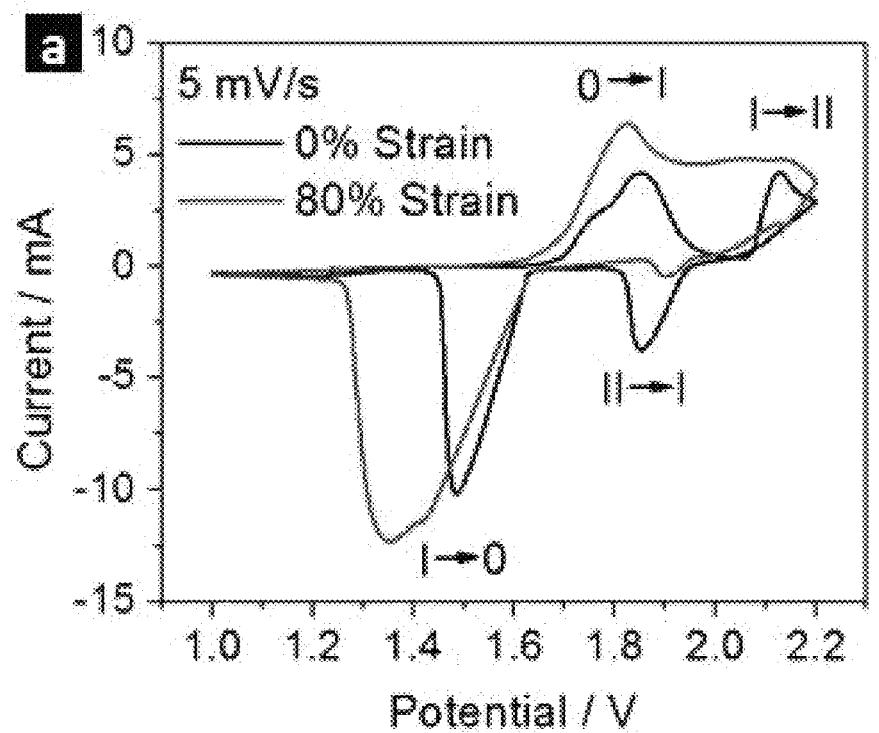
FIG. 16 depicts graphs showing electrochemical performances of the stretchable AgNW electrodes, where (A) CV curves at 0% and 80% strain (scan rate 5 mV s$^{-1}$); (B) Charge/discharge curves at 0% and 80% strain (current density 1 mA cm$^{-2}$); effect of (C) charge/discharge current density; and (D) strain on electrode capacity.
Figure 16:
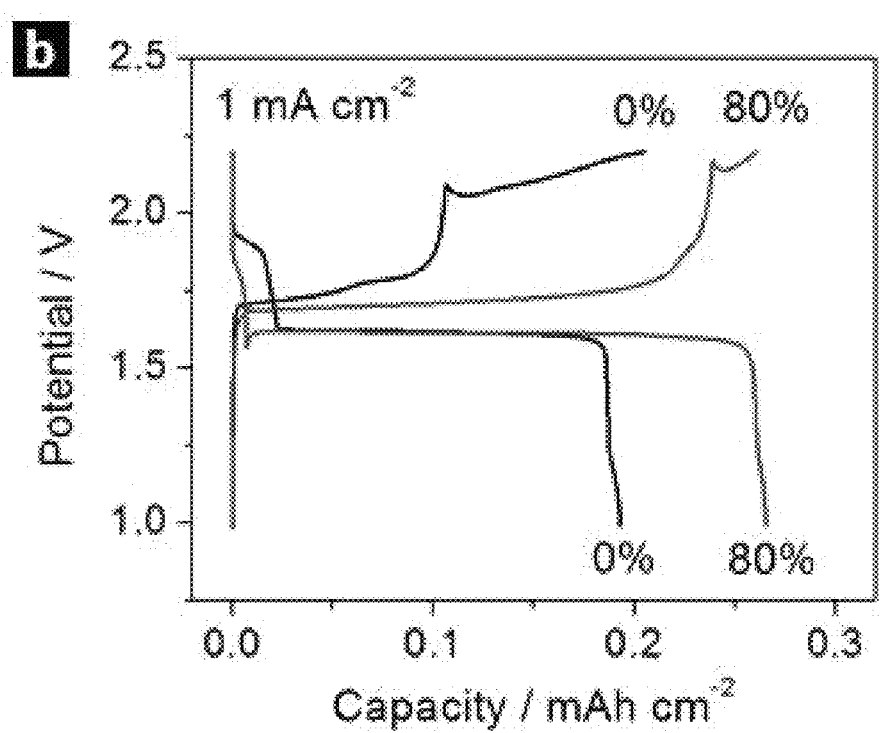
Figure 16:
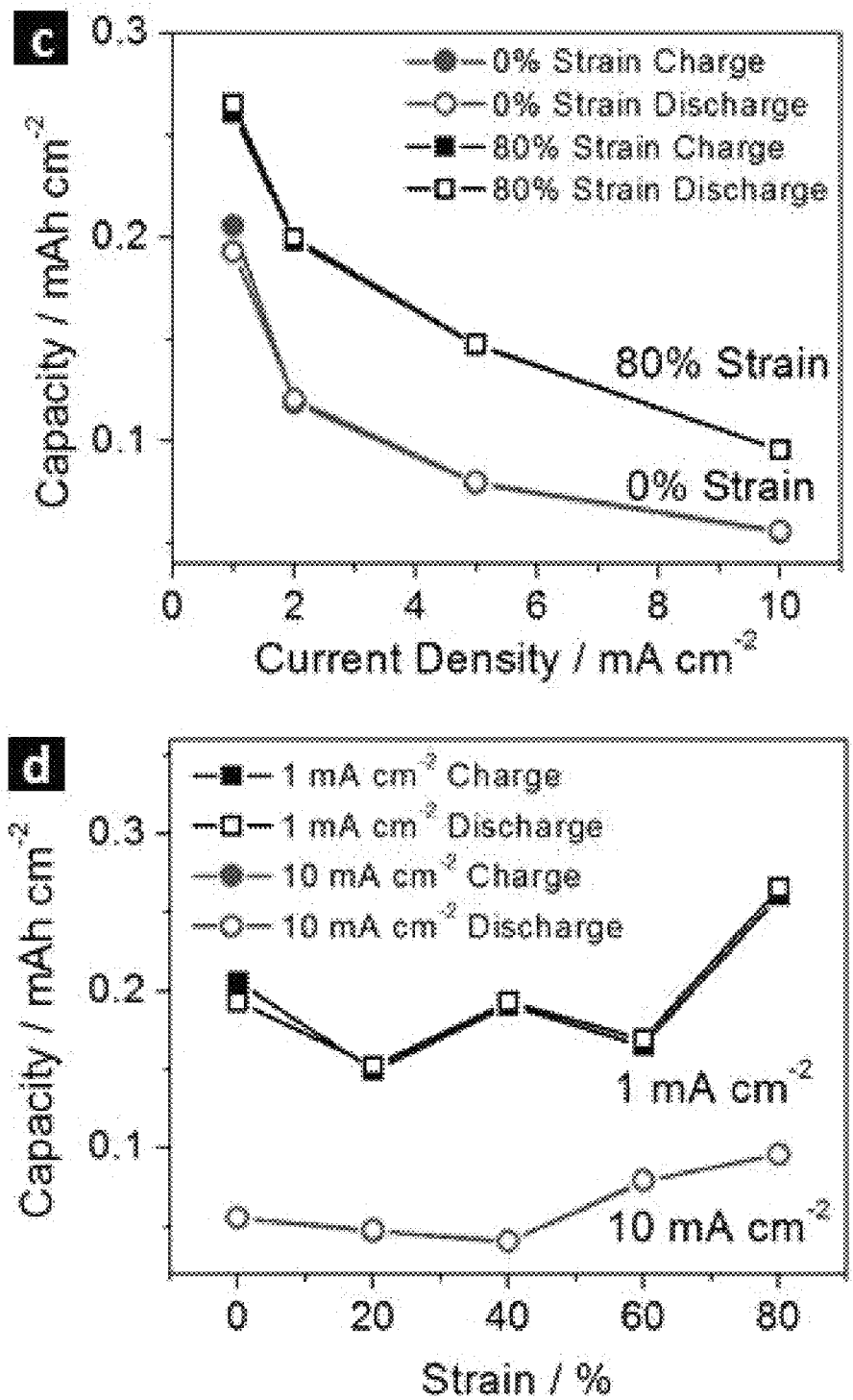
Figure 17:
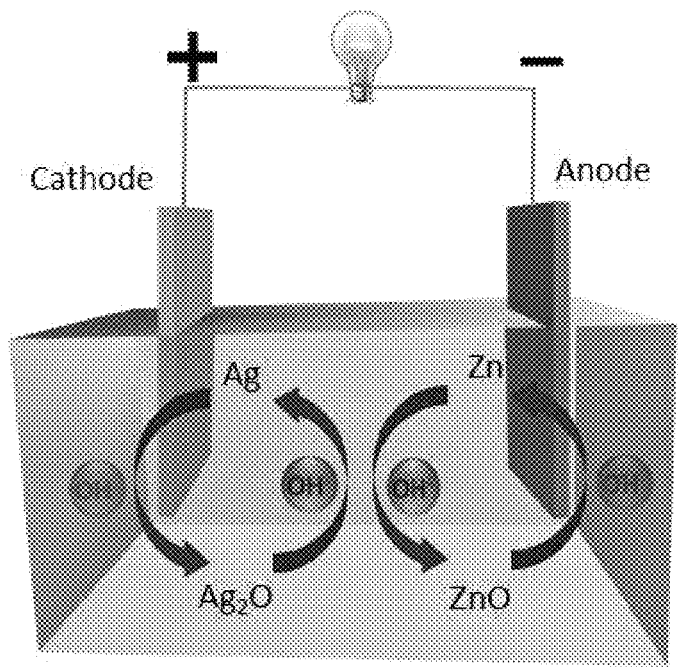
FIG. 17 is a schematic diagram of the two-electrode system used for stretchable AgNW electrode characterizations.

Electrochemical performances of the stretchable AgNW electrodes are shown in FIG. 16. The device was character-ized using cyclic voltammetry (CV) and galvanostatic charge/discharge methods in a two-electrode system with Zn plate as counter and reference electrode (FIG. 17). CV curves of the electrode at 0% and 80% strains are compared in FIG. 16(A) (scan rate 5 mV s$^{-1}$). The reversible cathodic reactions in silver-zinc battery are as following:

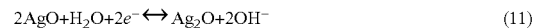

(11)

(12)

Since elemental AgNWs were used for electrode fabrication, the NWs will be oxidized first during the charging process and reduced when discharged. At 0% strain (FIG. 16A)), two oxidation peaks were observed at 1.85 V (oxidation from Ag to Ag$^+$, 0→I) and 2.13 V (oxidation from Ag$^+$ to Ag$^{2+}$, I→II), respectively. The corresponding reduction peaks appeared at 1.85 V (reduction from Ag$^{2+}$ to Ag$^+$, II→I) and 1.48 V (reduction from Ag$^+$ to Ag, I→0), respectively.

When the electrode was stretched to 80%, the two sets of corresponding oxidation and reduction peaks can still be observed, with slight peak shifts from those at 0% strain. For example, the II→I reduction peak at 80% strain increased to 1.90 V from 1.85 V at 0% strain and the I→0 reduction peak decreased to 1.35 V from 1.48 V at 0% strain. The relative peak shifts might originate from the larger electrode resistance in stretched states (FIG. 14(E)), which increases the electrochemical impedance and hence electrode polarizations.

Charge/discharge curves at a current density of 1 mA cm$^{-2}$ for electrodes at 0% and 80% strains are shown in FIG. 16(B). Analogous to those in CV curves, two sets of charge/discharge potential plateaus are clearly visible for electrodes at both 0% and 80% strain, corresponding to the two-step oxidation/reduction reactions in Equations (11) and (12). The reversible reactions between Ag and monovalent Ag$_2$O (Equation 12, I↔0) make the major contributions to electrode capacity, as can also be viewed from CV curves (higher peaks for I↔0 reactions). The 0→I charge plateaus potential varied slightly with strain (FIG. 16(B)), however, the I→0 discharge plateaus potential remained identical at 1.62 V for both 0% and 80% strains.

Figure 19:
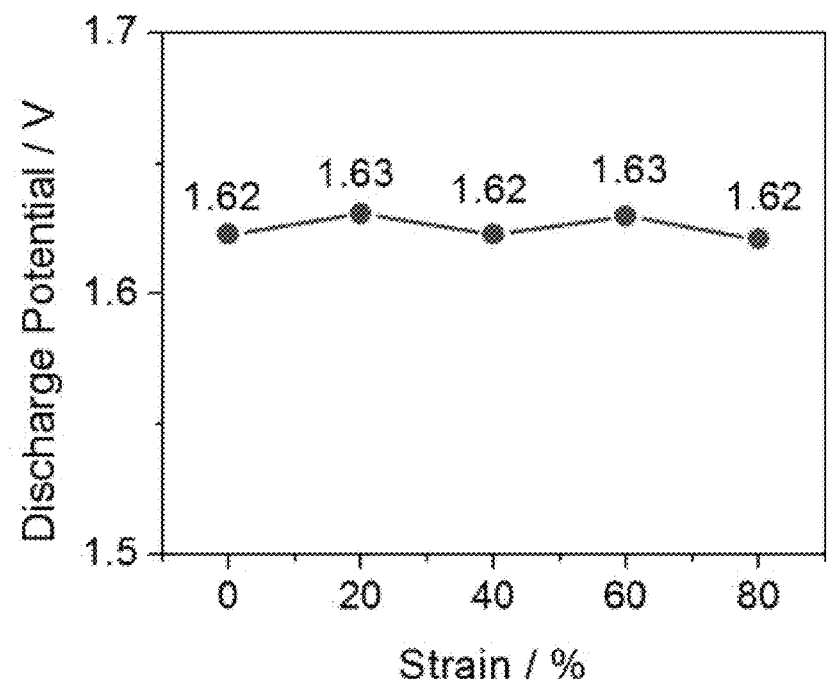
FIG. 19 is a graph showing discharge potential as a function of strains from 0% to 80%. The output potential lies in the range of 1.62 to 1.63 V, with less than 1% fluctuations.

Detailed analyses for charge/discharge curves within 0% to 80% strains further verified the fact that the stretchable battery electrodes showed ultra-stable output voltage within 1.62 V to 1.63 V (less than 1% fluctuations) regardless of stretching conditions (FIG. 19). This is of special importance for applications which require stable voltage supply since no complex stretching-dependent voltage regulations will be needed.

The dependence of areal capacity on charge/discharge current densities and strains are shown in FIG. 16(C) and FIG. 16(D), respectively. It is known that the capacity will decrease at higher current densities due to the less efficient utilization of active materials. A degradation of 71% was obtained when the current density increased from 1 mA cm$^{-2}$ to 10 mA cm$^{-2}$ at 0% strain, and the degradation is 64% for that at 80% strain (FIG. 16(B)). Interestingly, the capacities at 80% strain are higher than those at 0% strain. At a fixed current density of 1 mA cm$^2$, the areal capacity is 0.19 mAh cm$^{-2}$ at 0% strain and increased to 0.27 mAh cm$^2$ at 80% strain. The relationship between areal capacity and strain is plotted in FIG. 16(D). The charge/discharge capacity is in general stable within small strains (0% to 60%), and increased slightly upon further stretching (60% to 80%), which may originate from the exposure of new NW surfaces when the electrodes were heavily stretched. With the unique embedded structure, only NWs in the surficial layer are active for electrochemical reactions. The exact mass of the active NWs are unclear thus areal capacity (mAh cm$^{-2}$) was used instead of specific capacity (mAh g$^{-1}$) to characterize the stretchable electrode performances. The maximum capacity obtained was 0.27 mAh cm$^{-2}$ (1 mA cm$^{-2}$, 80% strain), corresponding to an energy density of 0.44 mWh cm$^{-2}$ (output voltage 1.62 V). The values obtained are comparable to previous reports with energy densities in the range of 0.01 to 4 mWh cm$^{-2}$.

Figure 20:
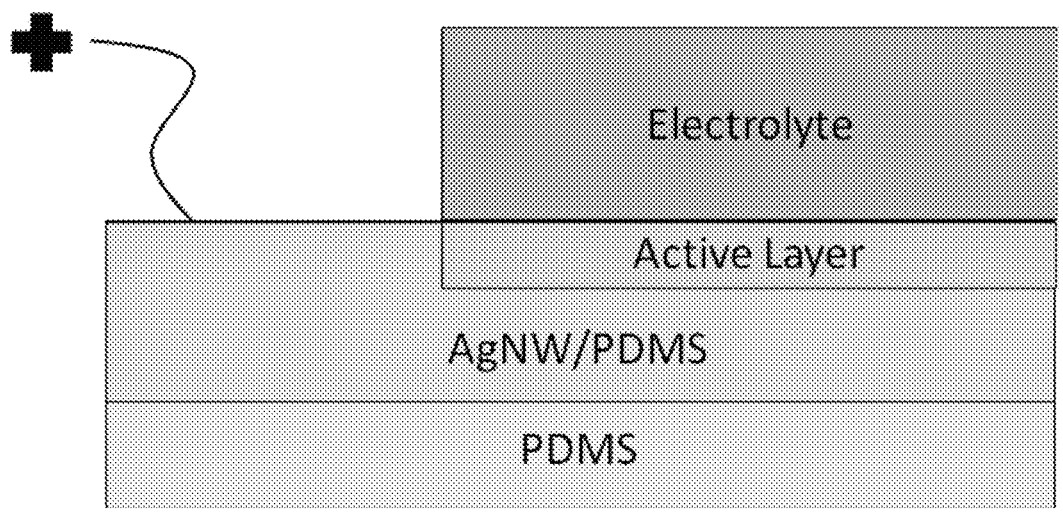
FIG. 20 is a schematic diagram showing estimation of the active layer thickness for stretchable AgNW electrodes disclosed herein.

A reasonable estimation suggests that the thickness of the active layer for stretchable electrode disclosed herein is about 2 to 3 μm, as detailed below and with reference to FIG. 20.

The theoretical capacity is 231 mAh g$^{-1}$ for Ag$_2$O and 433 mAh g$^{-1}$ for AgO, based on Faraday's Law:

$$\text{Capacity} = \frac{nF}{3600 M} \text{Ah } g^{-1}$$

where n is the number of electrons transferred per molecular (n=2 for both Ag$_2$O and AgO), F is Faraday constant 96485 C mol$^{-1}$, M is the molecular weight (231.7 g mol$^{-1}$ for Ag$_2$O, 123.8 g mol$^{-1}$ for AgO).

In literature, the achievable capacity is about 90% of theoretical capacity for silver-zinc batteries. For the stretchable electrodes disclosed herein, monovalent Ag$_2$O contribute to majority capacities, so it was assumed that the reactions are between Ag$_2$O and Ag with a theoretical capacity of 231 mAh g$^{-1}$ and achievable capacity $C_{achievable}$ of 208 mAh g$^{-1}$ (90%). The measured areal capacity $C_{measured}$ is 0.27 mAh cm$^{-2}$. If the stretchable electrode is made of compact Ag film without pores, the active layer thickness h can be calculated based on:

$$C_{measured} \times \text{Area} = C_{achievable} \times \rho \times \text{Area} \times h$$

where ρ is the mass density of Ag (9.32 g cm$^{-3}$). The calculated active layer thickness h for compact film is 1.4 μm. Since the NW film is porous which enables their successful embedding in PDMS matrix, the actual active layer thickness would be larger. The thickness is about 2 μm to 3 μm if it is assumed that the volumetric porosity lie within 30% to 50% based on scanning electron microscopy (SEM) observations.

However, the Ag$_2$O layer thickness is greater than 200 μm for the printed silver-zinc battery. That is, with greater than 60 times thinner materials, the energy density is only 9 times lower, suggesting much higher material utilization efficiency for the stretchable electrodes disclosed herein. The capacity of stretchable electrodes can be further improved by methodologies such as designing porous structures to increase the contact area of NWs with electrolytes.

Figure 18:
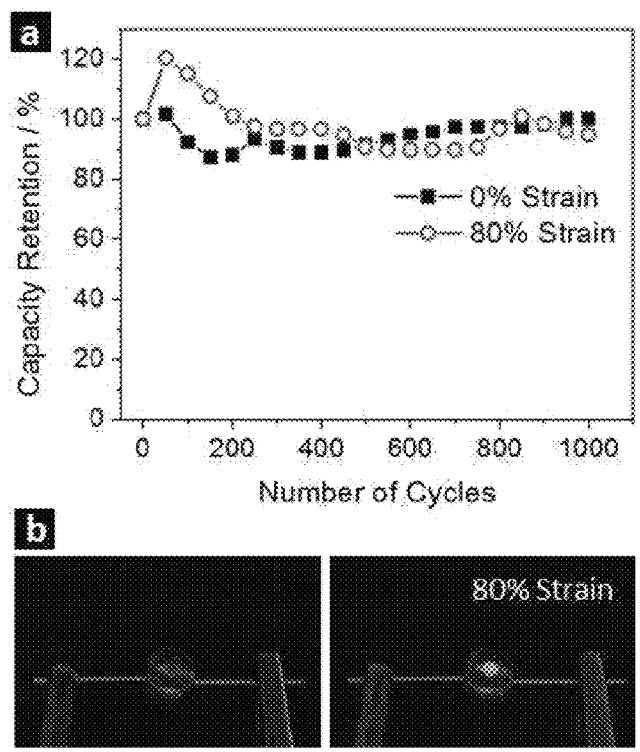
FIG. 18(A) is a graph showing cyclic stability of the stretchable electrodes at 0% and 80% strain; (B) photographs showing application of the stretched battery to light up a red LED.

Cyclic stability of the stretchable and rechargeable battery electrode is shown in FIG. 18(A). The electrode can be cycled up to 1000 cycles (CV method, 50 mV s$^{-1}$) without obvious capacity degradation at both relaxed and stretched states (80% strain). This cyclic stability of our stretchable electrodes is comparable or even better than state-of-art Li-ion batteries and silver-zinc batteries.

The outstanding stability may be attributed to the unique bi-functional electrode structures. The underlying AgNWs beneath the surficial active layer provide highly conductive and stable electron conducting paths for consistent energy output. Those AgNWs remain inactive and are free from any corrosion with electrolyte since PDMS do not allow aqueous solvents to infiltrate or swell the material. In demonstration of the potential applications, the battery with stretchable electrode was used to light up a commercial light-emitting diode (LED). Images of the red LED in off state and on state powered by the stretched battery electrode (80% strain) are shown in FIG. 18(B), providing direct and solid evidence that the battery is functioning even when highly stretched.

In conclusion, stretchable AgNW electrodes with embedded structures were fabricated via a lithographic filtration method. The electrodes possess ideal bi-functionalities by simultaneously providing electroactive layer and electron conducting layer. Electrochemical performances of the electrodes were systematically studied in both relaxed and stretched states, and they maintained their functionalities even when stretched up to 80%. The energy storage is dominant by redox reactions between Ag and Ag$^+$, and stable output voltages of 1.62 V to 1.63 V were observed regardless of stretching conditions. The electrodes also showed outstanding cyclic stabilities without obvious performance degradation after 1000 cycles, which can be attributed to the unique embedded electrode structures. The high-performance, safe and green silver-zinc batteries in stretchable form may find important applications in emerging stretchable and wearable electronics.

Example 7: Stretchable Supercapacitors

Supercapacitors with ultrahigh power density as compared with batteries are considered as emerging power sources for future electronics. Although they are not quite suitable as independent power sources until now due to their low energy density, the ultrahigh power output enables important applications where transient high power are needed and cannot be provided by batteries. The fabrication method disclosed above may also be used to fabricate stretchable redox supercapacitors which can maintain their functionalities in highly stretched states.

Strategies, fabrication methods and testing results disclosed herein were extended to stretchable supercapacitors based on V$_2$O$_5$.

The stretchable elastic conductor with AgNWs embedded in PDMS matrix was fabricated as the stretchable electrodes following the same procedure as described for photodetector fabrications mentioned above.

Next, the stretchable electrodes were immersed into V$_2$O$_5$ sol liquid for electrochemical deposition of V$_2$O$_5$ active layer. The deposition was performed using a 3-electrode system, with Pt plate as counter electrode and Ag/AgCl as reference electrode. Typical deposition was performed at −0.5 V versus Ag/AgCl for 300 s and only the AgNW/PDMS electrodes immersed in the solution would be coated with active area, so only part of the electrode is covered with V$_2$O$_5$ active layer and rest of the electrode which is not covered with V$_2$O$_5$ is used for electrical contact during property testing.

Figure 21:
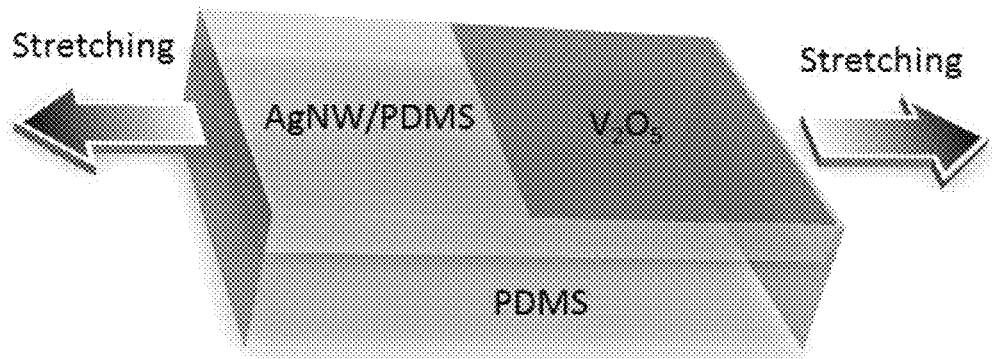
FIG. 21 is a schematic diagram of the stretchable electrode for supercapacitor applications based on AgNWs and $V_2O_5$ electroactive materials.

FIG. 21 is a schematic illustration of the stretchable supercapacitor electrodes. Ag nanowires embedded in PDMS matrix was used as the stretchable elastic conductors for V$_2$O$_5$ deposition. The V$_2$O$_5$ active layer was electrochemically deposited from V$_2$O$_5$ sol and annealed at 100° C. for 30 min after deposition. The as-deposited V$_2$O$_5$ supercapacitor electrode showed excellent stretchability and no obvious layer delamination or peel off was observed after repeated stretching to 50%.

Figure 22:
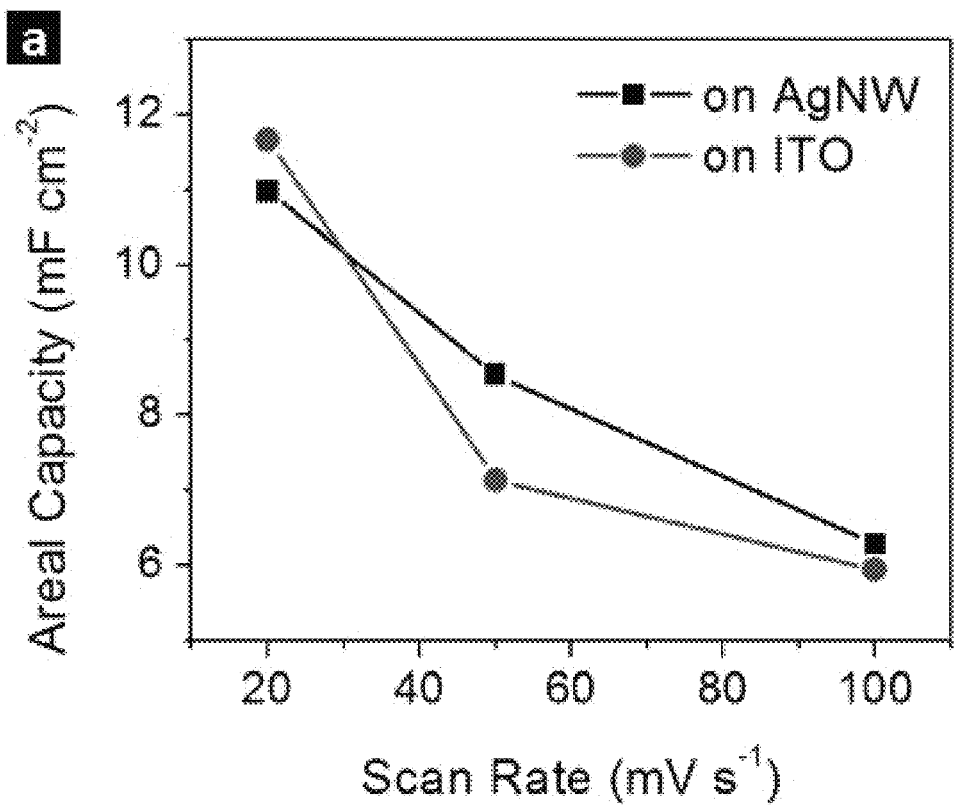
FIG. 22 are graphs showing (A) the relationship between areal capacity and scan rate; and (B) cyclic stability of the supercapacitor electrodes.
Figure 22:
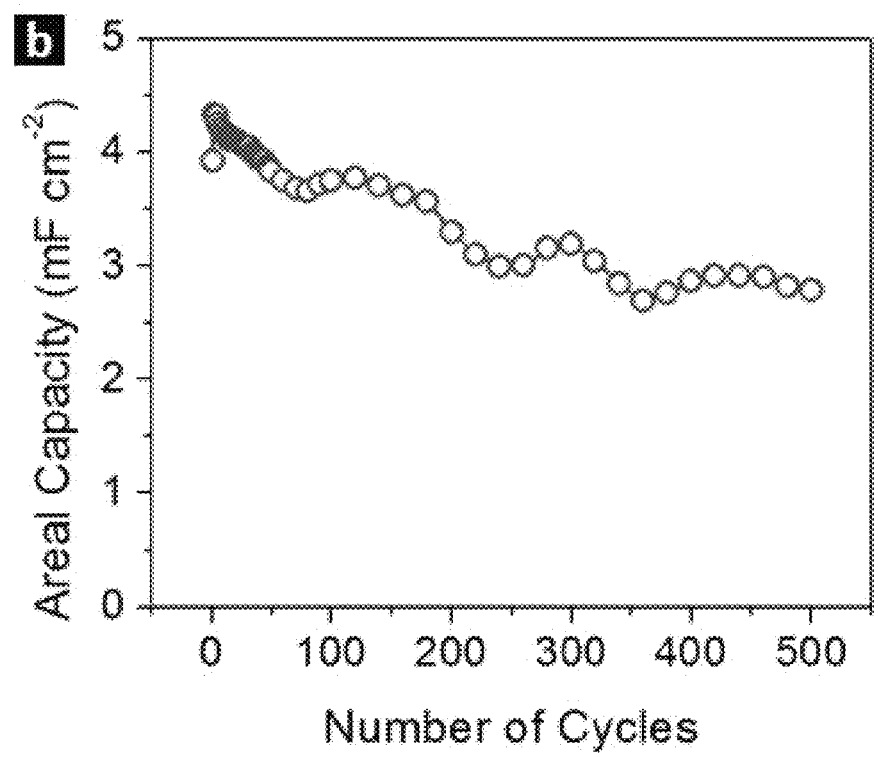

Preliminary supercapacitor characterizations of the stretchable electrodes are shown in FIG. 22. The electrode was tested in a 3-electrode system with Pt plate as counter electrode, Ag/AgCl as reference electrodes, and 1 M LiClO$_4$/PC as electrolyte. CV scans were performed in the range of −1 V to 0.5 V versus reference electrode, as have been tested to avoid the oxidation of Ag nanowire working electrodes.

The relationship between areal capacity and scan rates on stretchable Ag nanowire substrates and conventional ITO substrates are shown in FIG. 22(A), where comparable performances were obtained. At a scan rate of 20 mV/s, an areal capacity of 11 mF cm$^{-2}$ to 12 mF cm$^{-2}$ was obtained for V$_2$O$_5$ on both Ag nanowire and ITO substrates, showing the proper functioning of stretchable Ag nanowire electrodes. Cyclic stabilities of the electrodes were also tested using CV method, as shown in FIG. 22(B). The cyclic testing was performed using CV method with a scan rate of 100 mV s$^{-1}$. The areal capacity decreased from 4.4 mF cm$^{-2}$ to 2.9 mF cm$^{-2}$ after 500 cycles, a decrease of 34%. The cyclic testing results first suggests that the stretchable Ag nanowire electrodes can sustain the long-term continuous testing and no significant degradations were observed, since the CV cycling window was selected to avoid the oxidation potential of Ag nanowires. Second, the relatively large capacity degradation of 34% indicates that the device structure still needs to be improved in future studies.

Example 8: Stretchable Electrochromic Devices

Strategies, fabrication methods and testing results disclosed herein were extended to stretchable electrochromic devices.

Electrochromic devices are a type of technology with electrically-controllable optical modulations. The optical properties of electrochromic devices may be tuned by the electrical potentials applied. They have found broad applications in the areas of non-emissive electronic papers, antiglare rear view mirrors in cars, energy saving smart windows in buildings, ski goggles, etc. However, existing electrochromic devices based on rigid substrates (such as transparent conductive glass) are not suitable for future applications of wearable and implantable displays. The fabrication of stretchable electrochromic devices based on soft Ag nanowire electrodes is demonstrated herein.

Example 8.1: Electrode Examples

The stretchable electrochromic electrodes were fabricated as following: First the stretchable elastic conductor with AgNWs embedded in PDMS matrix was fabricated following the same procedures as described earlier for stretchable photodetectors.

Next, electroactive WO$_3$ layer was deposited onto the stretchable and wearable electrodes using a three-electrode system, with Pt plate and Ag/AgCl as counter and reference electrodes, respectively. Tungsten power (1.8 g) is mixed with H$_2$O$_2$ solution (30%, 60 mL) and stirred constantly for 12 h. The solution became yellowish after stirring and the sediments were filtered to obtain a clear solution for WO$_3$ deposition. The electrochemical deposition was performed at −0.5 V for 200 s. One characteristic for electrodeposition method is that only those electrode areas immersed in the solution will be coated with active layer such as WO$_3$ layer in this case. Those electrode parts not immersed in the solution remain bare electrode for electrical contact purposes.

Figure 23:
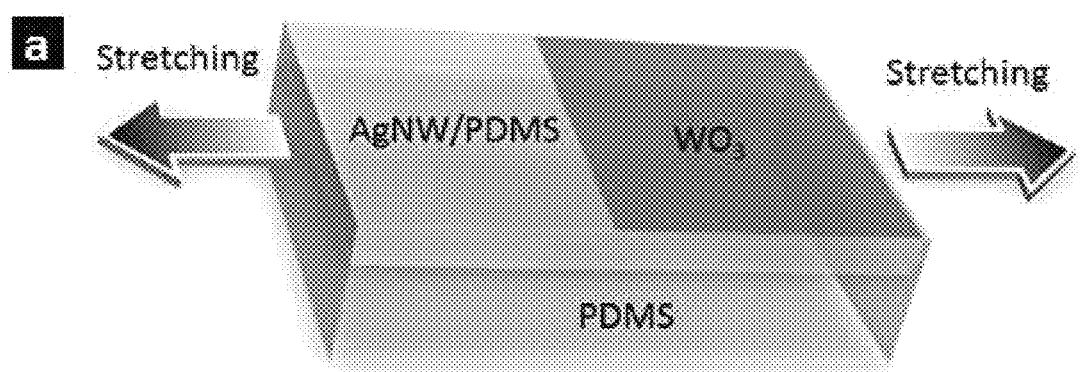
FIG. 23 is (A) schematic of the stretchable electrochromic device based on AgNWs and $WO_3$ electroactive material. Examples of the patterned device in both bleached and colored states at (B) 0% strain; and (C) 50% strain, respectively.
Figure 23:
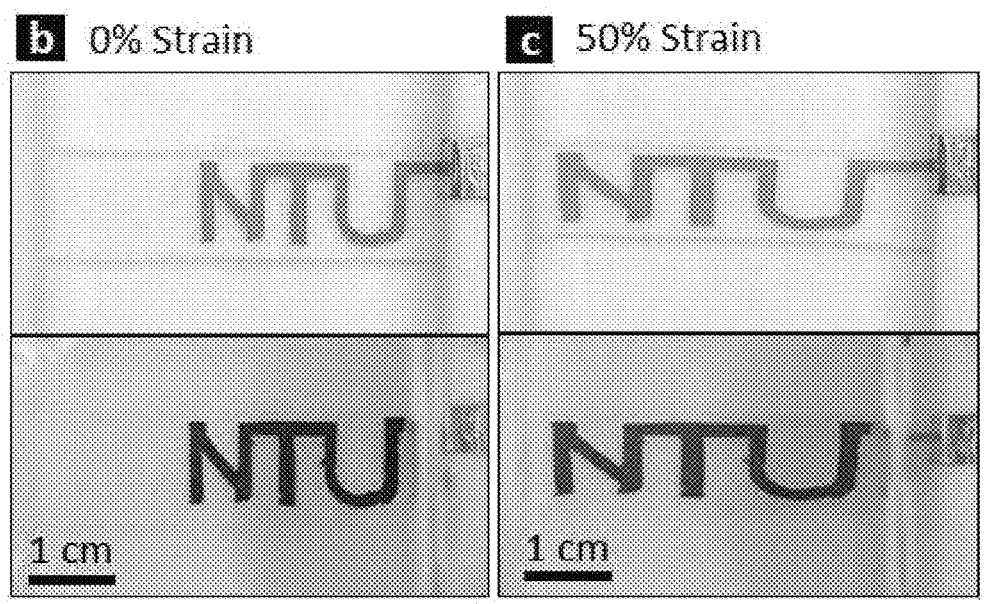

Representative examples of the stretchable electrochromic devices are shown in FIG. 23. The device is based on AgNW/PDMS elastic conductor electrode with electrochemically deposited WO$_3$ active layer. The WO$_3$ layer was electrochemically deposited on the elastic conductors and followed the patterns of the AgNWs since the PDMS elastomer was electrically inactive. The as-fabricated stretchable electrochromic devices are mechanically robust and can be stretched (50%, FIG. 23C), twisted, folded and crumpled without performance degradations, making them promising candidates for next-generation stretchable and wearable electrochromic applications.

Example 8.2: Electrode Characterizations

Figure 24:
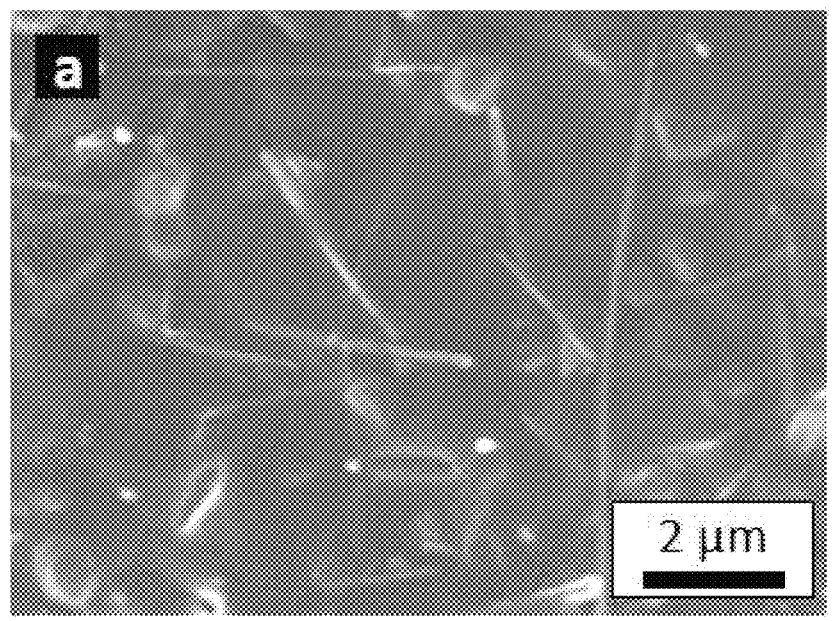
FIG. 24 shows top and cross-sectional views of the stretchable AgNW electrodes (A) and (B) before; and (C) and (D) after $WO_3$ deposition. Inset in (B) is an enlarged cross-sectional view showing the exposed NW tips from the elastomer matrix. Scale bar in the inset represents 500 nm.
Figure 24:
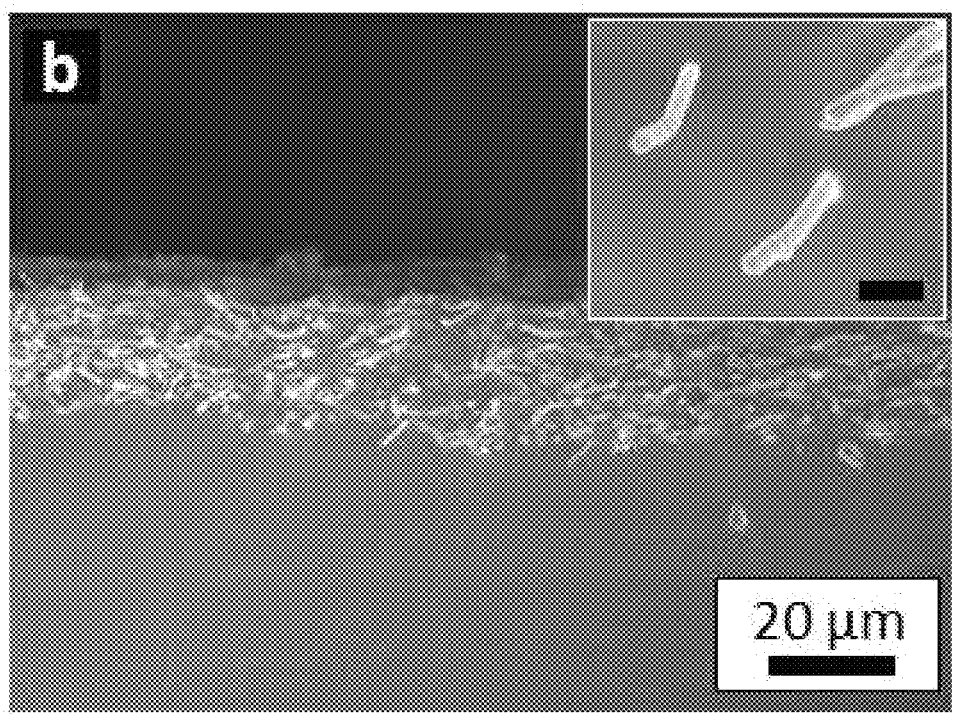
Figure 24:
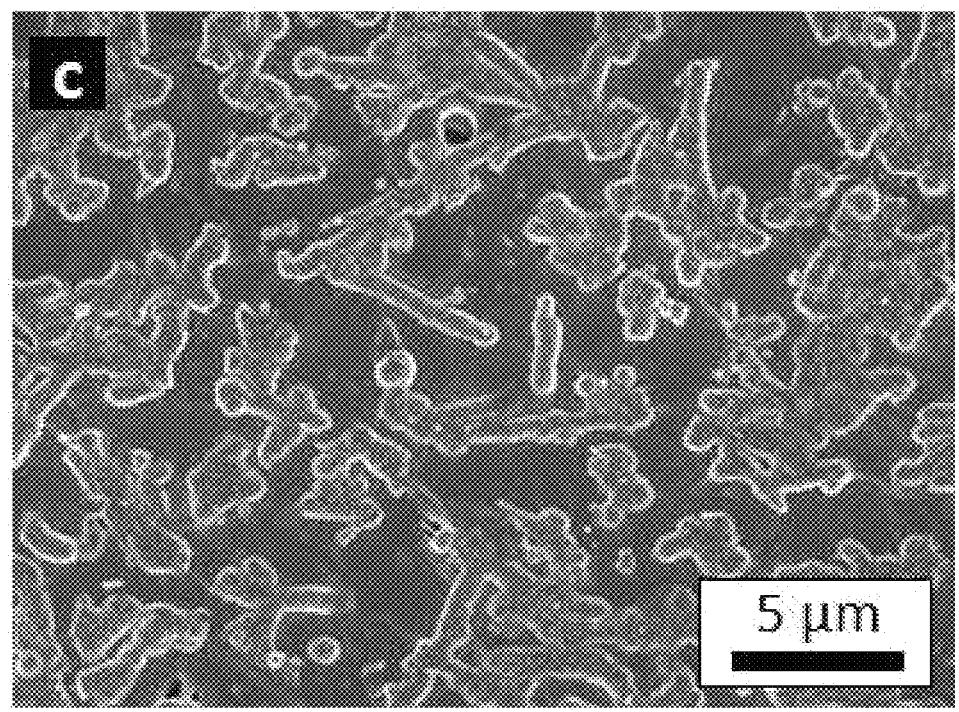
Figure 24:
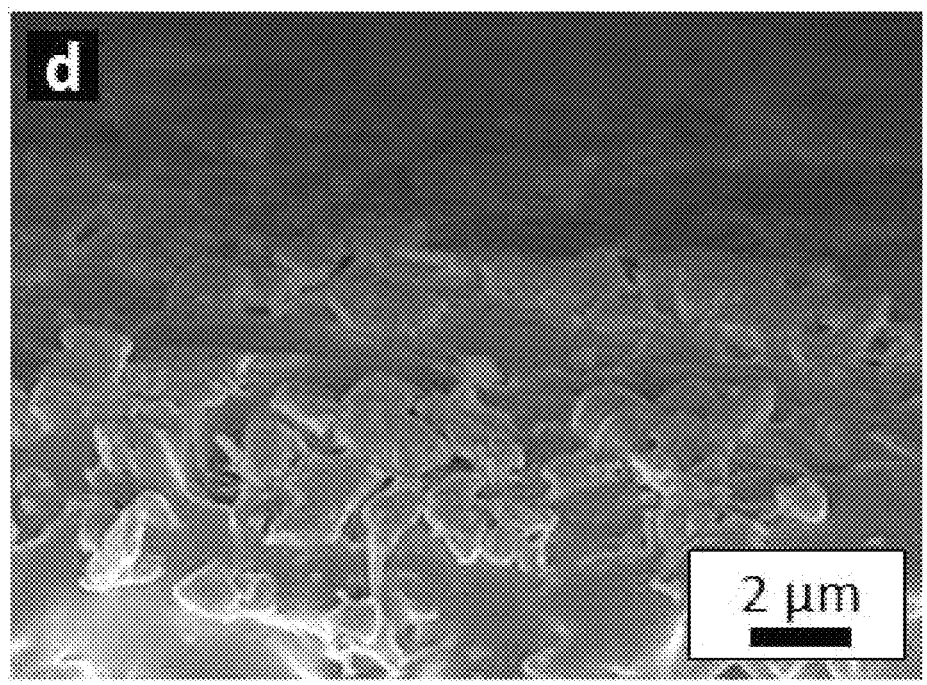

Detailed structural characterizations of the stretchable devices are shown in FIG. 24.

Top view and cross-sectional view scanning electron microscopy (SEM) images confirm that the AgNWs are embedded in the elastomer matrix with the top NW layer exposed as electroactive sites for electrochemical deposition. WO$_3$ layer was deposited at a constant voltage of −0.5 V (versus Ag/AgCl) using a three-electrode system. The deposited WO$_3$ film followed the shapes of exposed NW surfaces since the rest of the top surfaces are covered with insulating PDMS. The WO$_3$ layer showed excellent stretching stability without observable structural degradations like delamination and peeling off after more than 100 stretching cycles.

Example 8.3: Electrochromic Properties

Figure 25:
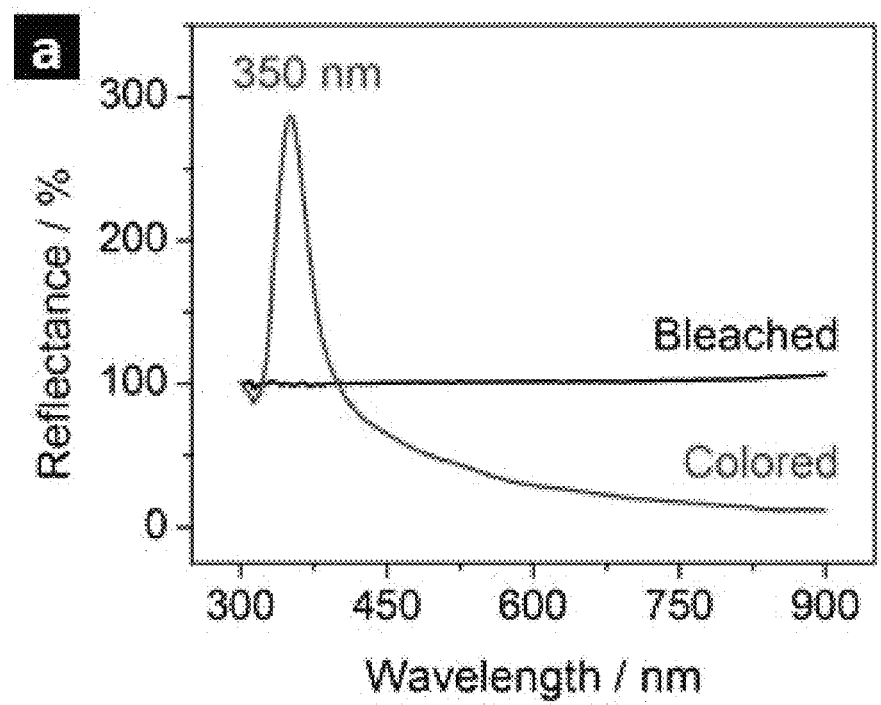
FIG. 25 shows graphs of (A) reflective spectra of the stretchable electrode in colored and bleached states; (B) switching behaviors measured at 350 nm; (C) enlarged view of a single switching cycle; (D) plot of optical density (OD) versus charge density for coloration efficiency (CE) calculation; (E) switching behaviors for the 1st, 2nd, 99th and 100th cycles; and (F) contrast retention within 100 cycles.
Figure 25:
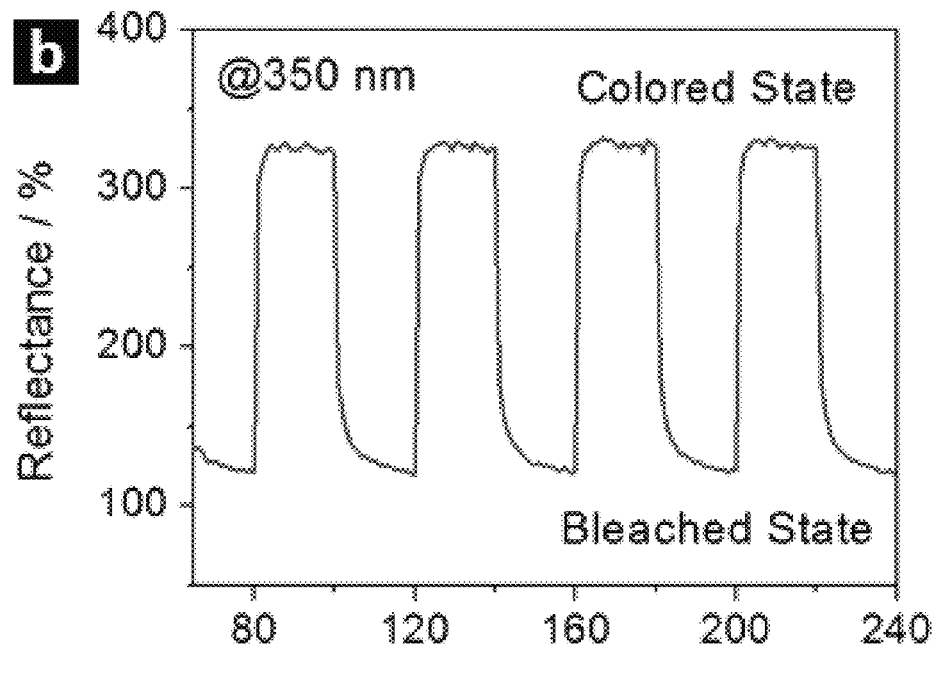
Figure 25:
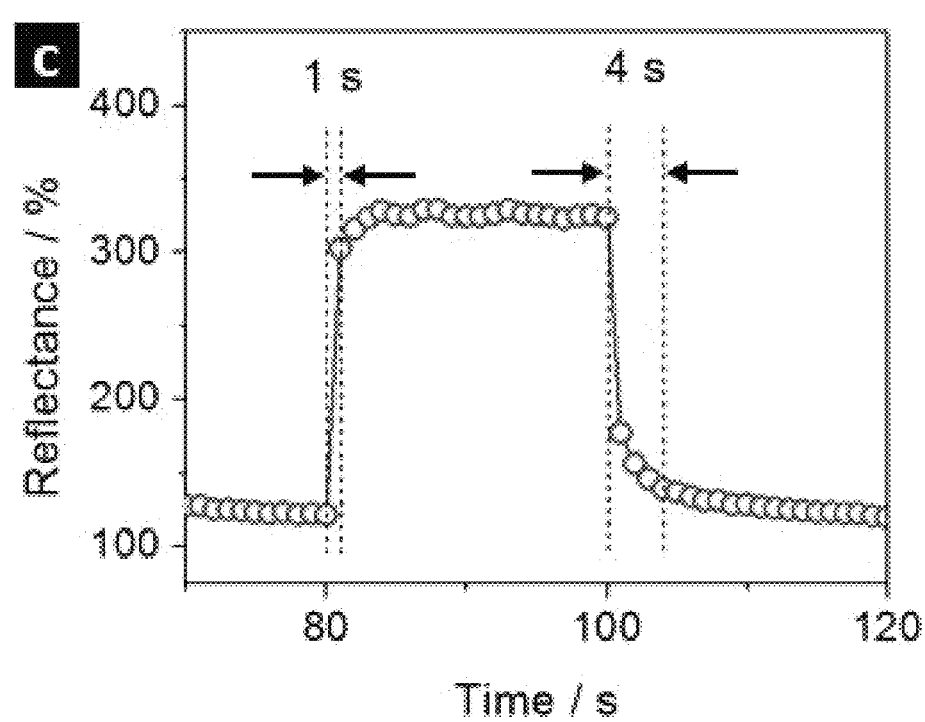
Figure 25:
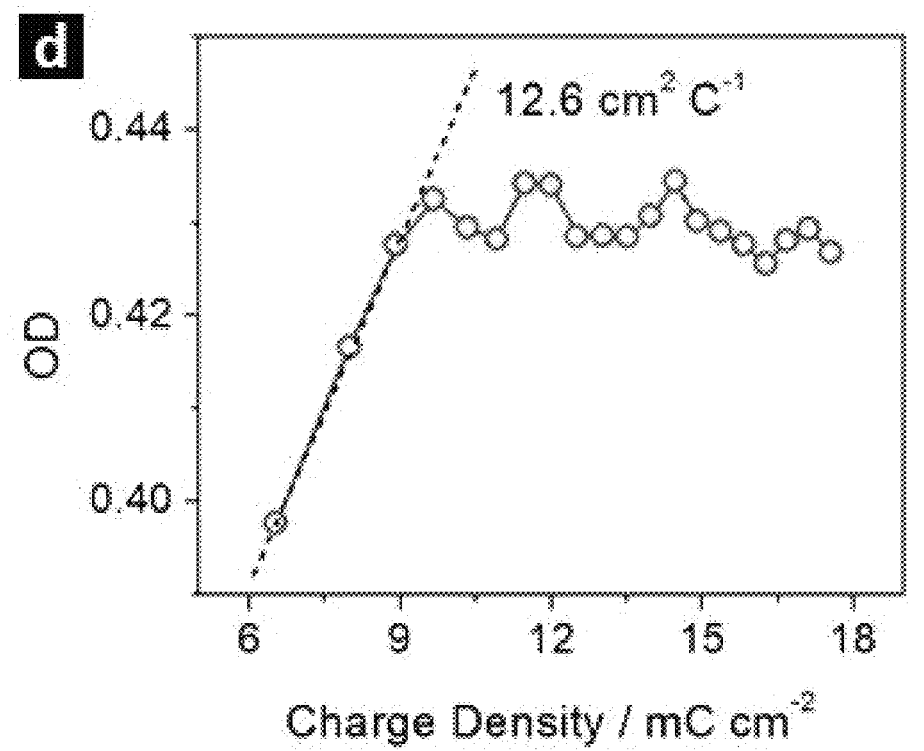
Figure 25:
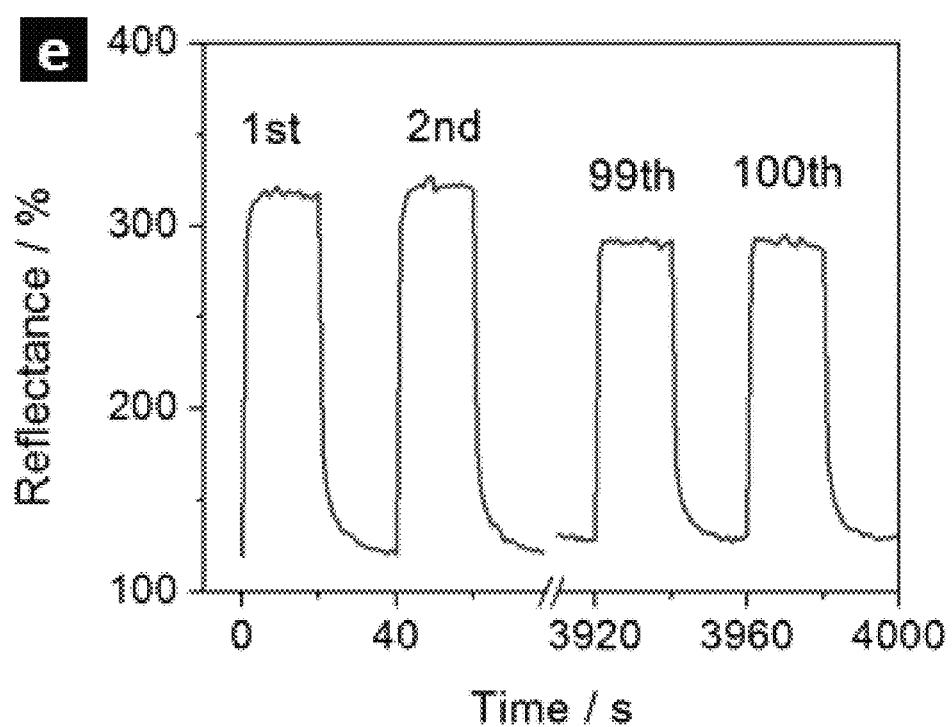
Figure 25:
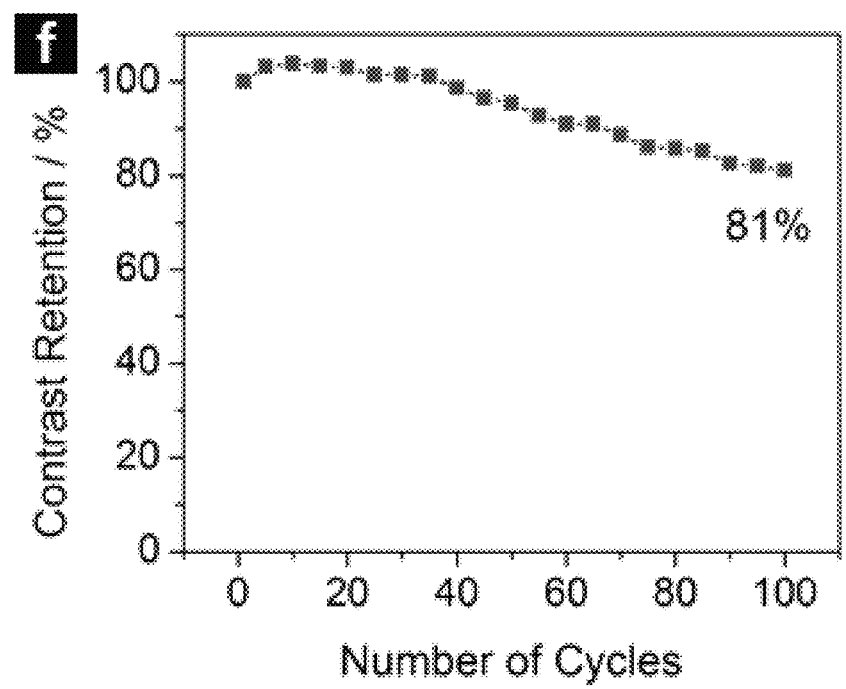

Electrochromic properties of the stretchable devices are shown in FIG. 25. Electrochromic properties were characterized in reflective mode using a two-electrode system with Pt wire as counter and reference electrode.

Reflective spectra in bleached (−0.5 V) and colored (−1.8 V) states are shown in FIG. 25(A). The reflectance in bleached state was normalized to 100% as the baseline and compared to that in colored state. A reflection peak at 350 nm was observed. WO$_3$ was known to be switchable between transparent and blue color upon cation insertion and extraction, and the observed transmission peaks at colored states occurred in the range of 400 nm to 500 nm and varied with applied potentials.

In situ switching behaviors of the stretchable device measured at 350 nm are shown in FIG. 25(B). Fast, stable and consistent color switching was observed. An enlarged view of a single switching cycle is shown in FIG. 25(C) and the measured coloration and bleaching time (defined as the time required to reach 90% of the full response) are 1 s and 4 s, respectively.

Coloration efficiency (CE) is one of the most important characteristics of electrochromic electrodes. Higher CE is desired to use less charge to achieve larger optical modulation. Moreover, cation insertion/extraction leads to crystal deformations and affects the long-term cyclic stability, thus a reduced content of ion insertion/extraction are of interest to improve the device stability for practical applications. The efficiency is defined as the change in optical density (OD) per unit charge density (Q/A) and can be calculated based on:

$$CE = \Delta OD/(Q/A),$$

where OD=log(R$_{color}$/R$_{bleach}$), Q is charge amount, A is electrode area, R$_{color}$ is the reflectance in colored state and R$_{bleach}$ is the reflectance in bleached state.

FIG. 25(D) shows the relationship between in situ OD and intercalation charge density during a typical coloration process at −1.8 V. The CE value fitted from the linear region of OD-charge density curve is 12.6 cm$^2$ C$^{-1}$. Cyclic stabilities of the stretchable electrochromic electrodes are shown in FIG. 25(E) and FIG. 25(F). The device maintained their functionalities after 100 cycles with 19% contrast degradation.

Example 8.4: Wearable Electrochromic Devices

Figure 26:
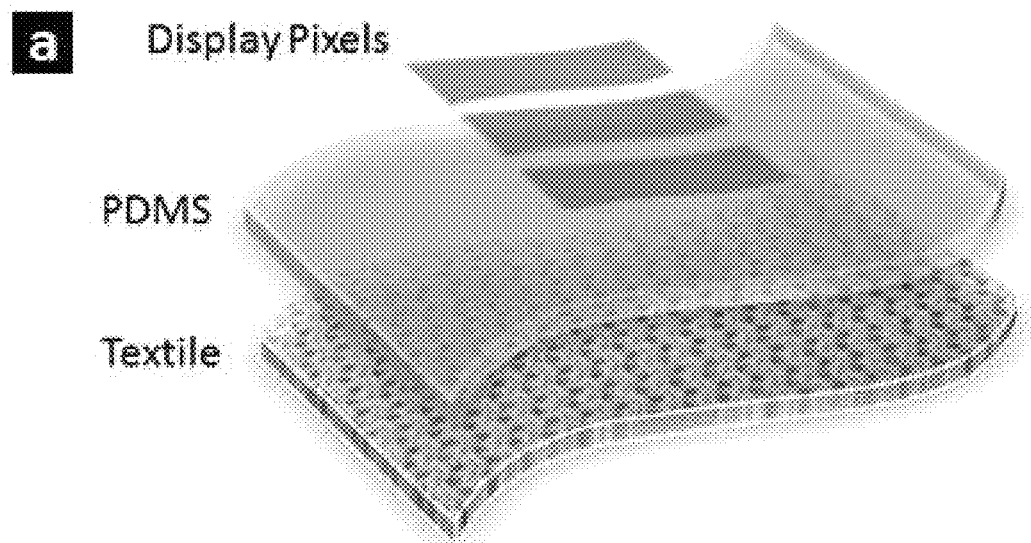
FIG. 26 shows (A) schematic of the electrochromic (EC) electrode implanted on wearable textiles; (B) images showing the capability to control the coloration/bleaching of individual display pixels and their mechanical stabilities against deformations such as crumpling.
Figure 26:
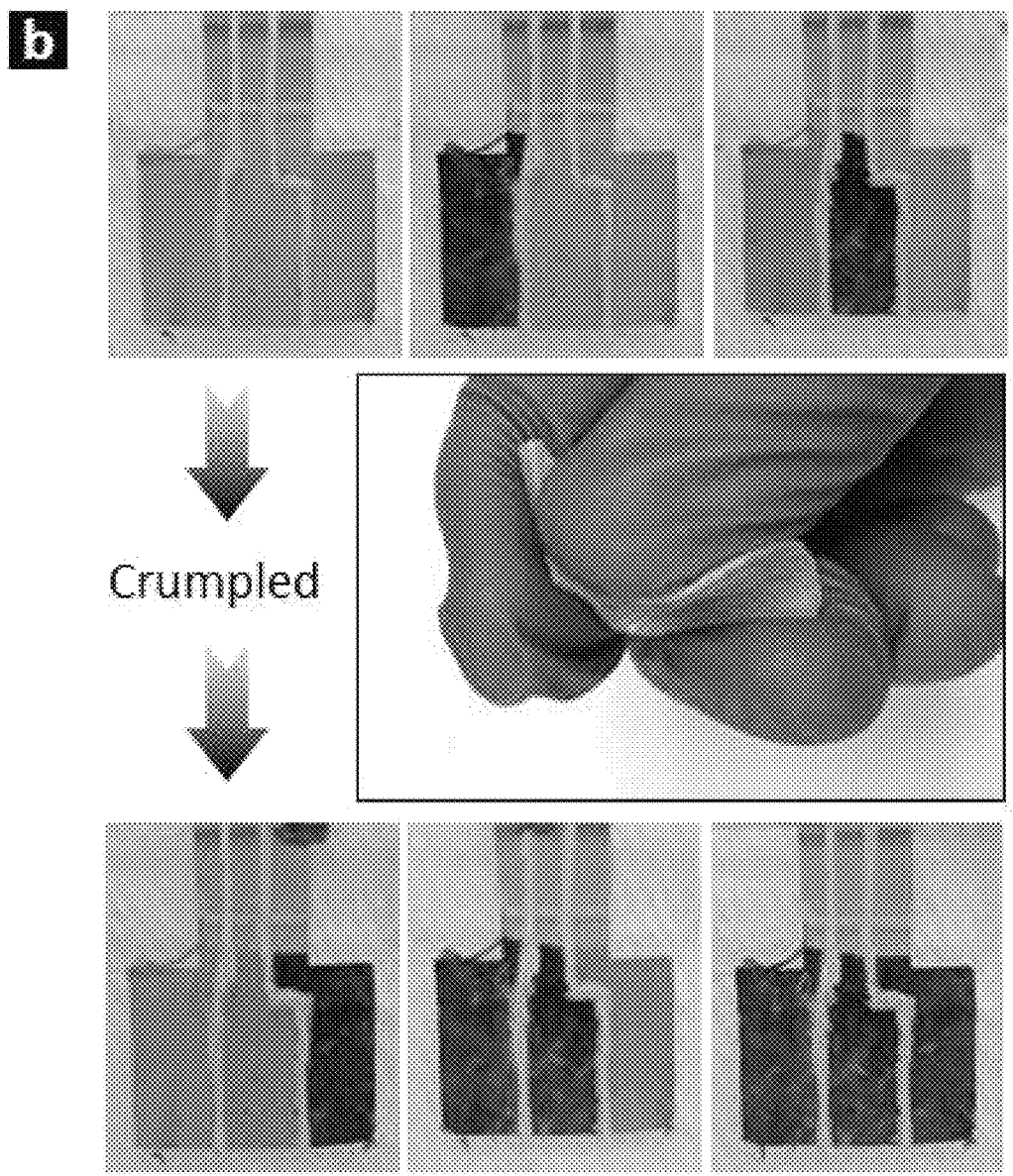

One of the most exciting applications of stretchable electrochromic devices is for future wearable and implantable displays. The soft display panels with individually addressable pixels could potentially be implanted on clothes or skins for the display of stationary and even moving texts and images. As a demonstration of proof, wearable electrochromic devices implanted on a cotton textile substrate are shown in FIG. 26. The three individually addressable display pixels can be colored and bleached individually or in any combinations. The wearable electrochromic devices are mechanically robust and could maintain their functionalities after various forms of deformations such as crumpling. Although only three pixels were demonstrated in prototype disclosed herein, scale fabrication of pixel arrays together with the development of addressing circuits may be readily achieved, paving the way for their unprecedented applications unreachable with existing rigid technologies.

Example 9: Piezoresistive Graphene-Nanocellulose Nanopaper for Strain Sensors

Example 9.1 Flexible Nanopaper

Crumpled graphene is commercially available and used as received (Time Nano, China, product number: TNRGO, thickness 0.5 nm to 3.74 nm, flake size 0.5 μm to 3 μm, purity greater than 99 wt %, specific surface area 500 $m^2$ $g^{-1}$ to 1000 $m^2$ $g^{-1}$). The fabrication method for crumpled graphene is briefly described as follows.

Graphene oxide sheets were first prepared from natural graphite flakes using modified Hummers method. The graphene oxide dispersion (in aqueous solution) was dried in a vacuum oven until the water content dropped to ca. 10 wt % to 20 wt % and then placed into a quartz tube furnace kept at 1200° C. with inert nitrogen ($N_2$) atmosphere. The graphene oxide was reduced at 1200° C. for 5 min before moved to the room temperature region of the quartz tube furnace.

The crumpled morphologies are likely to be induced by the capillary compression forces of water during the drying processes, as have also been observed in previous reports where heavily crumpled graphene balls were obtained by the rapid drying of aerosol droplets containing graphene.

Figure 27:
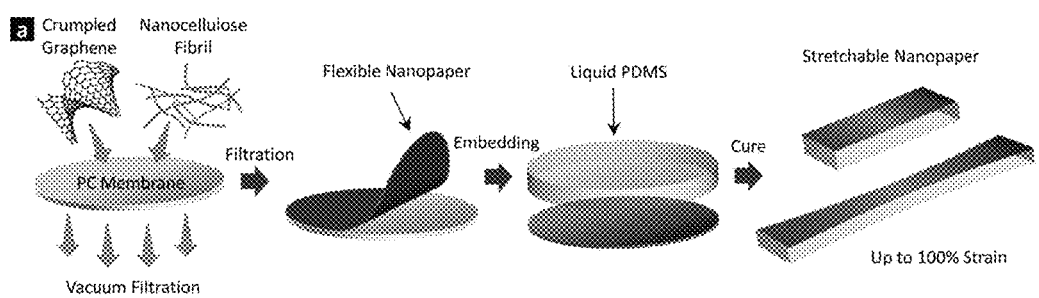
FIG. 27 shows (A) schematic illustrations of the fabrication processes for stretchable graphene nanopapers.
Figure 27:
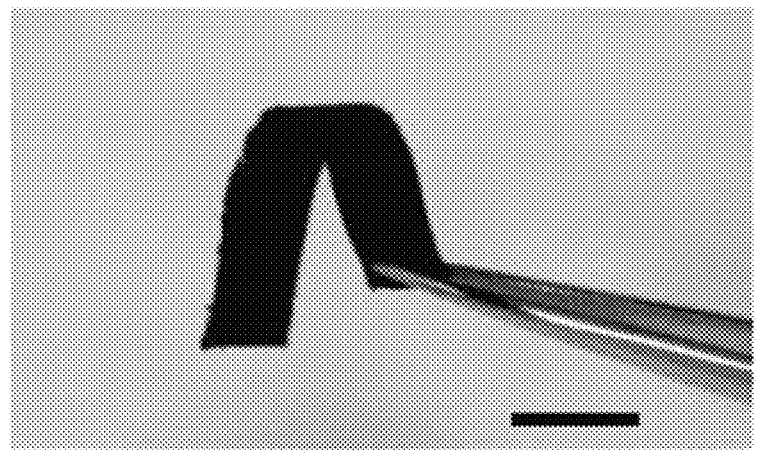
Figure 27:
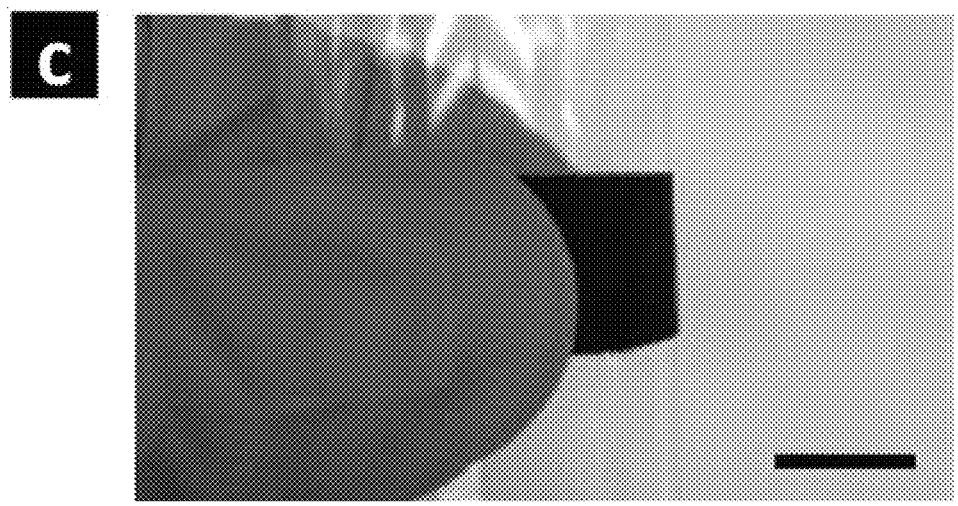
Figure 27:
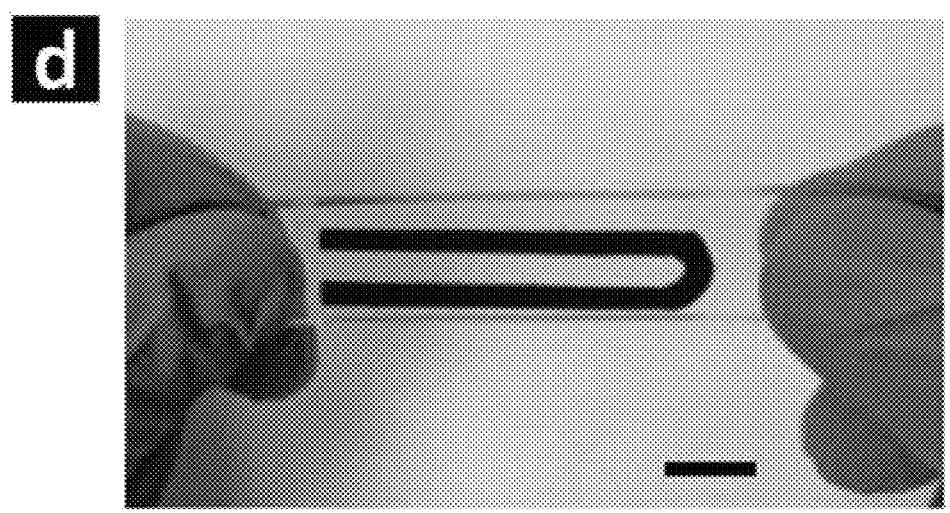
Figure 27:
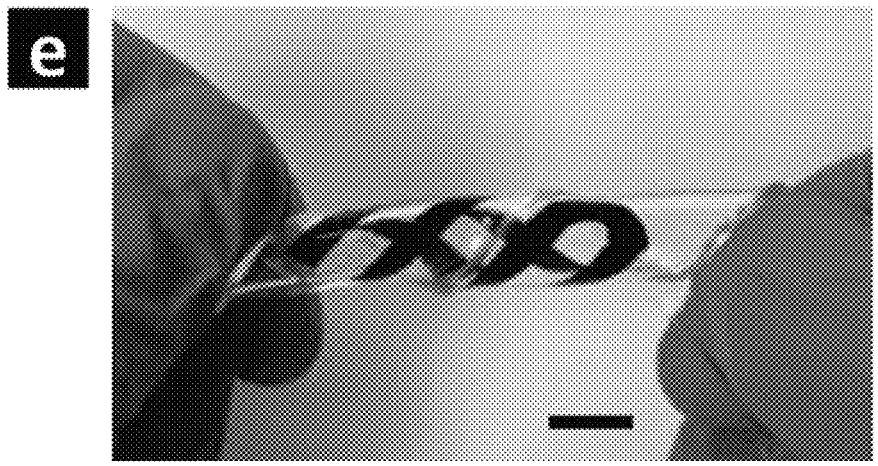
Figure 27:
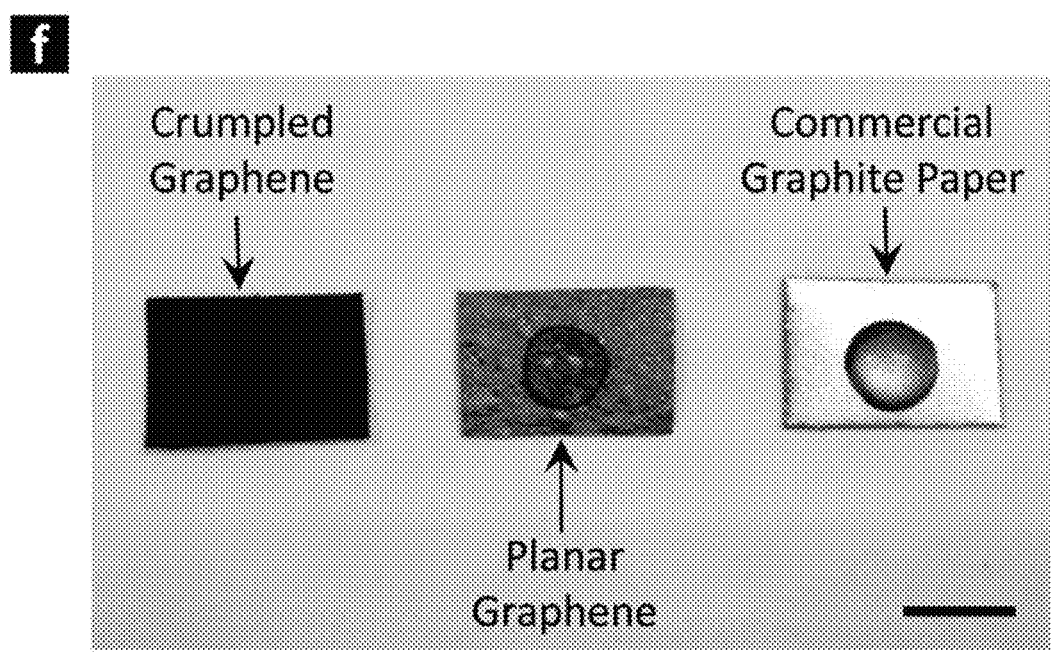

Fabrication processes of the graphene nanopapers are shown in FIG. 27. Flexible nanopapers based on crumpled graphene and nanocellulose were first fabricated and then embedded in elastomer matrix to obtain stretchable nanopapers (defined as the stretchable electrode with embedded flexible nanopaper).

Specifically, nanocellulose fibril (The University of Maine, Process Development Center, USA, diameter 20 nm, length 1 μm) was dispersed in aqueous solution with a concentration of 3 wt %. As-received crumpled graphene and nanocellulose was mixed in DI water (weight ratio 1:1) and stirred at 500 rpm for 10 min. The mixture solution was then vacuum filtered using PC filter membranes (Millipore GTTP, pore size=220 nm) to get a uniform flexible nanopaper. Uniform composite films were obtained after filtration due to the simultaneous extraction of solvent from the evenly distributed track-etched pores in the filter membrane.

The nanopaper was rinsed with ethanol (99.9%, Merck KGaA, Germany) after filtration. The nanopaper on filter membrane was leave in air at room temperature for 30 min to dry. The flexible nanopaper can be separated, for example, by peeling when dried from the filter membrane to obtain free-standing film, as shown in FIG. 27(B) to (C).

Example 9.2: Stretchable Nanopaper

The flexible nanopaper on filter membrane was put in a glass petri dish for PDMS infiltration. The PDMS base and curer (Sylgard 184, Dow Corning, USA) was mixed (weight ratio=10:1) and poured on top of the flexible nanopaper. The petri dish was then degassed in a vacuum desiccator for 30 min to allow sufficient PDMS infiltration before curing at 60° C. for 2 h. The solidified PDMS substrate was peeled off from the filter membrane and the flexible nanopaper was successfully impregnated with and embedded into the PDMS elastomer matrix to fabricate stretchable nanopapers.

Example 9.3: Comparative Samples

Planar graphene paper was fabricated as follows. Graphite oxide (GO) was reduced using Hummer's method. Reduced graphite oxide (rGO) solution was filtered using a microfiltration setup with cellulose filter paper. A thin film with desired thickness was obtained after drying the filtered membrane. The commercial graphite paper was purchased from AGM Corp, China (natural graphite greater than 99.95%, thickness 0.5 mm) and used as received. Surface functionalized CNT was purchased from Time Nano, China (Product Number: TNGMC2, purity greater than 99.9 wt %, —COOH content 1.28 wt %, diameter 8 nm to 15 nm, length ca. 50 μm, specific surface area greater than 100 $m^2$ $g^{-1}$).

The CNTs were dispersed in ethanol with a concentration of 0.5 mg $mL^{-1}$ for filtration. AgNWs were purchased from Seashell Technology LLC, USA (diameter 100 nm, length 20 μm to 50 μm, dispersed in isopropyl alcohol, 1 mg $mL^{-1}$). The CNT and AgNW solutions were filtered and embedded in PDMS matrix using a similar method as crumpled graphene.

Example 9.4: Data-Glove Fabrication

The data glove was fabricated by implanting five stretchable graphene nanopaper sensors on the fingers of the glove (Brand: Safewear, goatskin argon leather glove). PDMS liquid was used to "glue" the stretchable nanopaper sensors to the glove surface.

The graphene strain sensors were designed into U-shaped so that the two electrical contacts can be connected on one end, which helps to maintain stable connections when the fingers were repeated bended and stretched.

Example 9.5: Characterization

The microstructures of the electrodes were characterized using field-emission SEM (FE-SEM) (JSM 7600F, Japan).

For the stretching tests, the samples were fixed on home-built stretching stages to apply the desired strain. The relative resistance changes upon stretching were measured using a Keithley analyzer (Model 4200).

Example 9.6: Results and Discussion

Figure 28:
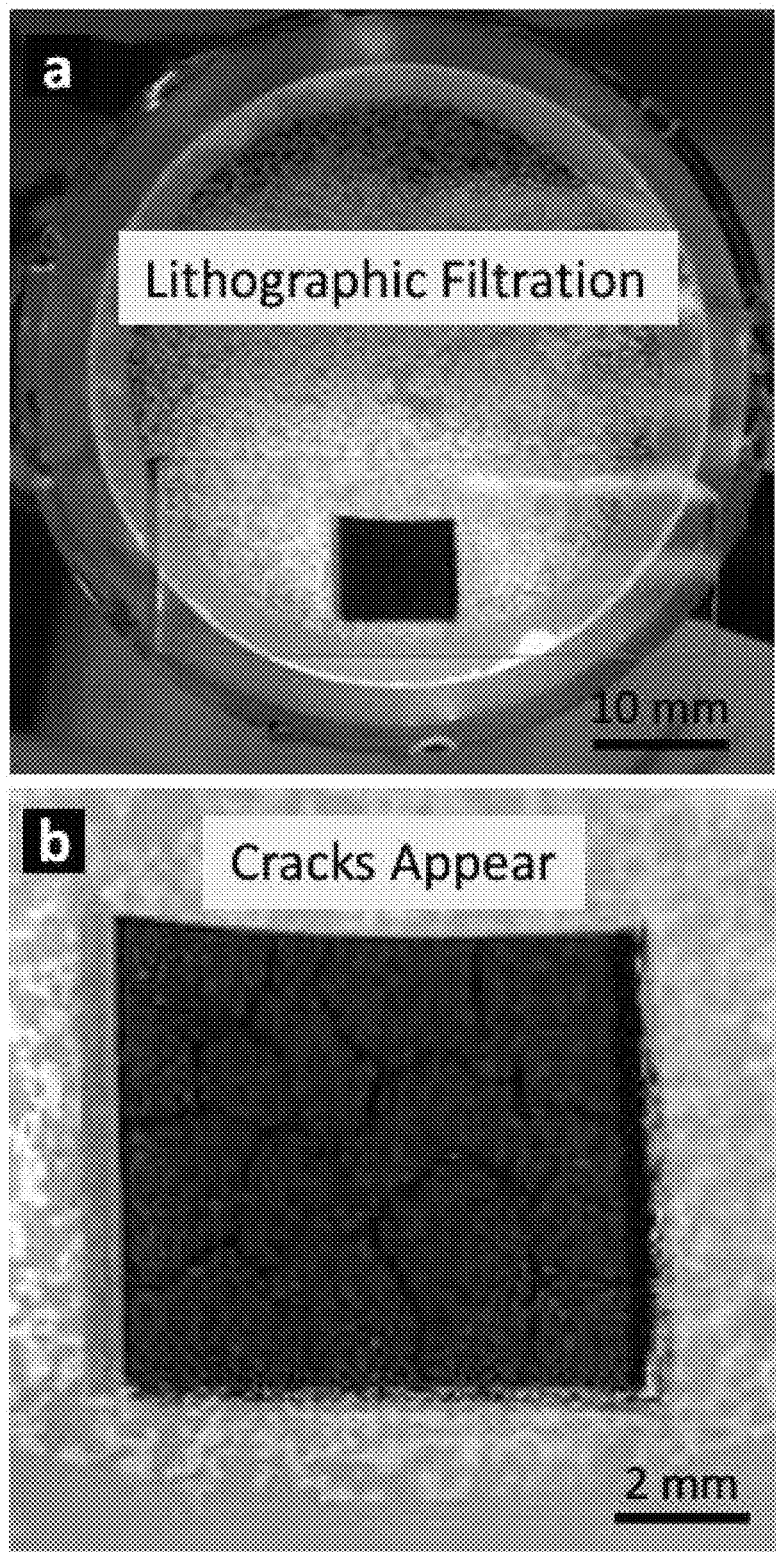
FIG. 28(A) to (C) depict filtration of pure graphene film without nanocellulose addition. The pure graphene film would crack when dried and can be easily damaged by gentle rinsing.
FIG. 28(D) to (F) depict significantly improved processability of graphene film with nanocellulose addition. The mechanical properties are improved such that the membrane may be picked up as a free-standing film.
Figure 28:
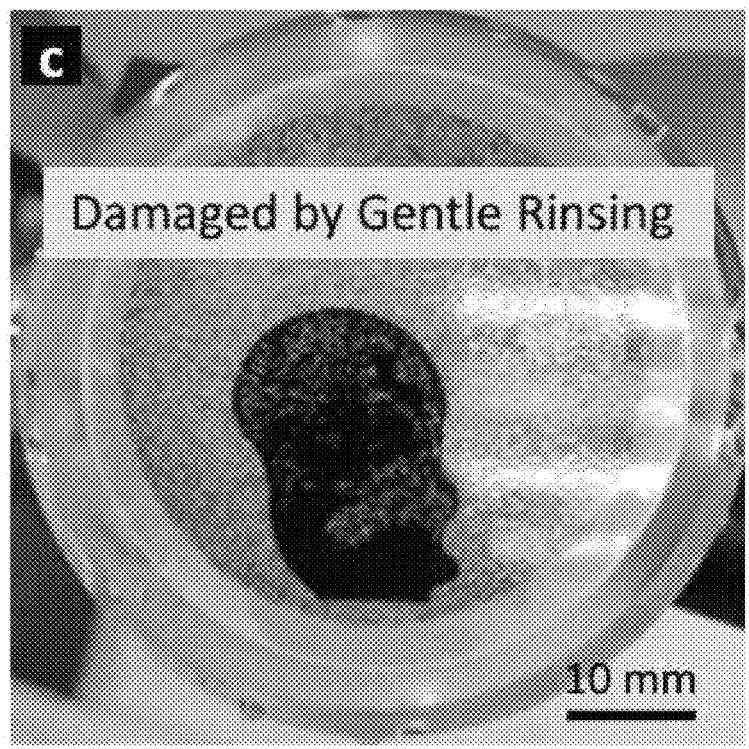
Figure 28:
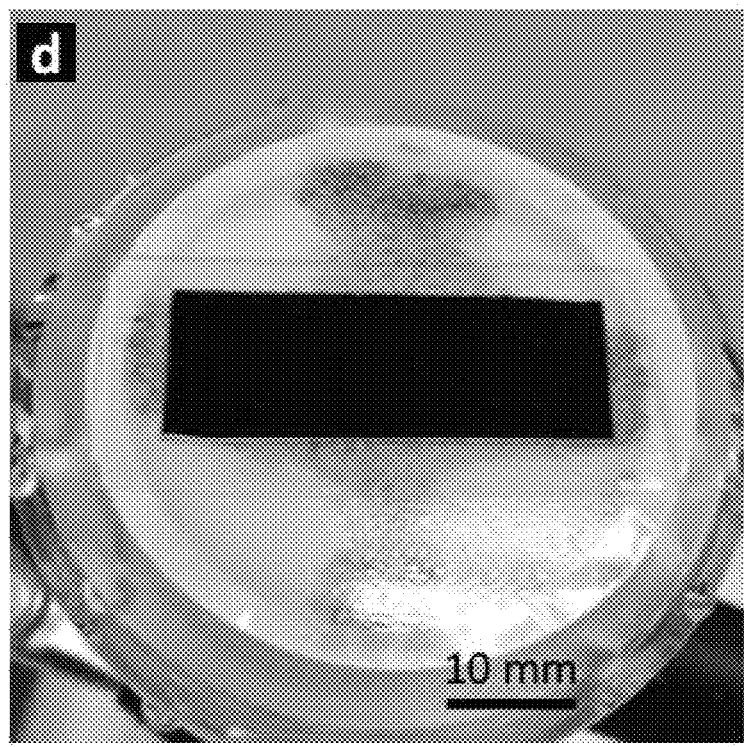
Figure 28:
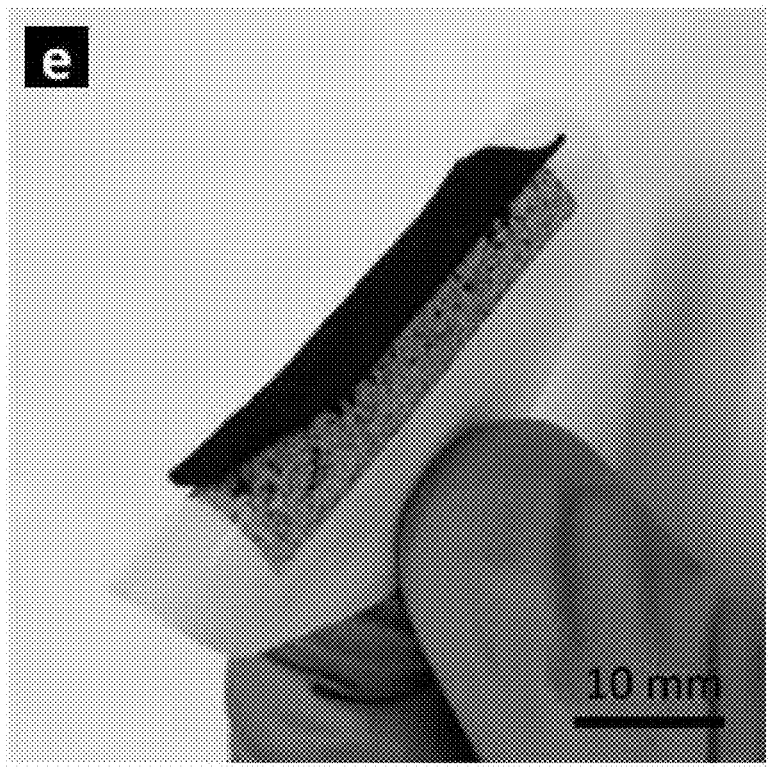
Figure 28:

Mechanical strength of the composite nanopaper was significantly improved as compared with the loosely packed pure graphene film without nanocellulose addition (FIG. 28), which tend to crack and delaminate from the filter membrane and prohibit their further processing into stretchable form.

A graphene to nanocellulose weight ratio of 1:1 (graphene content 50 wt %) was found to be suitable for strain sensing applications. No observable performance variations were found when the graphene content was varied in the range of 33 wt % (1:2) and 67 wt % (2:1). However, further variations beyond this range were found to be detrimental to device performances.

For example, the nanopaper became quite rigid when the graphene content was decreased to 17 wt % (1:5) and exhibited poor stretchability (easy to crack and fracture). The composite nanopaper behaved like pure graphene film when the graphene content was increased to 83 wt % (5:1) and exhibited poor processability.

Figure 29:
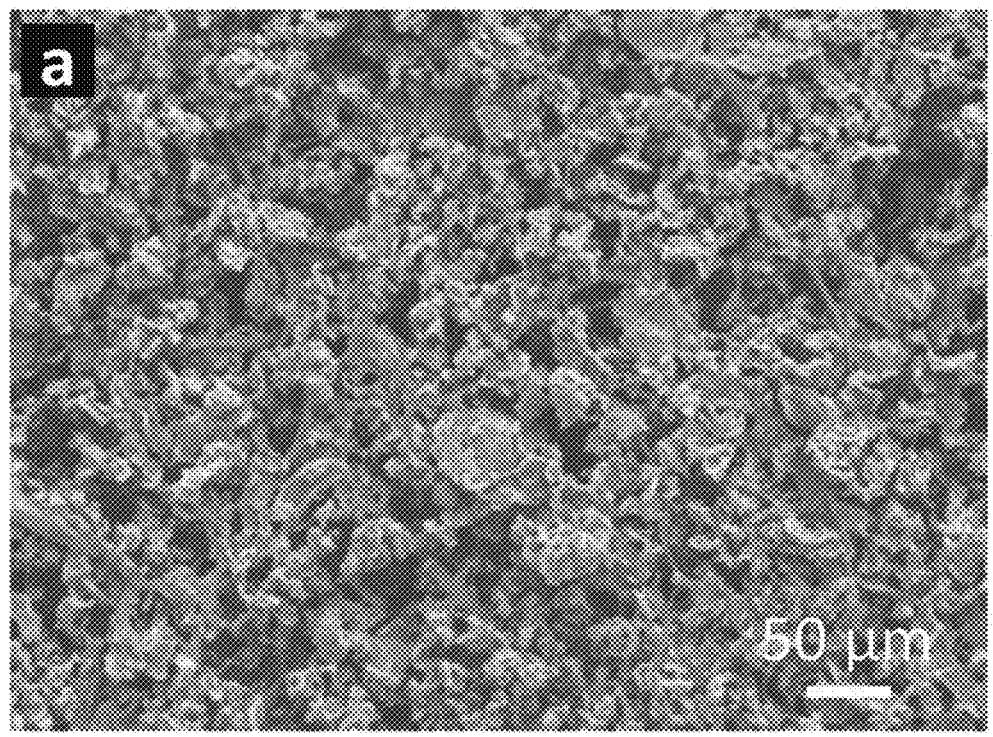
FIG. 29 depicts structural characterizations of the flexible and stretchable nanopapers. (A) to (C) are top view SEM images of flexible nanopaper showing the macroporous structure based on crumpled graphene and nanocellulose. (D) is cross-sectional view showing that the flexible nanopaper is porous throughout the entire thickness. (E) and (F) show top view and cross-sectional view of the stretchable nanopaper with fully embedded structure.
Figure 29:
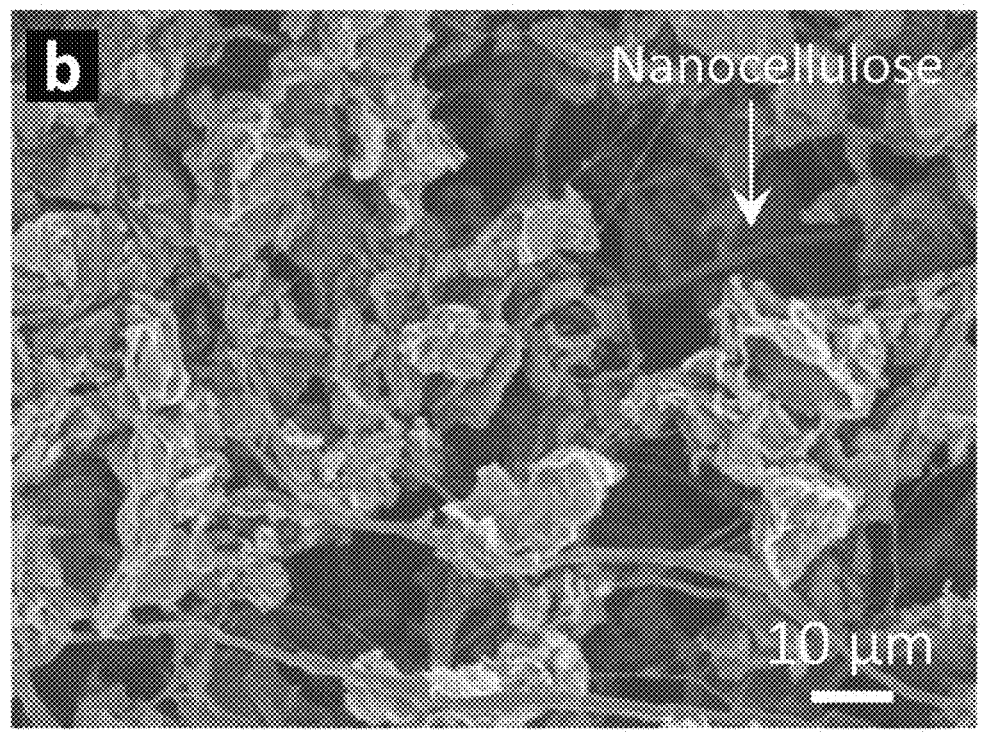
Figure 29:
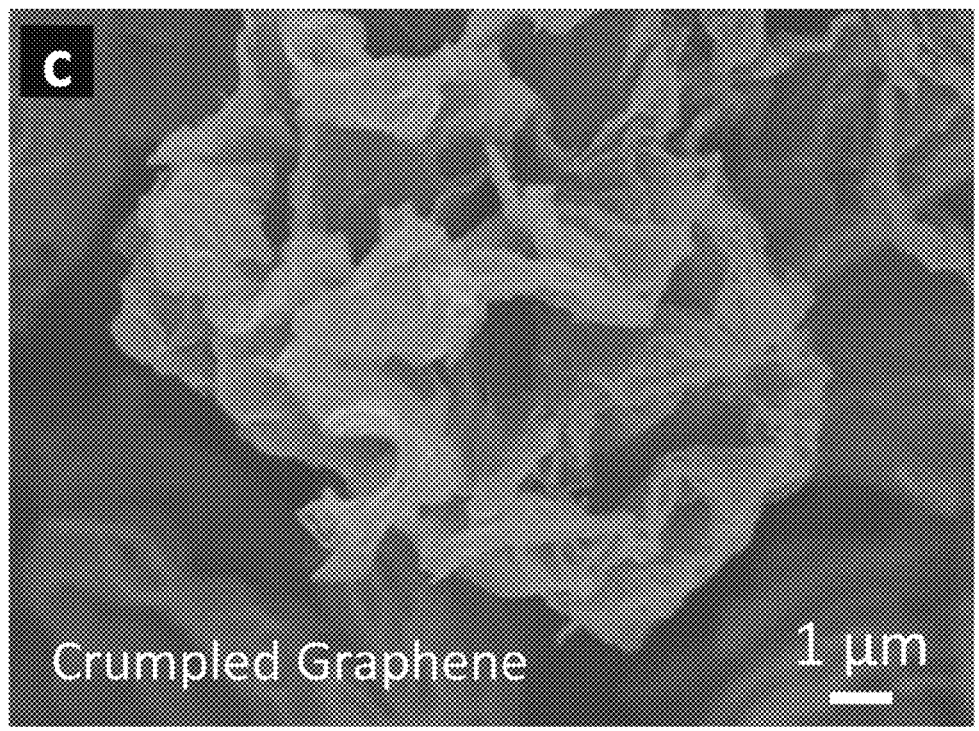
Figure 29:
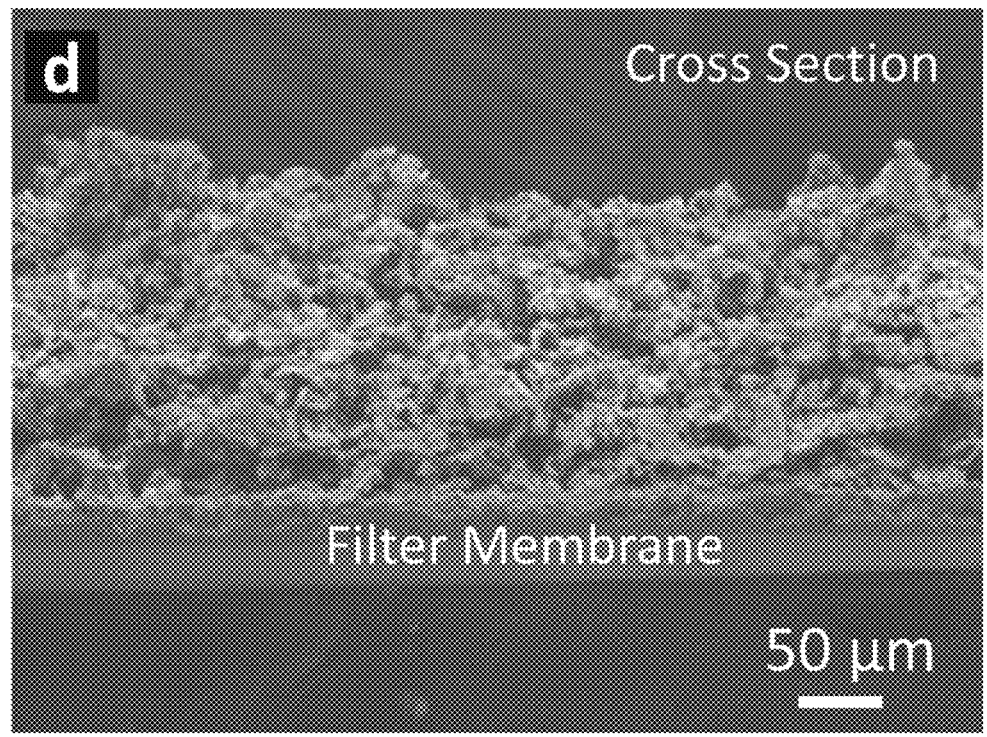
Figure 29:
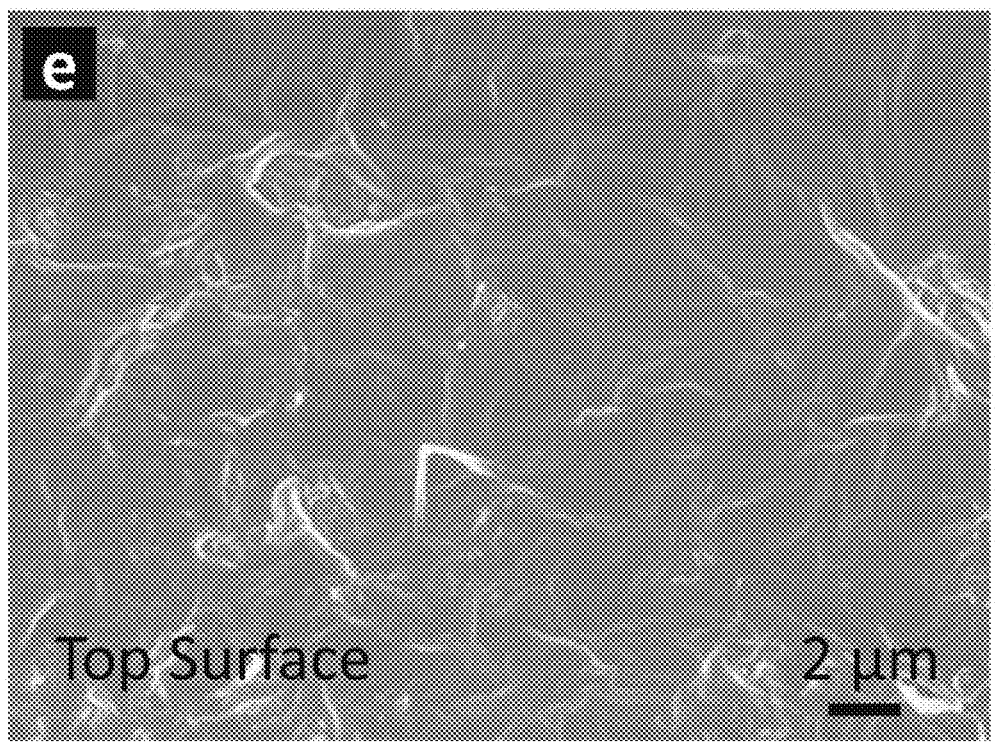
Figure 29:
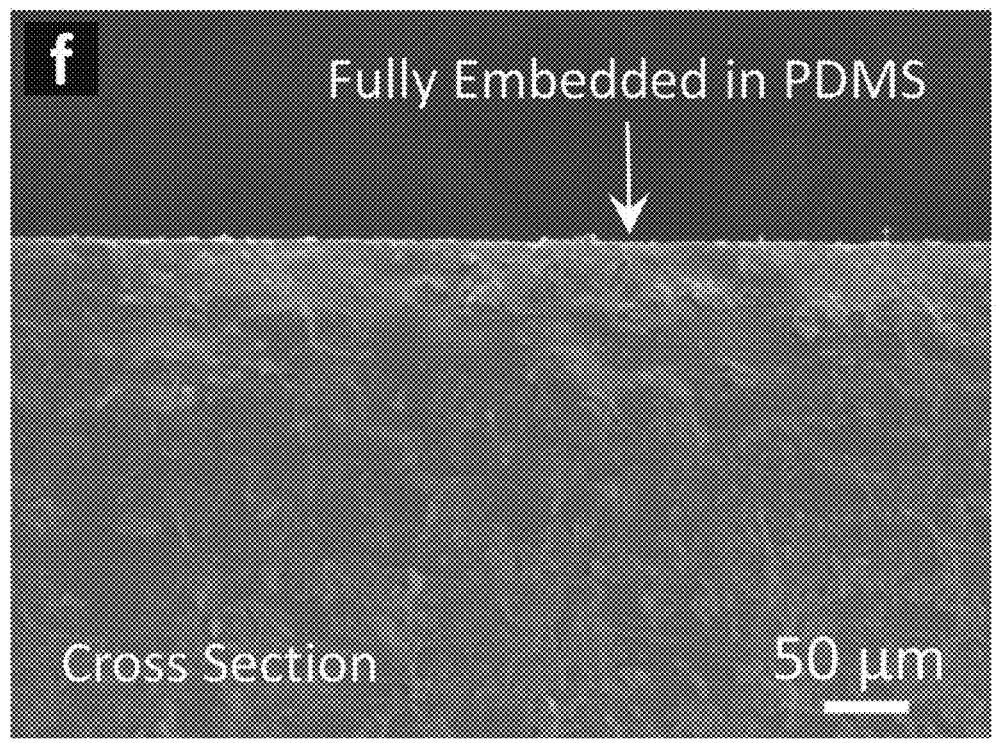

Representative images of the stretchable graphene nanopapers are shown in FIGS. 27(D) and (E). Successful embedding into the elastomer matrix is only possible for the crumpled graphene nanopaper with 3D macroporous structure (FIG. 29). FIG. 27(F) shows a straightforward comparison demonstrating the structural differences of crumpled graphene nanopaper, planar graphene paper and commercial graphite paper. Deionized (DI) water was dropped on top of the respective paper substrates, and the water droplet on crumpled graphene nanopaper was quickly adsorbed suggesting the porous nature of the nanopaper, however, substrates made of planar graphene and commercial graphite are compact and do not allow efficient liquid penetration (FIG. 27(F)). Fabrication of stretchable graphene structures for high-strain sensors was found to be only feasible for the macroporous nanopaper from crumpled graphene and nanocellulose composite.

Scanning electron microscopy (SEM) characterizations of the flexible and stretchable nanopapers are shown in FIG. 29. Top view SEM images (FIG. 29(A) to (C)) clearly revealed the rough and porous surface of the nanopaper from crumpled graphene.

Figure 30:
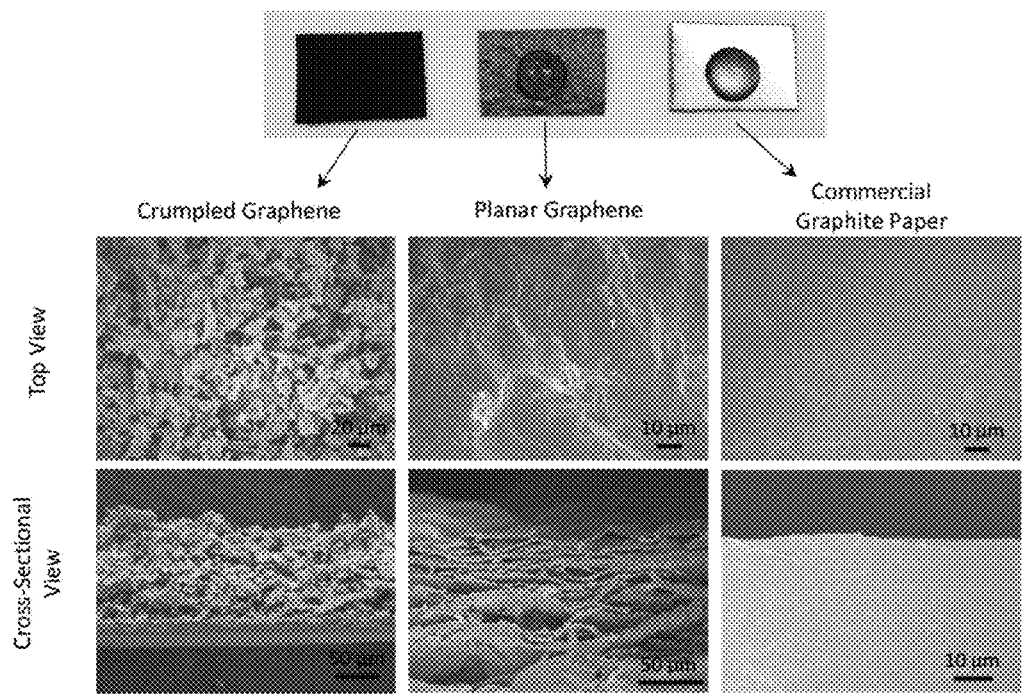
FIG. 30 shows top view and cross-sectional SEM characterizations of crumpled graphene paper, planar graphene paper and commercial graphite paper. Crumpled graphene nanopaper showed 3D macroporous structure which allows efficient liquid penetration. However, the compact surfaces of planar graphene bulky paper and commercial graphite paper do not allow PDMS penetration and cannot be embedded in elastomer matrix.

However, SEM characterizations of the planar graphene paper and commercial graphite paper showed compact top surfaces which prohibited elastomer infiltration and embedding (FIG. 30). A representative high magnification view of the crumpled graphene is shown in FIG. 29(C). Although sizes and morphologies of the crumpled graphene are not as uniform as those graphene balls, the heavily wrinkled structures have similar effects in constructing loosely-stacked films with sufficient void spaces for liquid penetration, in contrast to planar graphene paper where the flat nanosheets tend to be closely packed to minimize the surface energy.

Cross-sectional view of the nanopaper is shown in FIG. 29(D). The nanopaper maintains its porous structure throughout the entire thickness, ensuring that the flexible nanopaper can be fully embedded in the elastomer matrix, which was verified by SEM characterizations of the samples after PDMS infiltration (top view in FIG. 29(E) and cross-sectional view in FIG. 29(F)).

Figure 31:
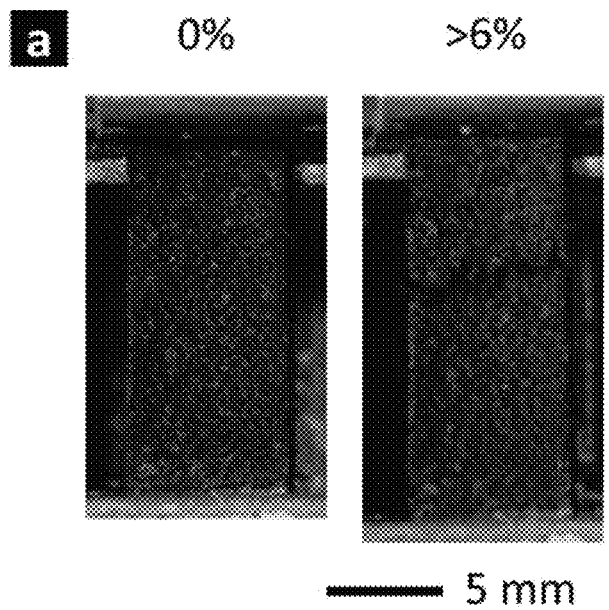
FIGS. 31(A) and (B) shows that flexible nanopaper can only sustain a very limited strain of 6% as in (A), but stretchable nanopaper can be stretched up to 100% (mechanical fracture limit of the PDMS substrate) as in (B).
FIGS. 31(C) and (D) depict plots of relative resistance change as in (C) and gauge factors versus strain as in (D) for flexible nanopaper, stretchable nanopaper as well as stretchable CNT (blue circles) and AgNW (pink triangles) electrodes.
Figure 31:
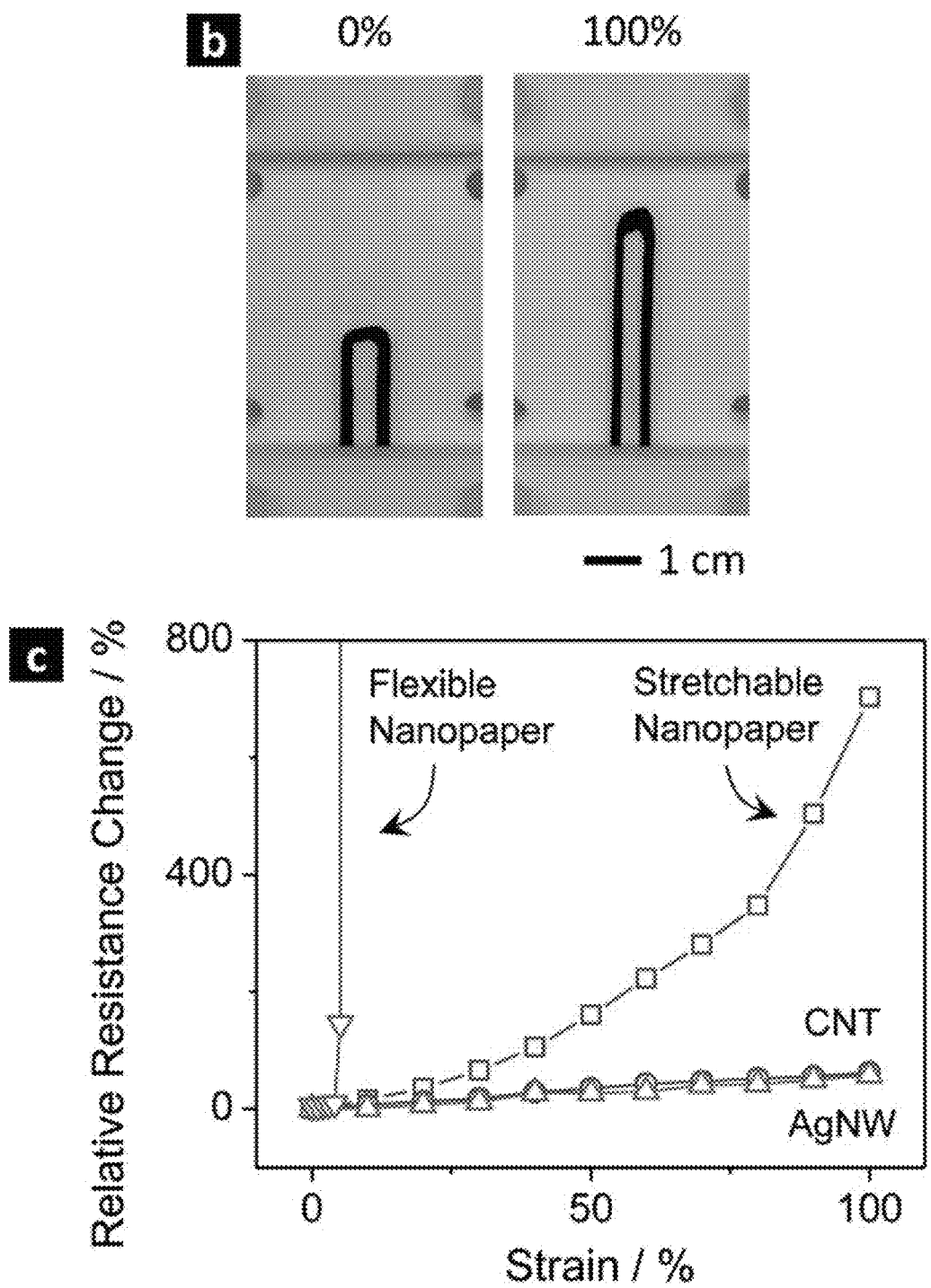
Figure 31:
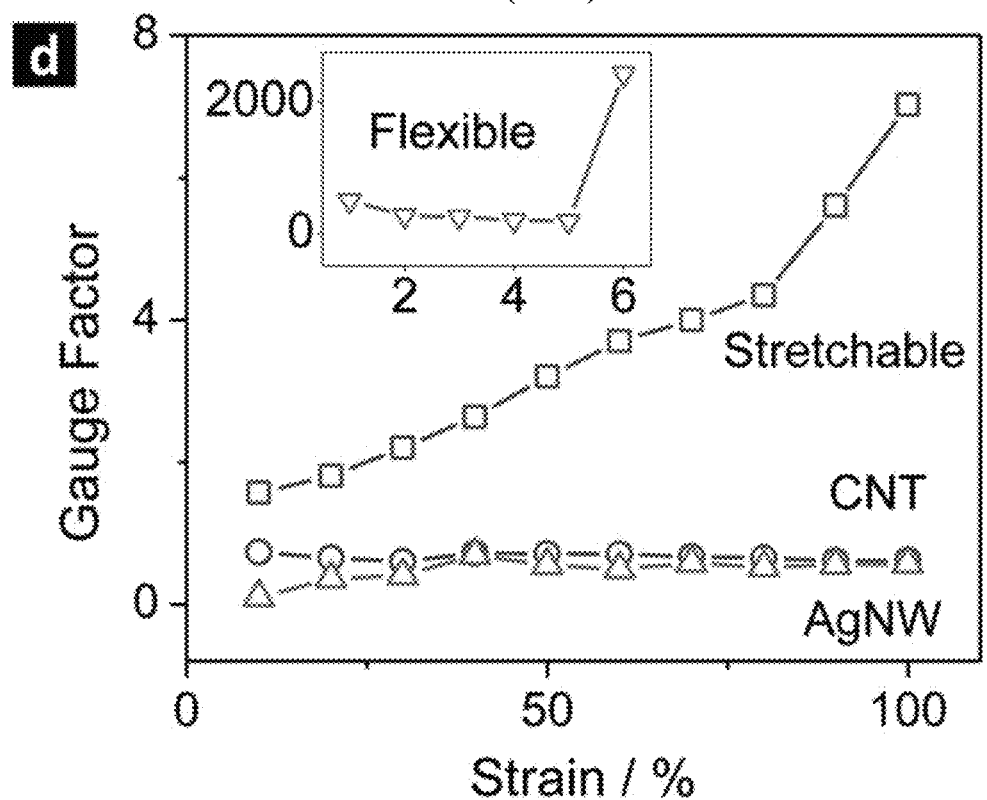

Comparative strain sensing properties of the flexible and stretchable nanopapers are shown in FIG. 31. Relative resistance changes versus strains are shown in FIG. 31(C). Nanopapers in flexible form can only be stretched to a very limited extend (maximum 6% strain) and will break upon further stretching (FIG. 31(A)), resulting in an infinite resistance change (FIG. 31(C)). On the contrary, the stretchable nanopaper can be stretched up to 100% without mechanical failure (FIG. 31(B)), a significantly improved stretchability after PDMS embedding. Note that the stretchability is only limited by the mechanical fracture limit of PDMS, which is thickness-dependent and was found to be ca. 100% for substrates of 1 mm thick in embodiments. The stretchability can be further improved by using elastomer substrates with higher stretchability such as Ecoflex which can be stretched to 300%. A relative resistance change $[(R-R_0)/R_0, R_0$ is the resistance at 0% strain] of 710% was observed at 100% strain for stretchable nanopapers. 1D nanostructures such as carbon nanotubes (CNTs) and silver nanowires (AgNWs) were widely used as elastic conductors in stretchable electronics.

Figure 32:
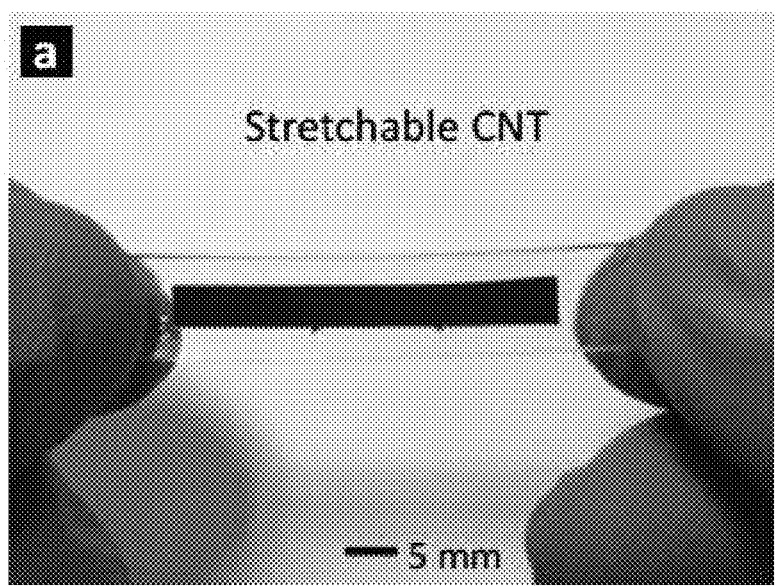
FIG. 32 shows images and SEM characterizations of stretchable (A to C) carbon nanotube (CNT) electrode; and (D to F) AgNW electrodes, Both top view and cross-sectional view SEM images are shown. It is evident that all the CNT and AgNWs are fully embedded in the PDMS matrix, ensuring excellent stretchability of the electrodes up to 100%.
Figure 32:
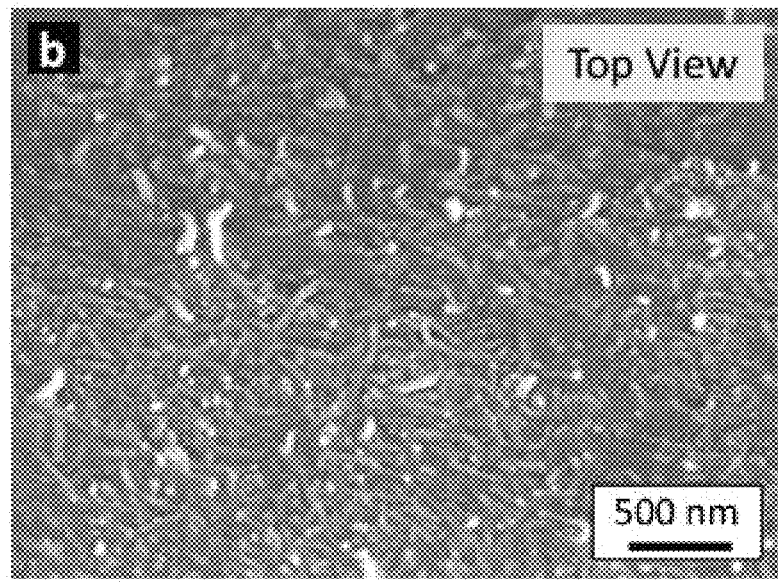
Figure 32:
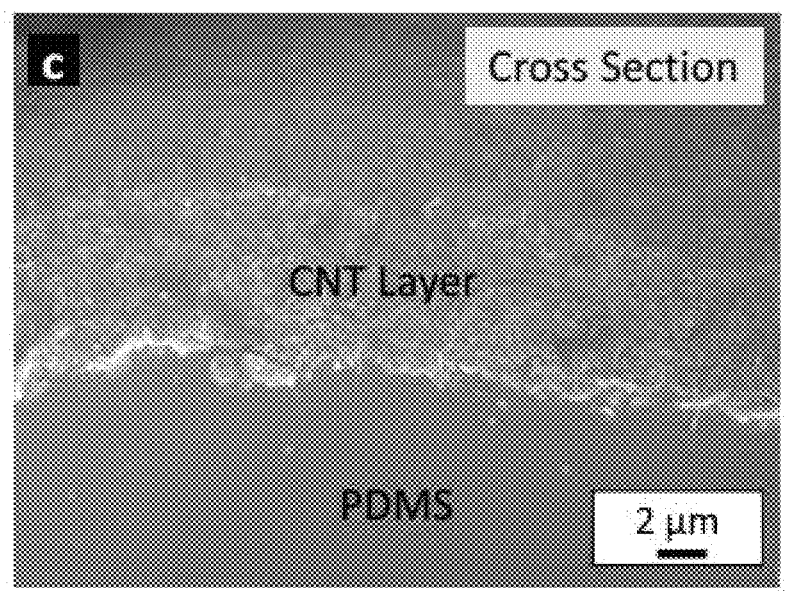
Figure 32:
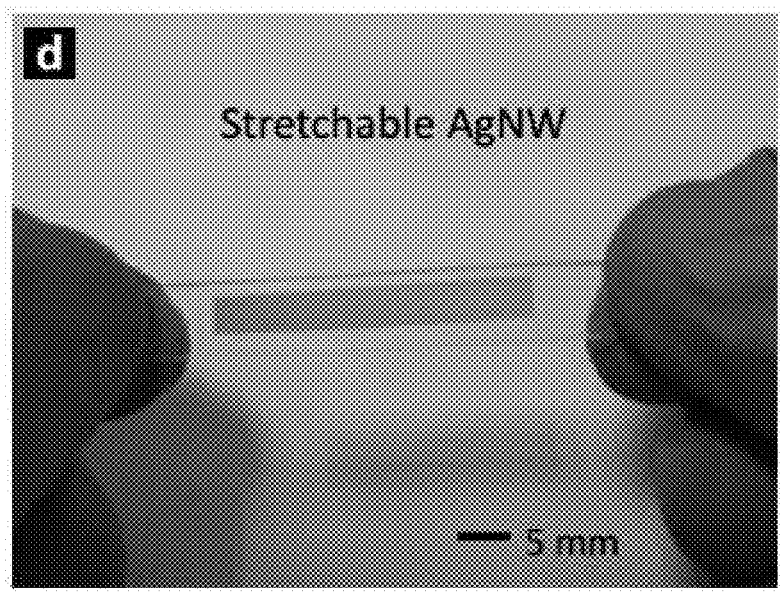
Figure 32:
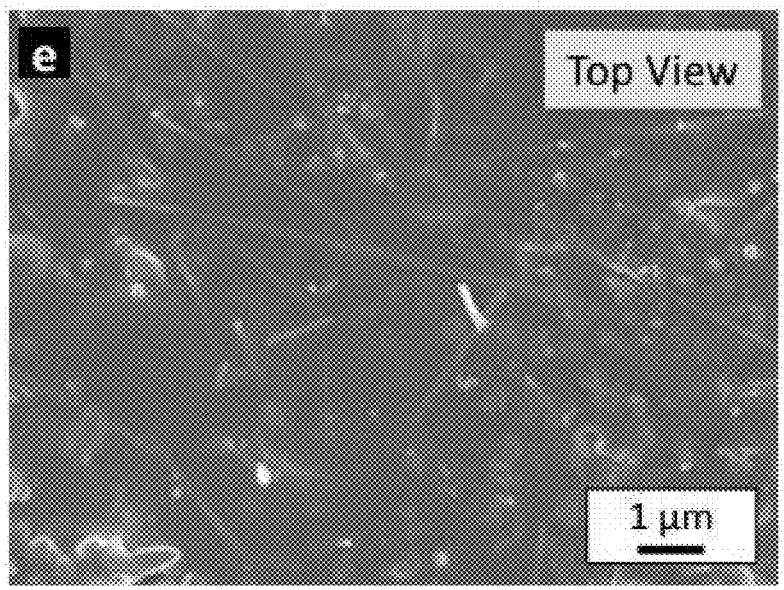
Figure 32:
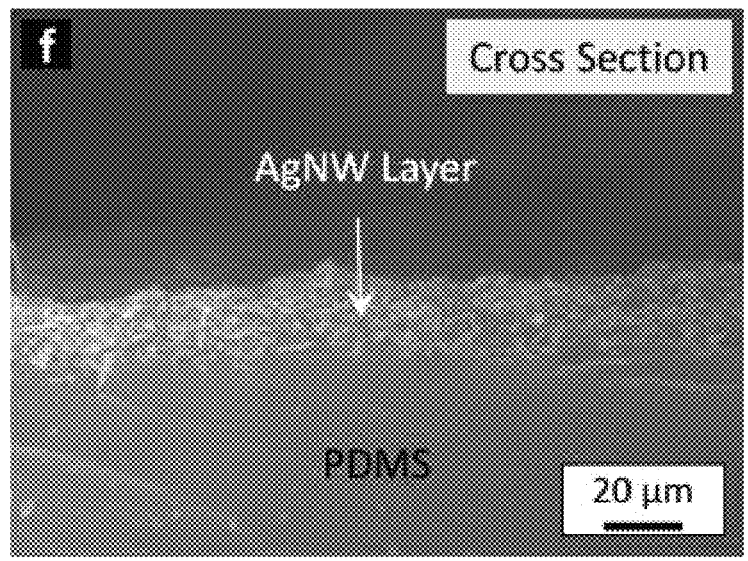

For comparison, stretchable CNT and AgNW electrodes with fully embedded structures (FIG. 32) were also fabricated and compared with graphene nanopaper, as shown in FIG. 31C. The relative resistance changes of CNT and AgNW electrodes are much less prominent than stretchable graphene nanopaper and only ca. 60% resistance changes were observed at 100% strain. While it is desirable to minimize the resistance changes upon stretching when they are used as electrodes to maintain consistent device performances, the requirements are essentially the opposite for strain sensor applications, where higher resistance changes are pursued to improve the sensitivity. It is suggested herein that stretchable graphene nanopapers with greater than 10 times higher relative resistance change (at 100% strain) are superior candidates for strain sensing applications, considering the significantly improved piezoresistive responses than their 1D counterparts such as CNTs and AgNWs.

Piezoresistive effects of elastic conductors arise primarily from two aspects: i) intrinsic piezoresistivity of the filler; ii) piezoresistivity due to the change of the contact conditions for electron conduction, such as break of contacts, contact area and spacing variations upon stretching, etc. The intrinsic piezoresistivity of monolayer and few-layer graphene has been demonstrated. However, the hexagonal mesh of graphene can only be stretched to ca. 6% before fracture thus the intrinsic piezoresistivity will not be the dominant effect for stretchable nanopapers disclosed herein with ultrahigh stretchability up to 100%.

The stretchable graphene nanopaper is composed of stacked crumpled graphene with quasi-spherical morphology. The graphene "spheres" separate apart from each upon stretching, leading to smaller contact areas, larger interspacings or even break of contacts at high strains, all of which contributes to the resistance increase upon stretching. The distinct piezoresistive behaviors of CNT and AgNW elastic conductors may be understood based on the structure-dependent percolative contacting behaviors. CNTs and AgNWs in the percolative film have much more contacting nodes with each other owing to the high aspect ratio of 1D structures. Upon stretching, the strains can be efficiently accommodated by the intersliding and rearrangement of NWs but meanwhile sufficient contacting nodes are well maintained.

Consequently, smaller resistance changes were observed for CNT and AgNW elastic conductors as compared with graphene nanopapers. Gauge factor is a characteristic parameter representing the sensitivity of the strain sensors and can be derived from $(R-R_0)/(R_0\epsilon)$, where $\epsilon$ is the strain.

Gauge factors as a function of strains for the four types of elastic electrodes are shown in FIG. 31(D). The gauge factors for stretchable nanopaper increased from 1.6 at 10% strain to 7.1 at 100% strain. The relatively higher gauge factor upon further stretching arises from the more severe separation between crumpled graphene at higher strain. However, the stretchable CNT and AgNW electrodes maintained relatively low gauge factors (ca. 0.65 for CNT and ca.

0.5 for AgNW) within the strains of 0% to 100%. Although flexible nanopapers exhibit much higher gauge factors from 502 at 1% strain to 2427 at 6% strain (FIG. 31(D) inset), the limited stretchability (6%) restricts their applications for high strain detections.

The gauge factors for stretchable graphene nanopaper disclosed herein (achieved greater than 7 at 100% strain) are comparable with previous graphene-based strain sensors. For example, buckled graphene on elastomer substrates (stretchability 25% to 30%) exhibited gauge factors in the range of 2 to 4. Graphene foam showed a gauge factor of ca. 2 at the maximum strain. Higher gauge factors were reported but only for devices with very limited stretchability, analogous to our flexible nanopaper. For example, a gauge factor of 300 was reported for nanographene film deposited on mica substrate, although the stretching limit was as low as 0.4%.

Figure 33:
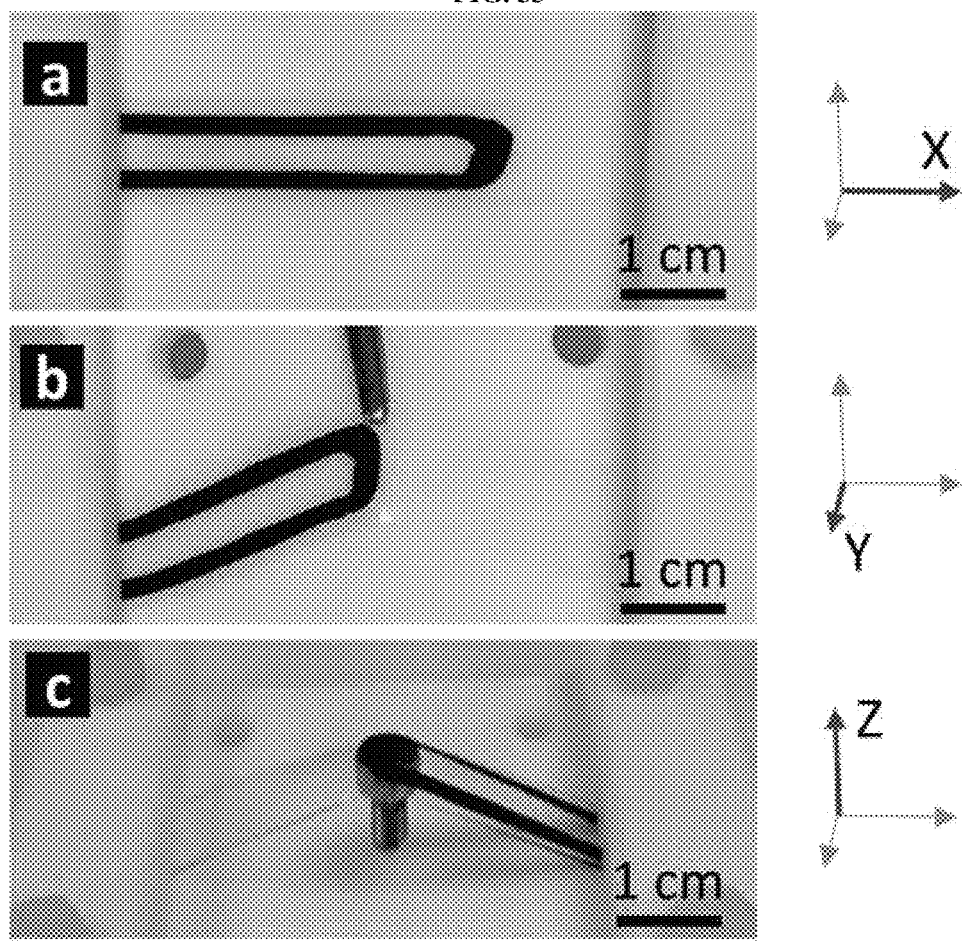
FIG. 33(A) to (C) are example images of the graphene nanopaper sensors stretched in the X-, Y- and Z-directions.
FIG. 33(D) shows corresponding response curves for stretching in the three directions.
Figure 33:
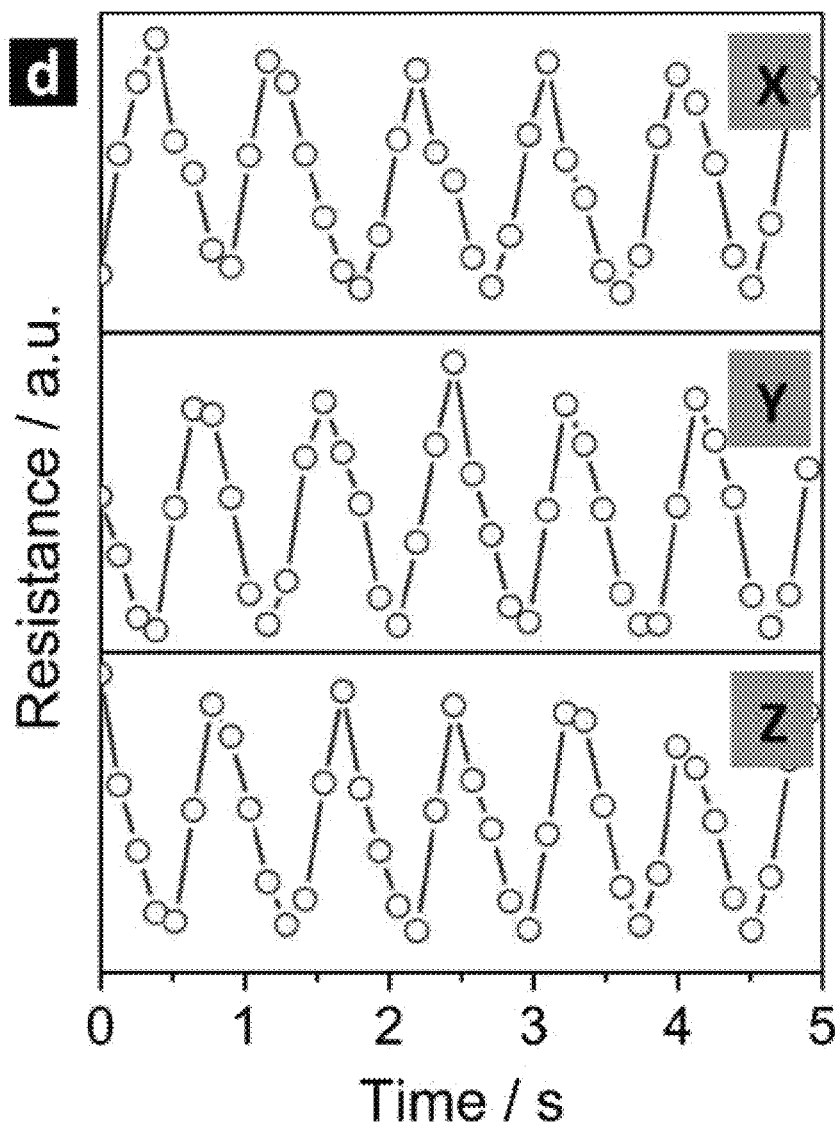

The stretchable graphene nanopaper sensors are capable of all-directional sensing. Example images showing the strains from the X, Y and Z directions are shown in FIG. 33(A) to (C), respectively. Corresponding response behaviors of the strain sensors are shown in FIG. 33(D). Efficient tracing and detection of strain variations from all directions is evident. The soft nature of elastomer substrates allows the deformation and hence successful detection of strains from all directions, which is of critical importance for applications like human-motion detection. For example, the simple movements of human fingers would naturally generate strain from three dimensions. However, proper 3D strain detection cannot be achieved using conventional strain sensors based on metal and semiconductors or previous graphene sensors based on flexible but not stretchable substrates.

The capability of all-directional sensing also allows the efficient detection of a variety forms of forces beyond uniaxial strain, such as torsion force, shearing force, compression force, etc.

Figure 34:
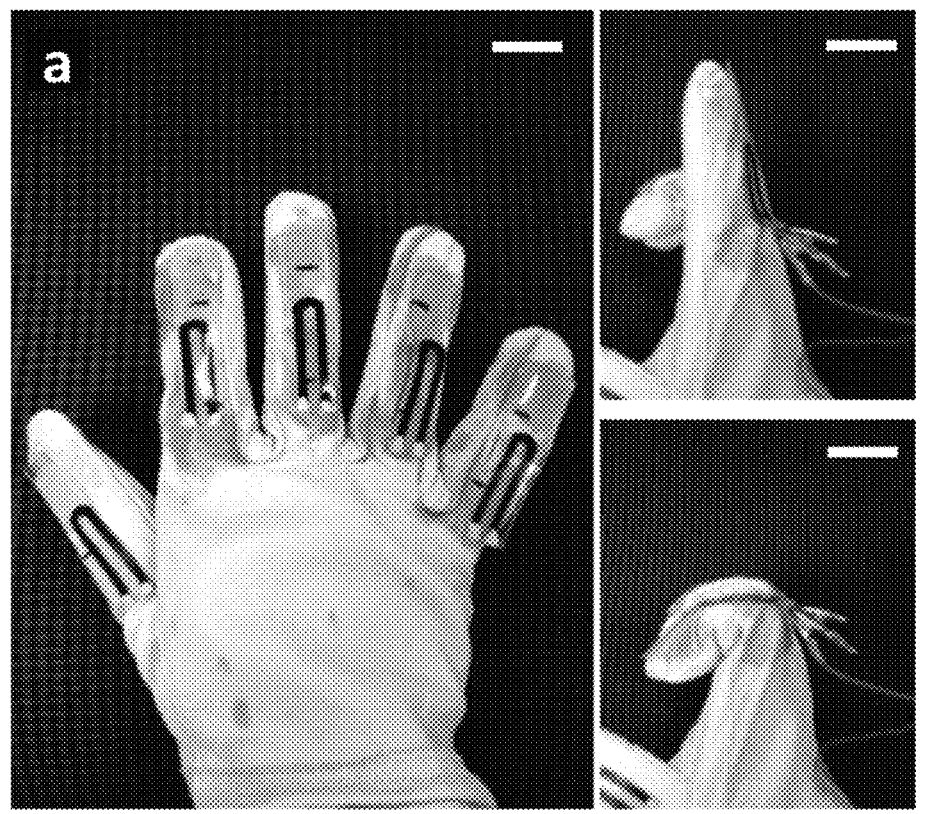
FIG. 34 shows wearable strain sensors for finger movement detections.
Figure 34:
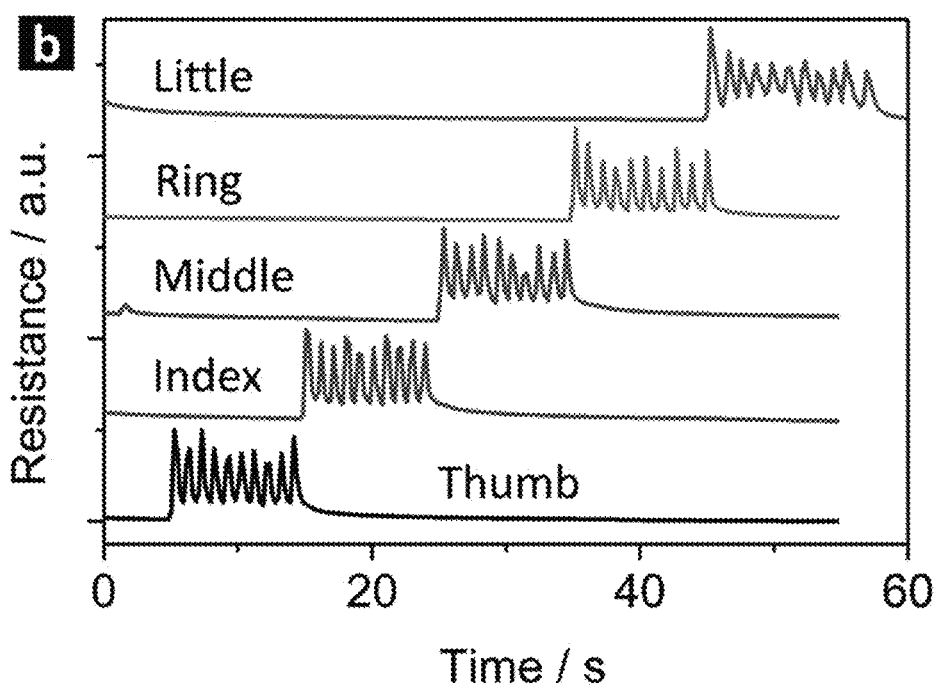

Application of the graphene strain sensors for human motion detection is demonstrated. The proof-of-concept device includes five independent sensors implanted on a feather glove to detect the bending and stretching of fingers. An overview image of the data glove and images showing the stretching and bending states of fingers are shown in FIG. 34(A). The sensors were designed into U-shaped to facilitate electrical measurements. FIG. 34(B) shows the response behaviors of the strain sensors when the fingers were repeatedly bended and stretched at a frequency of 1 Hz. Measured strains for the five independent strain sensors during finger movements lied in the graphite paper do not allow facile liquid infiltration and thus cannot be embedded in elastomer matrix to obtain stretchable structures. Nanocellulose was found to be an efficient, low cost and green "binder" to enhance the processability of crumpled graphene. Unlike bulky paper from close-packed planar graphene flakes, crumpled graphene has much weaker interactions due to the quasi-spherical morphologies and the filtered film cannot be picked up as a free-standing paper.

It has been shown herein that the mechanical strength may be significantly improved with the addition of nanocellulose. The enhancement effects primarily originate from the physical binding forces of the 1D nanocellulose fibrils since 1D nanostructures within an entangled film (such as CNT bulky paper) were shown to have strong mechanical interactions. Contributions of chemical binding forces between the surface functional groups are expected to play a less dominant role considering the limited contact areas of nanocellulose fibrils and crumpled graphene, as shown in FIG. 29(B). The stretchable graphene nanopapers are greater than 10 times more sensitive than devices based on 1D nanomaterials, such as CNTs and AgNWs. While there are significantly more contacting nodes in the percolating networks of 1D nanomaterials, they show less prominent resistance change upon stretching as compared with crumpled graphene. Compared with conventional strain sensors, graphene nanopapers disclosed herein have much higher strain detection limits and are capable of all-directional strain sensing, which are critical requirements for emerging human-interactive applications. The methodology disclosed herein yields graphene nanopapers that may be stretched up to 100% and was only limited by the stretchability of PDMS substrate. There are very few reports on graphene strain sensors that are capable for the detection of high-strain exceeding 50%.

Representative reports on graphene strain sensors are summarized in TABLE 1.

TABLE 1

| Strain Sensor | Max Strain/% | Ref. |
|---|---|---|
| Graphene-PVDF Composite on aluminium | 0.1 | [1] |
| Few-layer graphene on $SiO_2$/Si | 0.1 | [2] |
| Graphene nanoplatelets-CNT composite on PET | 0.2 | [3] |
| Graphene-PVDF Composite on aluminium | 0.3 | [4] |
| Few-layer graphene on mica | 0.4 | [5] |
| Free-standing graphene macrofilm | 0.8 | [6] |
| Free-standing graphene-epoxy composite | 1 | [7] |
| Few-layer graphene on PDMS | 1 | [8] |
| Percolative graphene film on PET | 1.7 | [9] |
| Graphene nanoplatelets-CNT composite bulky paper | 2 | [10] |
| Suspended graphene nanoribbon | 3 | [11] |
| Graphene monolayer on PDMS | 4.5 | [12] |
| Few-layer graphene on PDMS | 7.1 | [13] |
| Graphene woven fabric in PDMS | 10 | [14] |
| Graphene ripple on PDMS, by mechanical exfoliation | 25 | [15] |
| Graphene ripple on PDMS, by CVD | 30 | [16] |
| Graphene nanoplatelets-CNT composite in PDMS | 40 | [17] |
| Graphene foam in PDMS | 95 | [18] |
| Graphene nanopaper | 100 | This Work |

References:
[1] V. Eswaraiah, K. Balasubramaniam, S. Ramaprabhu, Nanoscale 2012, 4, 1258.
[2] X. Chen, X. Zheng, J.-K. Kim, X. Li, D.-W. Lee, J. Vac. Sci. Technol. B 2011, 29, 06FE01.
[3] S. Luo, T. Liu, Adv. Mater. DOI: 10.1002/adma.201301796.
[4] V. Eswaraiah, K. Balasubramaniam, S. Ramaprabhu, J. Mater. Chem. 2011, 21, 12626.
[5] J. Zhao, C. He, R. Yang, Z. Shi, M. Cheng, W. Yang, G. Xie, D. Wang, D. Shi, G. Zhang, Appl. Phys. Lett. 2012, 101, 063112.
[6] X. Xie, H. Bai, G. Shi, L. Qu, J. Mater. Chem. 2011, 21, 2057.
[7] Y.-J. Kim, J. Y. Cha, H. Ham, H. Huh, D.-S. So, I. Kang, Curr. Appl. Phys. 2011, 11, S350.
[8] Y. Lee, S. Bae, H. Jang, S. Jang, S.-E. Zhu, S. H. Sim, Y. I. Song, B. H. Hong, J.-H. Ahn, Nano Lett. 2010, 10, 490.
[9] M. Hempel, D. Nezich, J. Kong, M. Hofmann, Nano Lett. 2012, 12, 5714.
[10] S. H. Hwang, H. W. Park, Y. B. Park, Smart Mater. Struct. 2013, 22, 015013.
[11] M. Huang, T. A. Pascal, H. Kim, W. A. Goddard, J. R. Greer, Nano Lett. 2011, 11, 1241.
[12] X.-W. Fu, Z.-M. Liao, J.-X. Zhou, Y.-B. Zhou, H.-C. Wu, R. Zhang, G. Jing, J. Xu, X. Wu, W. Guo, D. Yu, Appl. Phys. Lett. 2011, 99, 213107.
[13] S.-H. Bae, Y. Lee, B. K. Sharma, H.-J. Lee, J.-H. Kim, J.-H. Ahn, Carbon 2013, 51, 236.
[14] X. Li, R. Zhang, W. Yu, K. Wang, J. Wei, D. Wu, A. Cau, Z. Li, Y. Cheng, Q. Zheng, R. S. Ruoff, H. Zhu, Sci. Rep. 2012, 2, 870.
[15] Y. Wang, R. Yang, Z. W. Shi, L. C. Zhang, D. X. Shi, E. Wang, G. Y. Zhang, ACS Nano 2011, 5, 3645.
[16] K. S. Kim, Y. Zhao, H. Jang, S. Y. Lee, J. M. Kim, K. S. Kim, J. H. Ahn, P. Kim, J. Y. Choi, B. H. Hong, Nature 2009, 457, 706.
[17] C. Lee, L. Jug, E. Meng, Appl. Phys. Lett. 2013, 102, 183511.
[18] Z. P. Chen, W. C. Ren, L. B. Gao, B. L. Liu, S. F. Pei, H. M. Cheng, Nat. Mater. 2011, 10, 424.

Graphene foam exhibited a stretchability of 95%, but the fabrication method is expensive, time-consuming and has low yield. It has been shown herein that high performance strain sensors can be produced in a low-cost, facile, and scalable manner with solution-processable graphene and nanocellulose.

In conclusion, an innovative method for the fabrication of high-strain sensors based on crumpled graphene and nanocellulose has been disclosed herein. Free-standing flexible nanopapers were fabricated using vacuum filtration method and the 3D macroporous structure enables their successful embedding in elastomer matrix to obtain stretchable nanopapers. The stretchability was successfully improved from 6% for flexible nanopaper to 100% for stretchable nanopaper. The high-strain sensors based on stretchable nanopaper exhibited a gauge factor of 7.1 at 100% strain, which is greater than 10 times higher than stretchable CNT and AgNW sensors. Compared with conventional metal and semiconductor based devices, the stretchable nanopaper sensor also allows all-directional sensing which is critical for efficient human-motion detections. Prototype devices were also demonstrated by implanting graphene nanopaper sensors on data gloves for finger movement detection. The facile, low cost and readily scalable method allows practical fabrication of graphene high-strain sensors for emerging human-interactive applications.

Example 10: Fabrication Processes of Strain Gauge

Figure 35:
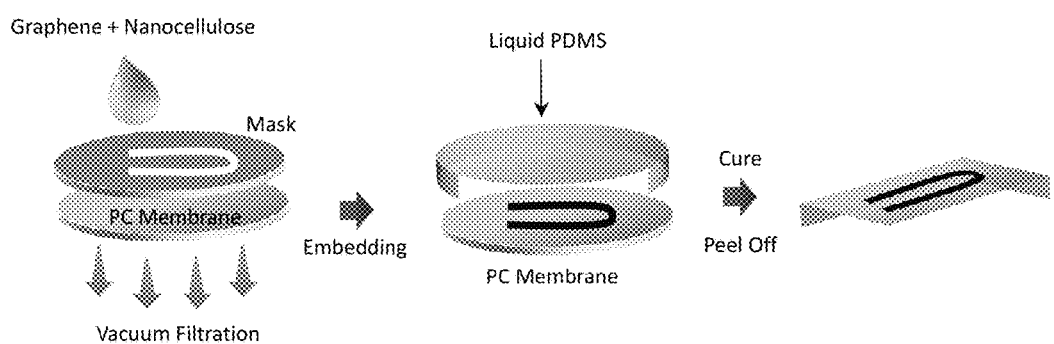
FIG. 35 shows the fabrication processes of strain gauges.
Figure 36:
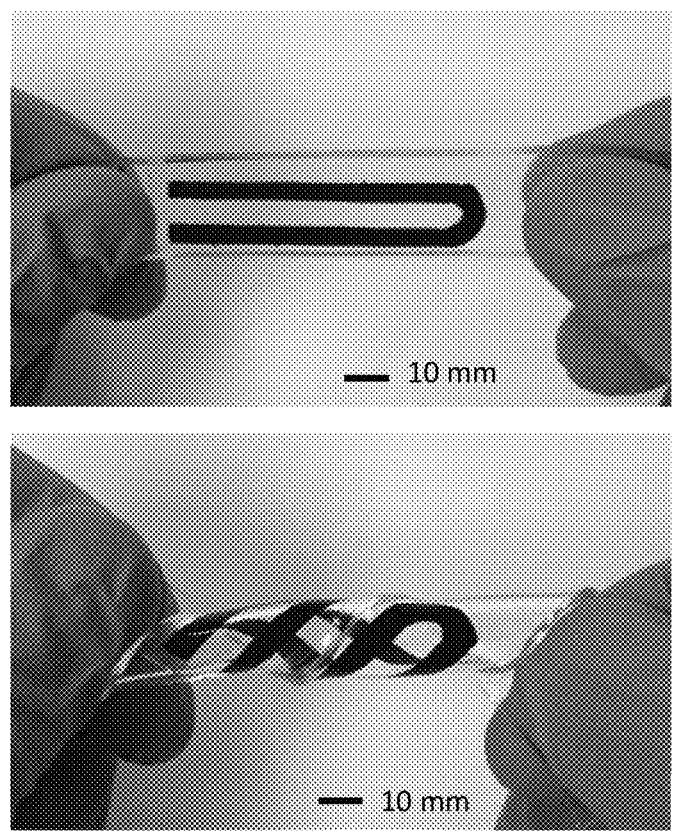
FIG. 36 shows typical samples of the U-shaped stretchable sensor

FIG. 35 shows the fabrication processes and FIG. 36 are examples of the strain gauges.

A mask is applied onto the PC filter membrane for filtration. The mask is made into U-shaped for easy device testing purpose. The source solution is mixed graphene and nanocellulose in water. After filtration, a U-shaped film is obtained on the filter membrane. The film is dried naturally in air. Liquid PDMS is poured on top of the graphene/nanocellulose film and cured in a furnace (60° C., 2 h). After curing, the liquid PDMS is solidified and can be peel off from the PC filter membrane. The graphene/nanocellulose was successfully embedded into the PDMS matrix and became highly stretchable. Typical samples of the U-shaped stretchable sensor are shown in FIG. 36.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of manufacturing a flexible electronic device, the method comprising
    filtering a mixture comprising an electrically conducting nanostructured material through a membrane such that the electrically conducting nanostructured material is deposited on the membrane;
    depositing an elastomeric polymerisable material on the electrically conducting nanostructured material deposited on the membrane and curing the elastomeric polymerisable material thereby embedding the electrically conducting nanostructured material in an elastomeric polymer thus formed; and
    separating the elastomeric polymer with the embedded electrically conducting nanostructured material from the membrane to obtain the flexible electronic device.

2. The method according to claim 1, wherein the electrically conducting nanostructured material comprises (i) graphene; (ii) nanocellulose; (iii) Ag nanowires; (iv) ZnO nanowires, or combinations thereof.

3. The method according to claim 1, wherein the membrane is selected from the group consisting of polycarbonate membrane, glass fiber membrane, mixed cellulose ester (MCE) membrane, Nylon membrane, polyethersulfone (PES) membrane, polypropylene (PP) membrane, polytetrafluoroethylene (PTFE) membrane, and a polyvinylidene fluoride (PVDF) membrane.

4. The method according to claim 1, wherein the elastomeric polymerisable material comprises or consists of monomers or prepolymers selected from the group consisting of (poly)siloxanes, (poly)epoxides, polysulfide rubber, (poly)urethanes, and combinations thereof.

5. The method according to claim 1, wherein filtering the mixture comprising the electrically conducting nanostructured material through the membrane comprises filtering the mixture comprising the electrically conducting nanostructured material through a patterned mask arranged on the membrane, wherein the electrically conducting nanostructured material is deposited on the membrane in a pattern defined by the patterned mask.

6. The method according to claim 5, wherein the patterned mask is arranged on the membrane such that the patterned mask and the membrane are in continuous contact with each other.

7. The method according to claim 5, wherein the patterned mask is removed from the membrane prior to depositing the elastomeric polymerisable material on the electrically conducting nanostructured material.

8. The method according to claim 7, wherein filtering the mixture comprising the electrically conducting nanostructured material through the patterned mask arranged on the membrane and removing the patterned mask prior to depositing the elastomeric polymerisable material on the electrically conducting nanostructured material is repeated one or more times to form multiple patterns on the membrane.

9. The method according to claim 5, wherein the patterned mask comprises polysiloxanes, polyepoxides, polysulfide rubber, polyurethanes, and combinations thereof.

10. The method according to claim 5, wherein the patterned mask is patterned such that the electrically conducting nanostructured material is deposited on the membrane to form an electrical circuit on the membrane.

11. The method according to claim 5, wherein the patterned mask is patterned such that the electrically conducting nanostructured material is deposited on the membrane to form a pair of electrodes on the membrane.

12. The method according to claim 11, wherein filtering the mixture comprising the electrically conducting nanostructured material through the patterned mask arranged on the membrane and removing the patterned mask prior to depositing the elastomeric polymerisable material on the electrically conducting nanostructured material is repeated once to deposit a second electrically conducting nanostructured material on the membrane, wherein the second electrically conducting nanostructured material is in electrical communication with each electrode to form a detection channel on the membrane.

13. The method according to claim 12, wherein the pair of electrodes and the detection channel are operable to function as a photodetector.

14. The method according to claim 11, wherein the electrically conducting nanostructured material comprises Ag nanowires and the second electrically conducting nanostructured material comprises ZnO nanowires.

15. The method according to claim 5, wherein the patterned mask is patterned such that the electrically conducting nanostructured material is deposited on the membrane to form an electrode on the membrane.

16. The method according to claim 15, wherein the electrode is coated with an electrically conductive layer on a surface portion of the electrode, wherein the electrically conductive layer comprises $V_2O_5$, $WO_3$, or combinations thereof.

17. The method according to claim 16, wherein the electrode having the electrically conductive layer coated thereon is operable to function as a capacitor or an electrochromic device.

18. The method according to claim 5, wherein the patterned mask is patterned such that the electrically conducting nanostructured material is deposited on the membrane to form a U-shaped sensor on the membrane.

19. The method according to claim 18, wherein the electrically conducting nanostructured material comprises graphene and nanocellulose.

20. The method according to claim 1, wherein the flexible electronic device is a stretchable electronic device.

* * * * *

UNITED STATES PATENT AND TRADEMARK OFFICE
CERTIFICATE OF CORRECTION

PATENT NO. : 10,034,382 B2
APPLICATION NO. : 14/896861
DATED : July 24, 2018
INVENTOR(S) : Yan et al.

Page 1 of 1

It is certified that error appears in the above-identified patent and that said Letters Patent is hereby corrected as shown below:

On the Title Page

Item (73) Assignee: "Nanyang Technology University" should read --Nanyang Technological University--.

Signed and Sealed this
Twentieth Day of November, 2018

Andrei Iancu
*Director of the United States Patent and Trademark Office*